(12) United States Patent
Lee et al.

(10) Patent No.: US 12,249,574 B2
(45) Date of Patent: Mar. 11, 2025

(54) INTERCONNECT STRUCTURE OF SEMICONDUCTOR DEVICE AND METHOD OF FORMING SAME

(71) Applicant: Taiwan Semiconductor Manufacturing Co., Ltd., Hsinchu (TW)

(72) Inventors: Tung Ying Lee, Hsinchu (TW); Bo-Jiun Lin, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 478 days.

(21) Appl. No.: 17/576,137

(22) Filed: Jan. 14, 2022

(65) Prior Publication Data

US 2022/0415785 A1     Dec. 29, 2022

Related U.S. Application Data

(60) Provisional application No. 63/226,843, filed on Jul. 29, 2021, provisional application No. 63/214,276, filed on Jun. 24, 2021.

(51) Int. Cl.
| | | |
|---|---|---|
| *H01L 23/48* | (2006.01) | |
| *H01L 21/768* | (2006.01) | |
| *H01L 23/52* | (2006.01) | |
| *H01L 23/522* | (2006.01) | |
| *H01L 23/532* | (2006.01) | |

(52) U.S. Cl.
CPC .... *H01L 23/5226* (2013.01); *H01L 21/76843* (2013.01); *H01L 21/76877* (2013.01); *H01L 23/53238* (2013.01); *H01L 23/53266* (2013.01)

(58) Field of Classification Search
CPC .......... H01L 23/5226; H01L 21/76843; H01L 21/76877; H01L 23/53238; H01L 23/53266; H01L 25/50; H01L 21/76807; H01L 21/76834; H01L 25/0657; H01L 25/105; H01L 25/18; H01L 2225/1035; H01L 21/76846; H01L 21/76852; H01L 21/76856; H01L 21/76885; H01L 23/53252; H01L 23/53295; H01L 21/7685; H01Q 1/2283
USPC ........................................................ 257/751
See application file for complete search history.

(56) References Cited

U.S. PATENT DOCUMENTS

| | | | |
|---|---|---|---|
| 10,741,756 B1 * | 8/2020 | Ok ........................ | H10N 70/066 |
| 2014/0239245 A1 | 8/2014 | Lengade et al. | |
| 2017/0033003 A1 | 2/2017 | Song et al. | |
| 2017/0229372 A1 * | 8/2017 | Lee ..................... | H01L 23/5226 |

(Continued)

FOREIGN PATENT DOCUMENTS

| | | |
|---|---|---|
| JP | 2021038459 A | 3/2021 |
| JP | 2021514027 A | 6/2021 |
| TW | 202022152 A | 6/2020 |

*Primary Examiner* — Theresa T Doan
(74) *Attorney, Agent, or Firm* — Slater Matsil, LLP

(57) ABSTRACT

A device includes a substrate, a dielectric layer over the substrate, and a conductive interconnect in the dielectric layer. The conductive interconnect includes a barrier/adhesion layer and a conductive layer over the barrier/adhesion layer. The barrier/adhesion layer includes a material having a chemical formula $MX_n$, with M being a transition metal element, X being a chalcogen element, and n being between 0.5 and 2.

20 Claims, 66 Drawing Sheets

(56) References Cited

U.S. PATENT DOCUMENTS

| | | |
|---|---|---|
| 2019/0249300 A1 | 8/2019 | Hatanpää et al. |
| 2020/0066987 A1 | 2/2020 | Sims et al. |
| 2020/0312775 A1* | 10/2020 | Lee .................. H01L 21/76847 |
| 2021/0098387 A1 | 4/2021 | Naylor et al. |
| 2021/0388488 A1* | 12/2021 | Lee ...................... C23C 16/305 |

* cited by examiner

INTERCONNECT STRUCTURE OF SEMICONDUCTOR DEVICE AND METHOD OF FORMING SAME

PRIORITY CLAIM AND CROSS-REFERENCE

This application claims the benefit of U.S. Provisional Application No. 63/214,276, filed on Jun. 24, 2021, and U.S. Provisional Application No. 63/226,843, filed on Jul. 29, 2021, which applications are hereby incorporated herein by reference.

BACKGROUND

Generally, active devices and passive devices are formed on and in a semiconductor substrate. Once formed, these active devices and passive devices may be connected to each other and to external devices using a series of conductive and insulating layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
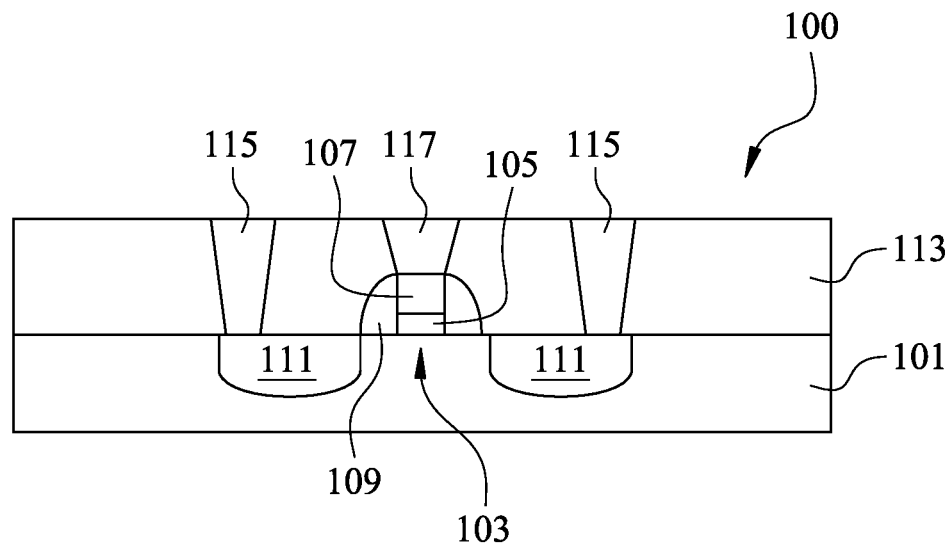
FIGS. 1-3 and 5-17 illustrate cross-sectional views of various intermediate stages of fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, an interconnect structure of a semiconductor device and a method of forming the same. Various embodiments allow for forming a barrier/adhesion layer comprising a single material, such that the barrier/adhesion layer has a layered structure and provides good barrier and adhesion properties. Various embodiments described herein allow for reducing a thickness of the barrier/adhesion layer and enlarging a conductive material volume of an interconnect (such as a conductive line and/or via), and suppressing scattering effects at an interface between the barrier/adhesion layer and the conductive material. Accordingly, a resistance of the interconnect is reduced.

FIGS. 1-3 and 5-17 illustrate cross-sectional views of various intermediate stages of fabrication of a semiconductor device 100 in accordance with some embodiments. Referring to FIG. 1, the process for forming the semiconductor device 100 comprises providing a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIG. 1 as a single transistor) are formed on the substrate 101. The one or more active and/or passive devices 103 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, the transistor 103 includes a gate stack comprising a gate dielectric 105 and a gate electrode 107, spacers 109 on opposite sidewalls of the gate stack, and source/drain regions 111 adjacent to the respective spacers 109. For simplicity, components that are commonly formed in integrated circuits, such as gate silicides, source/drain silicides, contact etch stop layers, and the like, are not illustrated. In some embodiments, the transistor 103 may be formed using any acceptable methods. In some embodiments, the transistor 103 may be a planar MOSFET, a finFET, a nano-FET, a gate-all-around (GAA) transistor, or the like.

In some embodiments, one or more interlayer dielectric (ILD) layers 113 are formed over the substrate 101 and the one or more active and/or passive devices 103. In some embodiments, the one or more ILD layers 113 may comprise a low-k material, such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, chemical vapor deposition (CVD), plasma-enhanced CVD (PECVD), atomic layer deposition (ALD), a combination thereof, or the like.

In some embodiments, source/drain contact plugs 115 and a gate contact plug 117 are formed in the one or more ILD layers 113. The source/drain contact plugs 115 provide electrical contacts to the source/drain regions 111. The gate contact plug 117 provides electrical contact to the gate electrode 107. In some embodiments, the steps for forming the contact plugs 115 and 117 include forming openings in the one or more ILD layers 113, depositing one or more barrier/adhesion layers (not explicitly shown) in the openings, depositing seed layers (not explicitly shown) over the one or more barrier/adhesion layers, and filling the openings with a conductive material (not explicitly shown). A chemical mechanical polishing (CMP) is then performed to remove excess materials of the one or more barrier/adhesion layers, the seed layers, and the conductive material overfilling the openings. In some embodiments, topmost surfaces of the contact plugs 115 and 117 are substantially coplanar or level with a topmost surface of the one or more ILD layers 113 within process variations of the CMP process.

In some embodiments, the one or more barrier/adhesion layers may comprise titanium, titanium nitride, tantalum, tantalum nitride, a combination thereof, a multilayer thereof, or the like, and may be formed using physical vapor deposition (PVD), CVD, ALD, a combination thereof, or the like. The one or more barrier/adhesion layers protect the one or more ILD layers 113 from diffusion and metallic poisoning. The seed layers may comprise copper, titanium, nickel, gold, manganese, a combination thereof, a multilayer thereof, or the like, and may be formed by ALD, CVD, PVD, sputtering, a combination thereof, or the like. The conductive material may comprise copper, aluminum, tungsten, cobalt, ruthenium, combinations thereof, alloys thereof, multilayers thereof, or the like, and may be formed using, for example, by plating, or other suitable methods.

Figure 2:
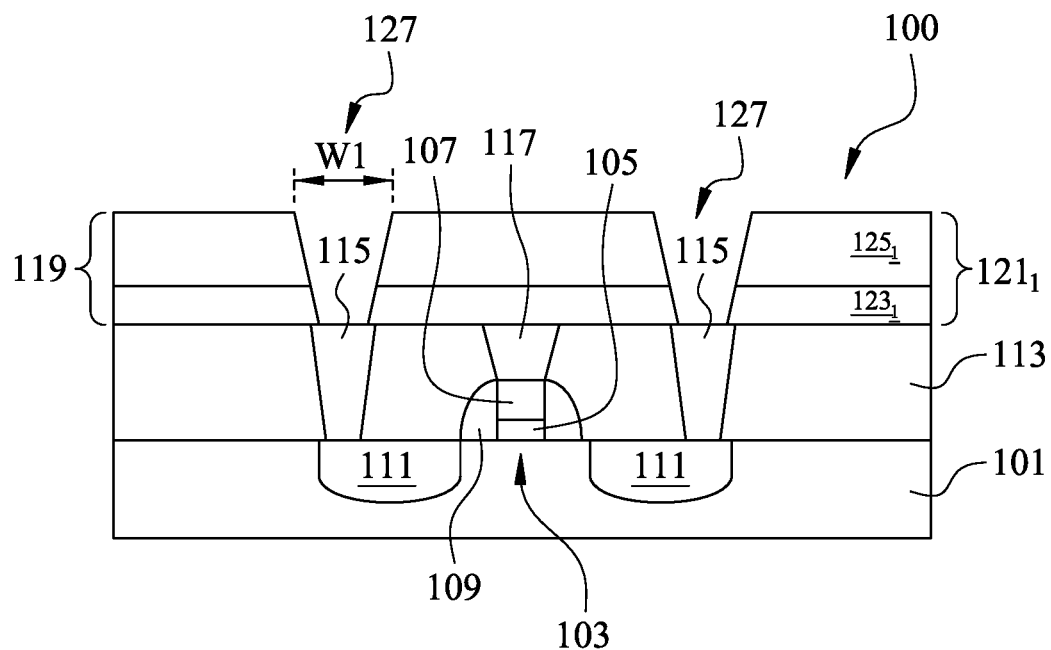

FIGS. 2, 3, and 5-17 illustrate cross-sectional views of various intermediate stages of fabrication of an interconnect structure 119 over the structure of FIG. 1 in accordance with some embodiments. Referring to FIG. 2, in some embodiments, the steps for forming the interconnect structure 119 starts with forming a metallization layer $121_1$ over the one or more ILD layers 113 and the contact plugs 115 and 117. In some embodiments, the formation of the metallization layer 121₁ starts with forming an etch stop layer (ESL) 123₁ over the one or more ILD layers 113 and the contact plugs 115 and 117, and forming an inter-metal dielectric (IMD) layer 125₁ over the ESL 123₁.

In some embodiments, a material for the ESL 123₁ is chosen such that an etch rate of the ESL 123₁ is less than an etch rate of the IMD layer 125₁. In some embodiments, the ESL 123₁ may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like. In some embodiments, the IMD layer 125₁ may be formed using similar materials and methods as the one or more ILD layers 113 and the description is not repeated herein. In some embodiments, the one or more ILD layers 113 and the IMD layer 125₁ may comprise a same material. In other embodiments, the one or more ILD layers 113 and the IMD layer 125₁ may comprise different materials.

Referring further to FIG. 2, the IMD layer 125₁ and the ESL 123₁ are patterned to form openings 127 in the IMD layer 125₁ and the ESL 123₁. In some embodiments, the openings 127 expose top surfaces of the respective source/drain contact plugs 115. The openings 127 may also be referred to as via openings. In some embodiments, the openings 127 may be formed using suitable photolithography and etching processes. The etching process may include one or more dry etching processes. The etching process may be anisotropic. The openings 127 have a width W1 at a top of the openings 127. In some embodiments, a width of the openings 127 decreases as the openings 127 extend towards the substrate 101. In some embodiments, the width W1 is between about 2 nm and about 20 nm.

Figure 3:
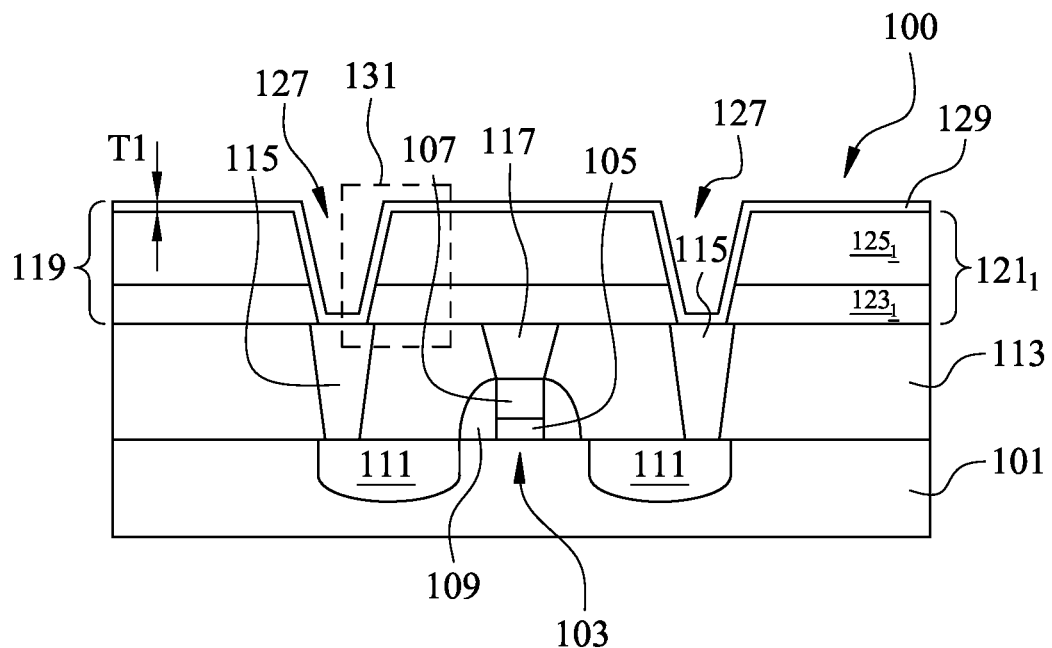

Referring to FIG. 3, a barrier/adhesion layer 129 is formed over the IMD layer 125₁ and along sidewalls and bottoms of the openings 127. In some embodiments, barrier/adhesion layer 129 comprises a material (or a compound) having a chemical formula $MX_n$, where M is a transition metal element, such as Ti, Zr, Hf, V, Nb, Ta, Mo, W, Tc, Re, Co, Rh, Ir, Ni, Pd, or Pt, where X is a chalcogen element, such as S, Se, or Te, and where n is between 0.5 and 2. In other embodiments, the barrier/adhesion layer 129 may comprise $Ta_2S_5$, $Ta_2O_5$, or the like. In some embodiments, the barrier/adhesion layer 129 has a thickness T1 between about 1 nm and about 3 nm. The barrier/adhesion layer 129 reduces a volume available for a conductive material that is subsequently formed in the openings 127. In particular, after forming the barrier/adhesion layer 129, a remaining width of the openings 127 is reduced to the original width W1 (see FIG. 2) of the openings 127 minus 2 times the thickness T1 of the barrier/adhesion layer 129. In some embodiments, a ratio of 2 times the thickness T1 of the barrier/adhesion layer 129 to the original width W1 (see FIG. 2) of the openings 127 is between about 0.05 and about 1. By forming the barrier/adhesion layer 129 from a single material as described above, the thickness T1 of the barrier/adhesion layer 129 may be reduced compared to a dual-material barrier/adhesion layer. Accordingly, a volume available for a conductive material that is subsequently formed in the openings 127 is enlarged and a resistance of resulting interconnects is reduced.

Figure 4:
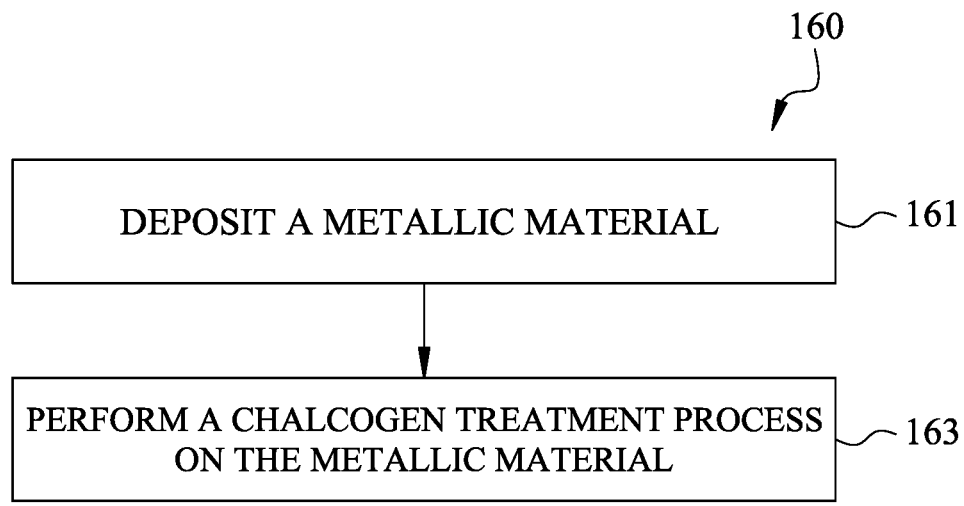
FIG. 4 is a flow diagram illustrating a method of forming a barrier/adhesion layer in accordance with some embodiments.
Figure 5:
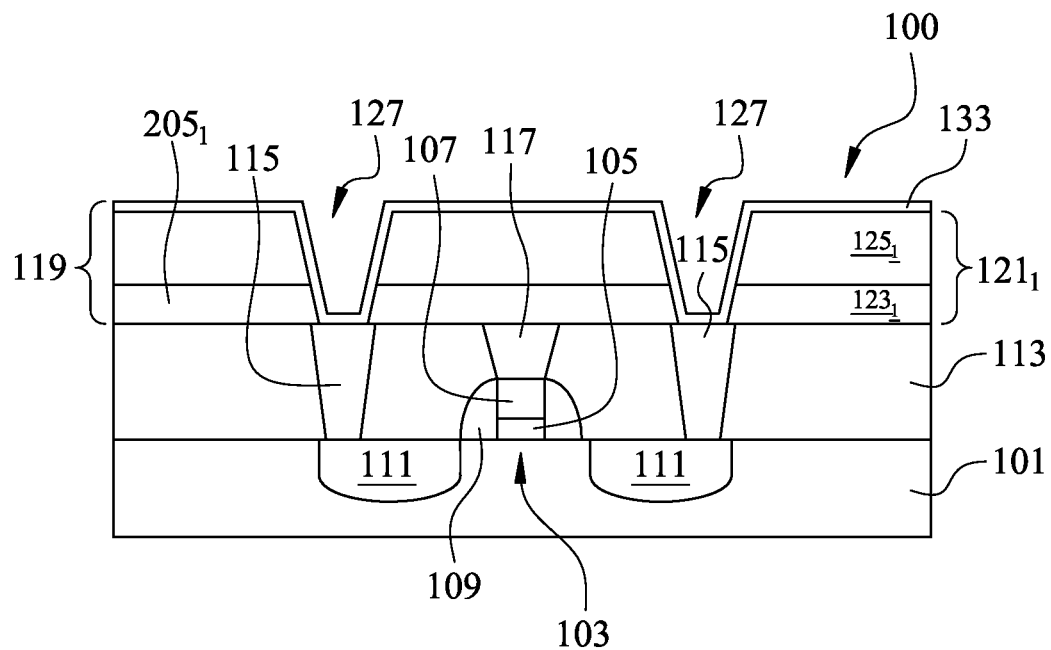
Figure 6:
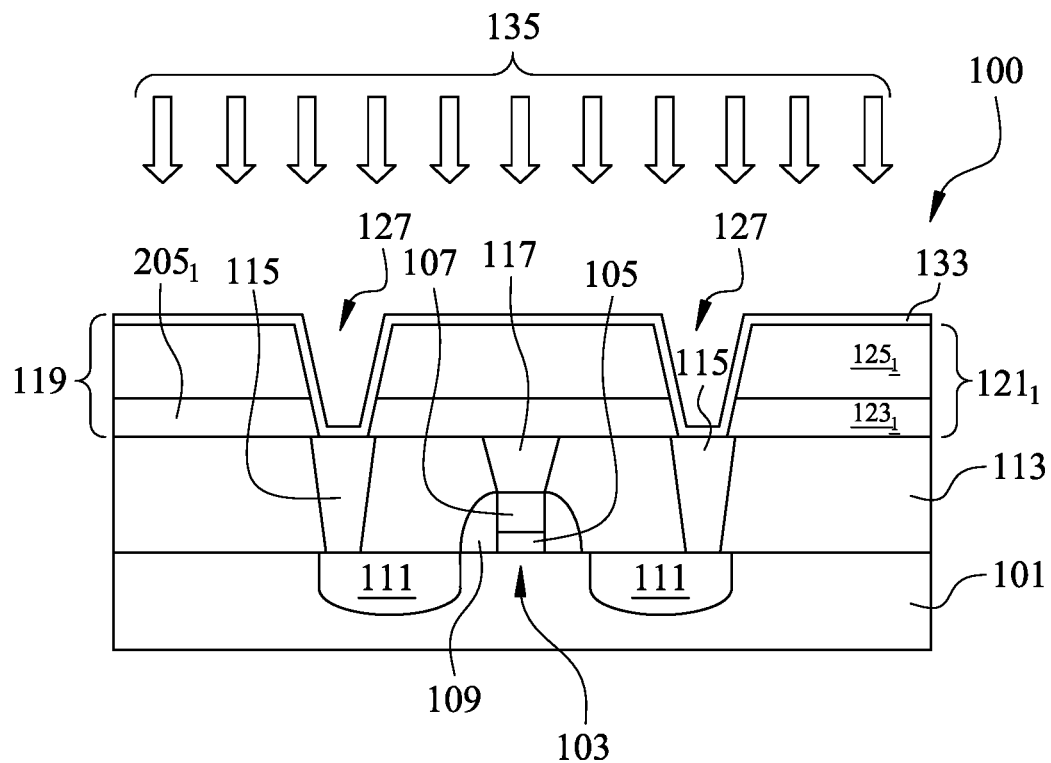

FIG. 4 is a flow diagram illustrating a method 160 of forming the barrier/adhesion layer 129 (see FIG. 3) in accordance with some embodiments. FIGS. 5 and 6 illustrate cross-sectional views of various intermediate stages of fabrication of the barrier/adhesion layer 129 in accordance with the method 160. Referring to FIGS. 4 and 5, in step 161, a metallic material 133 is deposited over the IMD layer 125₁ and along sidewalls and bottoms of the openings 127. In some embodiments, the metallic material 133 comprises a transition metal, such as Ti, Zr, Hf, V, Nb, Ta, Mo, W, Tc, Re, Co, Rh, Ir, Ni, Pd, or Pt, and may be formed by PVD or the like. In some embodiments when the barrier/adhesion layer 129 comprises $TaS_2$, the metallic material 133 comprises Ta.

Referring to FIGS. 4 and 6, in step 163, a chalcogen treatment process 135 is performed on the metallic material 133 to form the barrier/adhesion layer 129 (see FIG. 3). In some embodiment, the chalcogen treatment process 135 comprises performing a PECVD process using a suitable chalcogen-containing precursor. In some embodiments when the barrier/adhesion layer 129 comprises $TaS_2$, the chalcogen treatment process 135 is a sulfidation process. In such embodiments, the sulfidation process comprises performing a PECVD process using a process gas comprising a sulfur-containing precursor and a carrier gas. In some embodiments, the sulfur-containing precursor comprises dimethyl disulfide (DMDS), $H_2S$, a combination thereof, or the like. In some embodiments, the carrier gas comprises an inert gas, such as Ar, He, $N_2$, or the like. In some embodiments, a flow rate of the carrier gas is between about 35 sccm and about 65 sccm. In some embodiments, the PECVD process is performed at a temperature between about 400° C. and about 800° C., and with a plasma power between about 20 W and about 800 W.

Referring back to FIG. 3, in alternative embodiments, the barrier/adhesion layer 129 is formed using a single-step process such as ALD, CVD, or the like. In such embodiments, ALD or CVD may be performed using a suitable metal-containing precursor and a suitable chalcogen-containing precursor. In some embodiments when the barrier/adhesion layer 129 comprises $TaS_2$, the metal-containing precursor comprises tantalum-containing precursor such as pentakis(dimethylamino)tantalum(V) (PDMAT), tantalum ethoxide, tantalum chloride, or the like, and the chalcogen-containing precursor comprises sulfur-containing precursor such as DMDS, $H_2S$, or the like.

Figure 7:
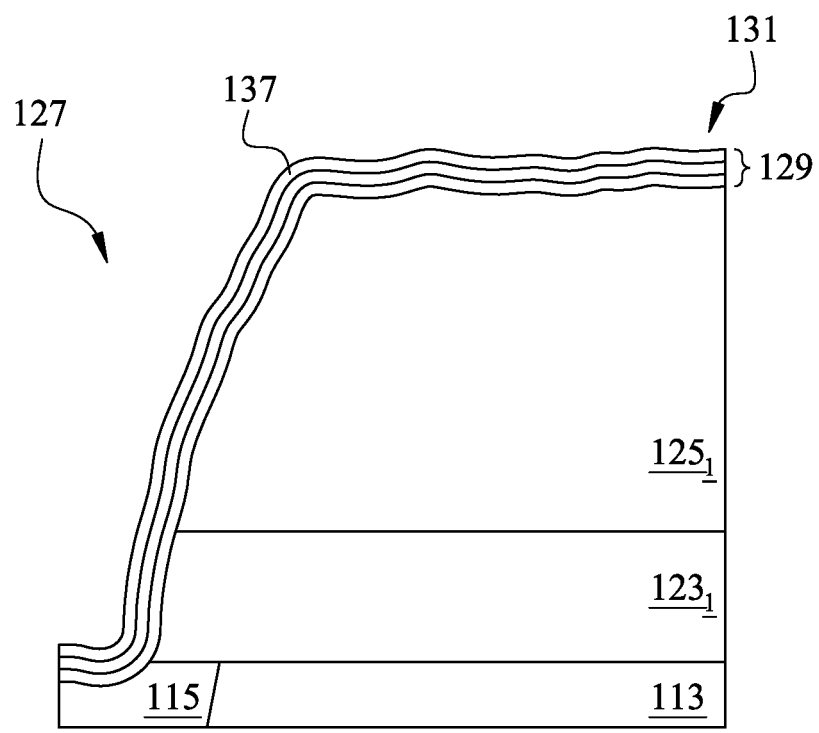

FIG. 7 illustrates a magnified view of a region 131 of the structure shown in FIG. 3. In some embodiments, the barrier/adhesion layer 129 has a layered structure and comprises a plurality of sub-layers 137. In some embodiments, the number of the sub-layers 137 is between about 1 and about 5. In some embodiments, each of the sub-layers 137 has a thickness between about 0.5 nm and about 1 nm. In some embodiments, the barrier/adhesion layer 129 has a thickness between about 0.5 nm and about 3 nm. In some embodiments when the barrier/adhesion layer 129 is formed using the method 160 described above with reference to FIGS. 4-6, the layer structure of the barrier/adhesion layer 129 disappears at process temperatures below about 400° C.

Figure 8:
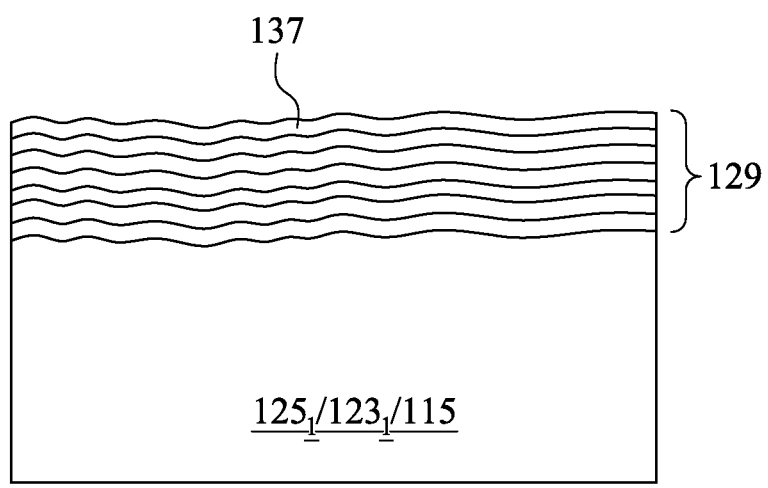

FIG. 8 illustrates a cross-sectional view of a portion of the barrier/adhesion layer 129 in accordance with some embodiments. In some embodiments, the portion of the barrier/adhesion layer 129 as illustrated in FIG. 8 may be located along a bottom of the opening 127 (see FIG. 7), sidewalls of the opening 127, or a top surface of the IMD layer 125₁. In some embodiments, each of the sub-layers 137 of the barrier/adhesion layer 129 is substantially flat (within process variations). In some embodiments, such a flat barrier/adhesion layer 129 may be formed using the method 160 described above with reference to FIGS. 4-6 at a process temperature of about 600° C. By forming the substantially flat barrier/adhesion layer 129, scattering effects at an interface between the barrier/adhesion layer 129 and a conductive material subsequently formed over the barrier/adhesion layer 129 is suppressed, which reduces a resistance of resulting interconnects.

Figure 9:
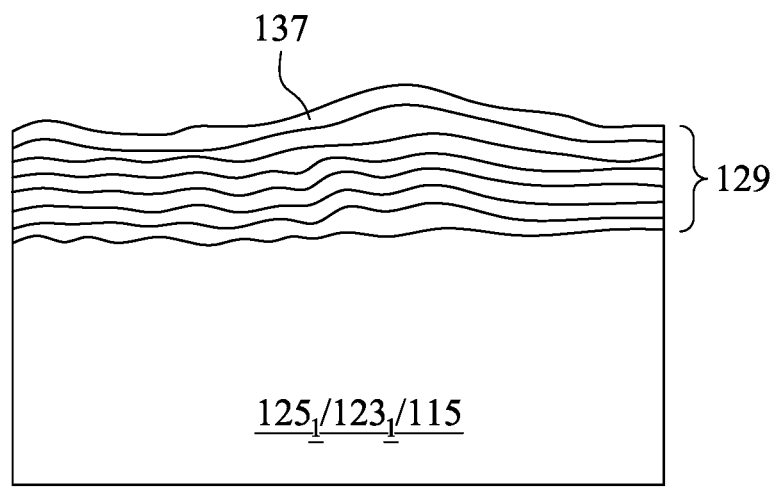

FIG. 9 illustrates a cross-sectional view of a portion of the barrier/adhesion layer 129 in accordance with some embodiments. In some embodiments, the portion of the barrier/adhesion layer 129 as illustrated in FIG. 9 may be located along the bottom of the opening 127 (see FIG. 7), the sidewalls of the opening 127, or the top surface of the IMD layer $125_1$. In some embodiments, each of the sub-layers 137 of the barrier/adhesion layer 129 has a wavy structure. In some embodiments, such a wavy barrier/adhesion layer 129 may be formed using the method 160 described above with reference to FIGS. 4-6 at a process temperature of about 800° C. Even though the barrier/adhesion layer 129 has a wavy structure as illustrated in FIG. 9, the barrier/adhesion layer 129 is smooth in the microscopic level. Accordingly, scattering effects at an interface between the barrier/adhesion layer 129 and a conductive material subsequently formed over the barrier/adhesion layer 129 is suppressed, which reduces a resistance of resulting interconnects.

Figure 10:
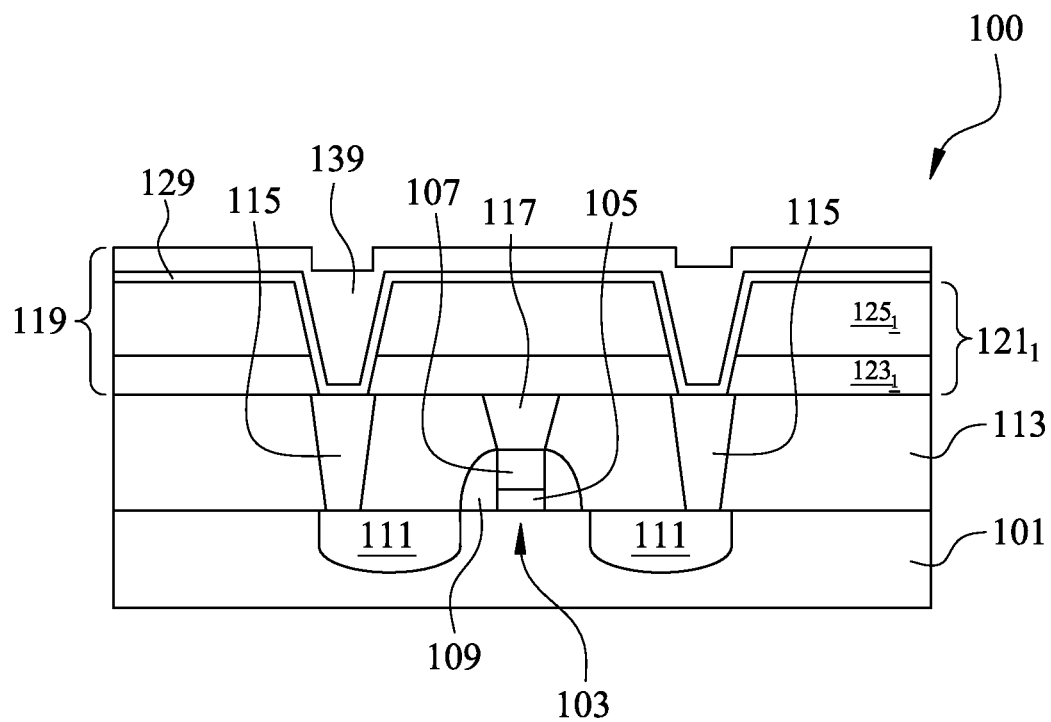

Referring to FIG. 10, a seed layer 139 is formed over the barrier/adhesion layer 129 in the openings 127 (see FIG. 3) and over the IMD layer $125_1$. In some embodiments, the seed layer 139 may comprise copper, titanium, nickel, gold, manganese, a combination thereof, a multilayer thereof, or the like, and may be formed by ALD, CVD, PVD, sputtering, a combination thereof, or the like. In some embodiments, the seed layer 139 may be formed having a thickness such that the seed layer 139 fills the openings 127 (see FIG. 3). In some embodiments, after depositing the seed layer 139, a reflow process may be performed on the seed layer 139 to aid in filling of the openings 127.

Figure 11:
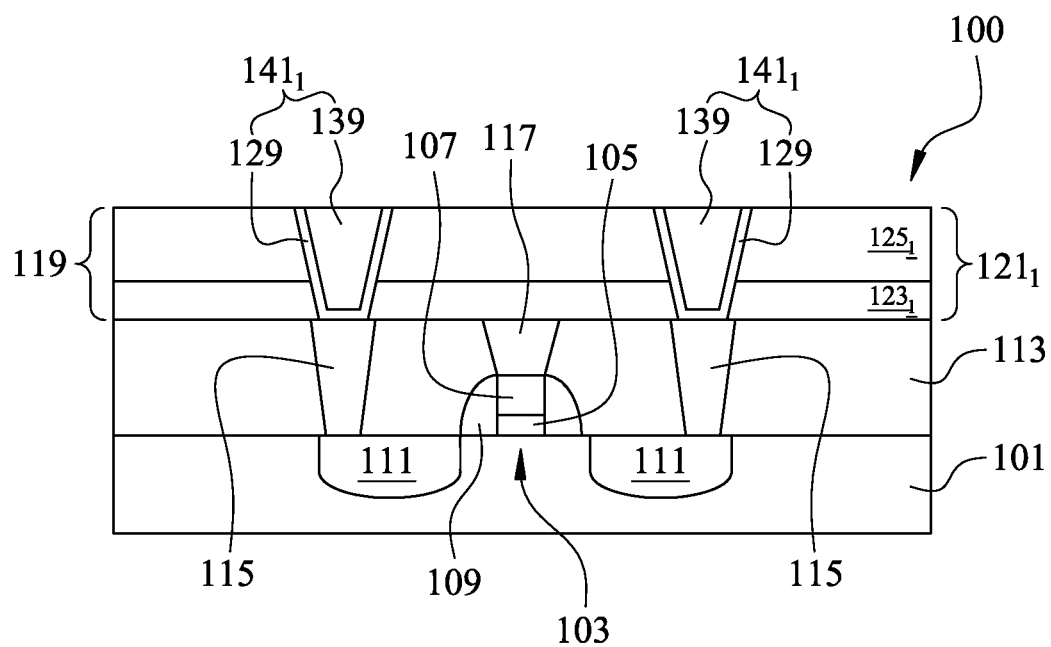

Referring to FIG. 11, portions of the barrier/adhesion layer 129 and the seed layer 139 overfilling the openings 127 (see FIG. 3) are removed to expose a top surface of the IMD layer $125_1$. In some embodiments, the removal process may be a planarization process comprising a CMP process, a grinding process, an etching process, a combination thereof, or the like. Remaining portions of the barrier/adhesion layer 129 and the seed layer 139 filling the openings 127 (see FIG. 3) form conductive vias $141_1$. In some embodiments, top surfaces of the conductive vias $141_1$ are substantially coplanar or level with the top surface of the IMD layer $125_1$ within process variations of the planarization process. In some embodiments, by forming the barrier/adhesion layer 129 as described above with reference to FIGS. 4-6, a volume of the seed layer 139 is increased and scattering effects at an interface between the barrier/adhesion layer 129 and the seed layer 139 is reduced. Accordingly, a resistance of the conductive vias $141_1$ is reduced.

Figure 12:
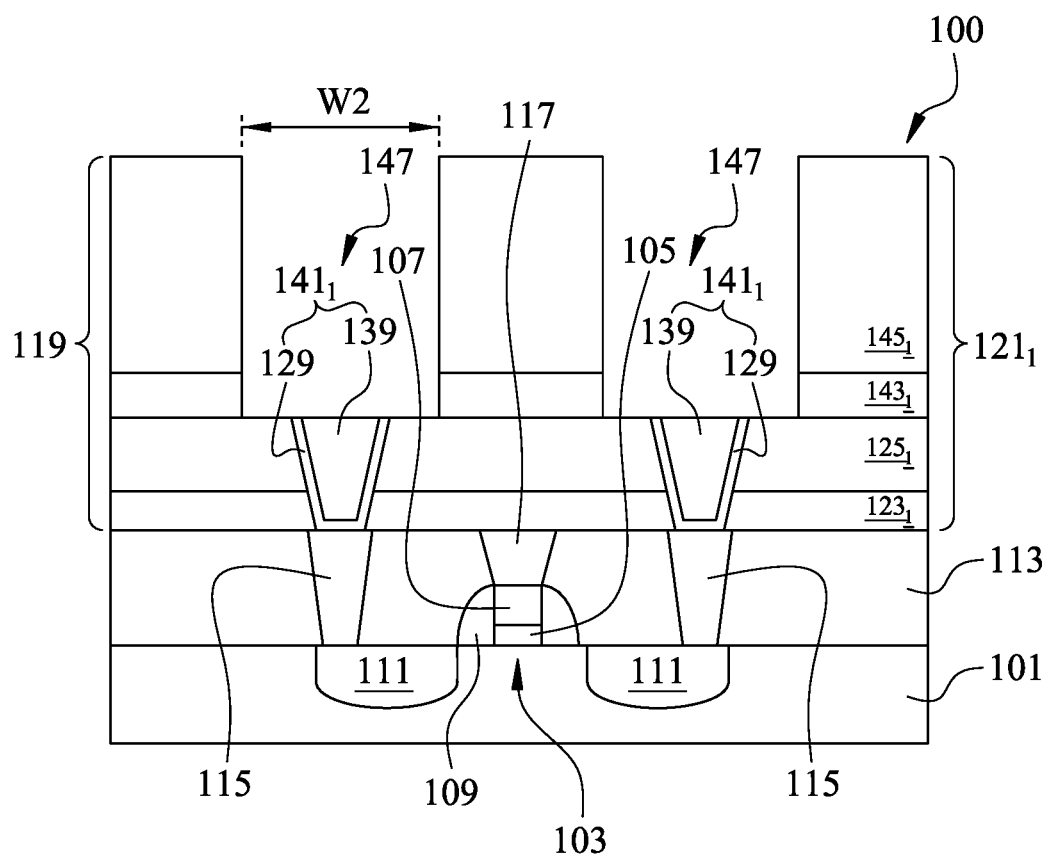

Referring to FIG. 12, after forming the conductive vias $141_1$, an ESL $141_1$ is formed over the IMD layer $125_1$ and the conductive vias $141_1$, and an IMD layer $145_1$ is formed over the ESL $141_1$. In some embodiments, a material for the ESL $141_1$ is chosen such that an etch rate of the ESL $141_1$ is less than an etch rate of the IMD layer $145_1$. In some embodiments, the ESL $141_1$ may be formed using similar materials and methods as the ESL $123_1$ and the description is not repeated herein. In some embodiments, the IMD layer $145_1$ may be formed using similar materials and methods as the IMD layer $125_1$ and the description is not repeated herein.

Subsequently, the IMD layer $145_1$ and the ESL $141_1$ are patterned to form openings 147 in the IMD layer $145_1$ and the ESL $141_1$. In some embodiments, the openings 147 expose top surfaces of the respective conductive vias $141_1$. The openings 147 may also be referred to as line openings. In some embodiments, the openings 147 may be formed using suitable photolithography and etching processes. The etching process may include one or more dry etching processes. The etching process may be anisotropic. The openings 147 have a width W2 at a top of the openings 147. In some embodiments, the width W2 is between about 5 nm and about 40 nm.

Figure 13:
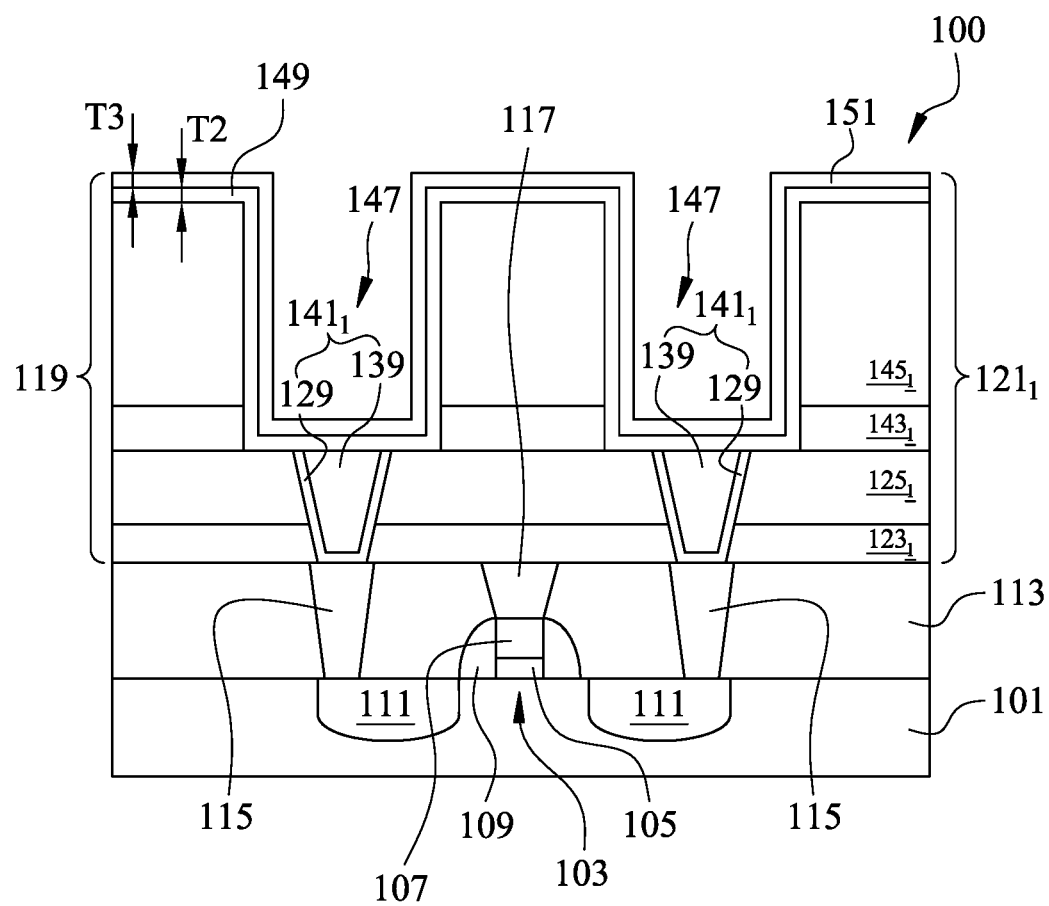

Referring to FIG. 13, a barrier layer 149 is formed over the IMD layer $145_1$ and along sidewalls and bottoms of the openings 147, and an adhesion layer 151 is formed over the barrier layer 149. In some embodiments, the barrier layer 149 may comprise titanium, titanium nitride, tantalum, tantalum nitride, a combination thereof, a multilayer thereof, or the like, and the adhesion layer 151 may comprise titanium, tantalum, cobalt, ruthenium, an alloy thereof, a combination thereof, a multilayer thereof, or the like, and may be formed by ALD, CVD, PVD, sputtering, a combination thereof, or the like. In other embodiments, the barrier layer 149 may be formed using similar materials and method as the barrier/adhesion layer 129, and the adhesion layer 151 may comprise titanium, tantalum, cobalt, ruthenium, an alloy thereof, a combination thereof, a multilayer thereof, or the like, and may be formed by ALD, CVD, PVD, sputtering, a combination thereof, or the like. In yet other embodiments, the barrier layer 149 may comprise titanium, titanium nitride, tantalum, tantalum nitride, a combination thereof, a multilayer thereof, or the like, and the adhesion layer 151 may be formed using similar materials and method as the barrier/adhesion layer 129.

In some embodiments, the barrier layer 149 has a thickness T2 between about 1 nm and about 5 nm. In some embodiments, the adhesion layer 151 has a thickness T3 between about 1 nm and about 5 nm. The barrier layer 149 and the adhesion layer 151 reduce a volume available for a conductive material that is subsequently formed in the openings 147. In particular, after forming the barrier layer 149 and the adhesion layer 151, a remaining width of the openings 147 is reduced to the original width W2 (see FIG. 12) of the openings 147 minus a sum of 2 times the thickness T2 of the barrier layer 149 and 2 times the thickness T3 of the adhesion layer 151. In some embodiments, a ratio of the sum of 2 times the thickness T2 of the barrier layer 149 and 2 times the thickness T3 of the adhesion layer 151 to the original width W2 (see FIG. 12) of the openings 147 is between about 0.05 and about 1.

Figure 14:
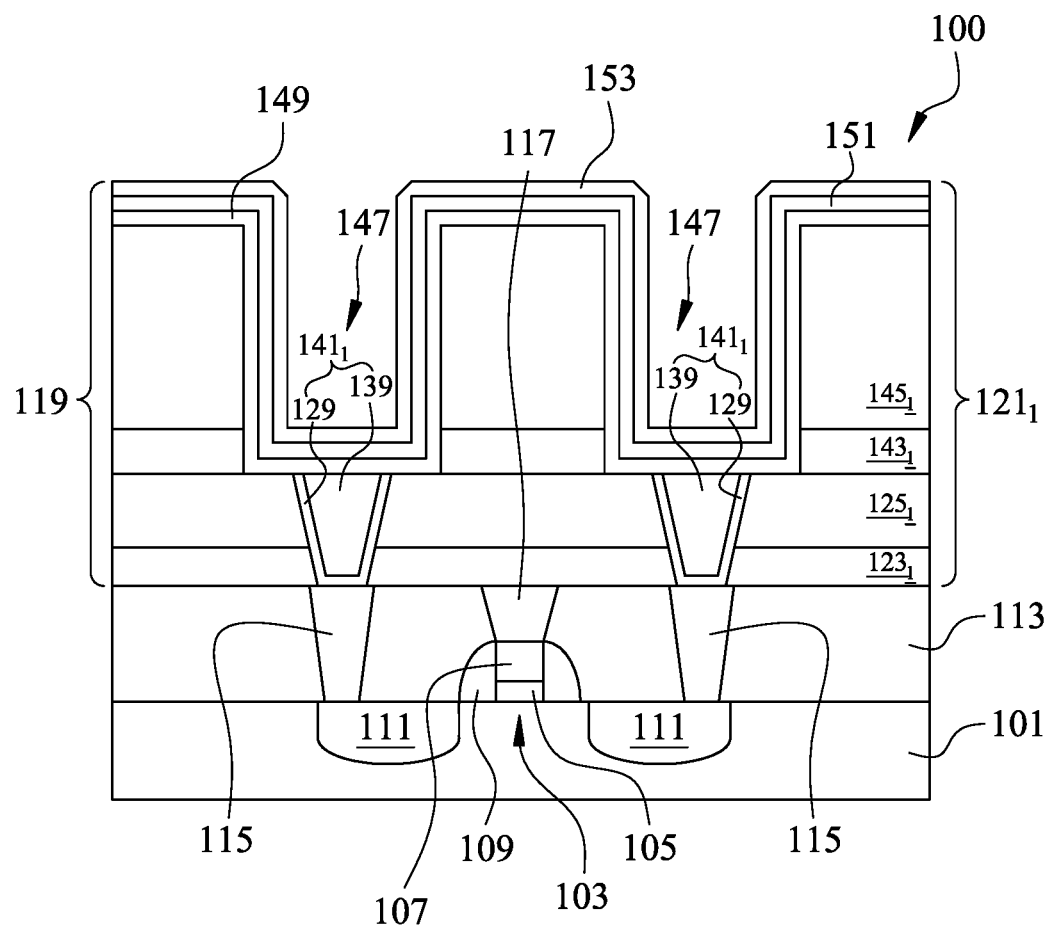

Referring to FIG. 14, a seed layer 153 is formed over the adhesion layer 151 in the openings 147 and over the IMD layer $145_1$. In some embodiments, the seed layer 153 may be formed using similar materials and methods as the seed layer 139 and the description is not repeated herein. In the illustrated embodiment, the seed layer 153 is formed having a thickness such that the seed layer 153 partially fills the openings 147. In some embodiments when the adhesion layer 151 is formed using similar materials and methods as the barrier/adhesion layer 129, scattering effects at an interface between the adhesion layer 151 and the seed layer 153 is suppressed, which reduces a resistance of resulting interconnects.

Figure 15:
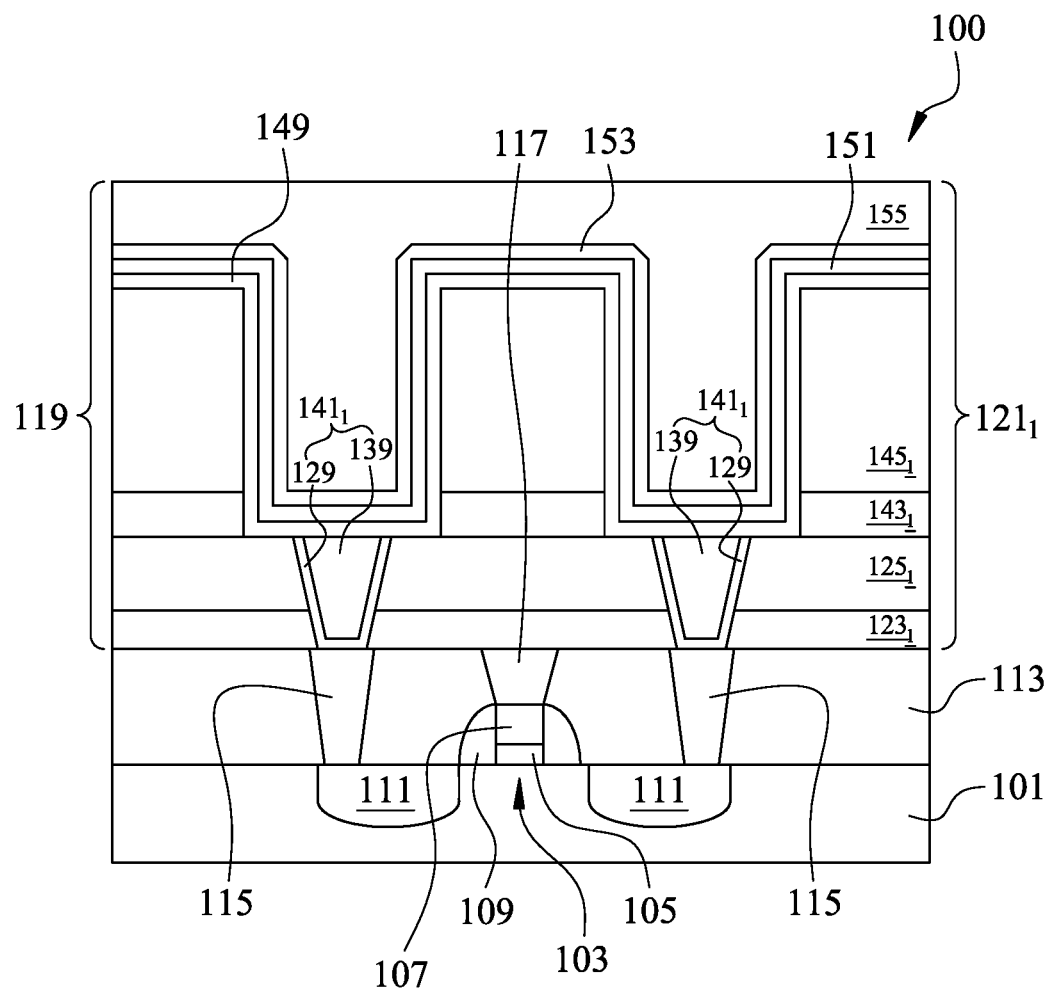

Referring to FIG. 15, a conductive fill layer 155 is formed in the openings 147 (see FIG. 14) and over the IMD layer $145_1$. In some embodiments, the conductive fill layer 155 overfills the openings 147. In some embodiments, the conductive fill layer 155 may comprise copper, aluminum, tungsten, ruthenium, cobalt, nickel, combinations thereof, alloys thereof, multilayers thereof, or the like, and may be formed using, for example, by plating (such as, for example, electrochemical plating, electroless plating, or the like), or other suitable deposition methods.

Figure 16:
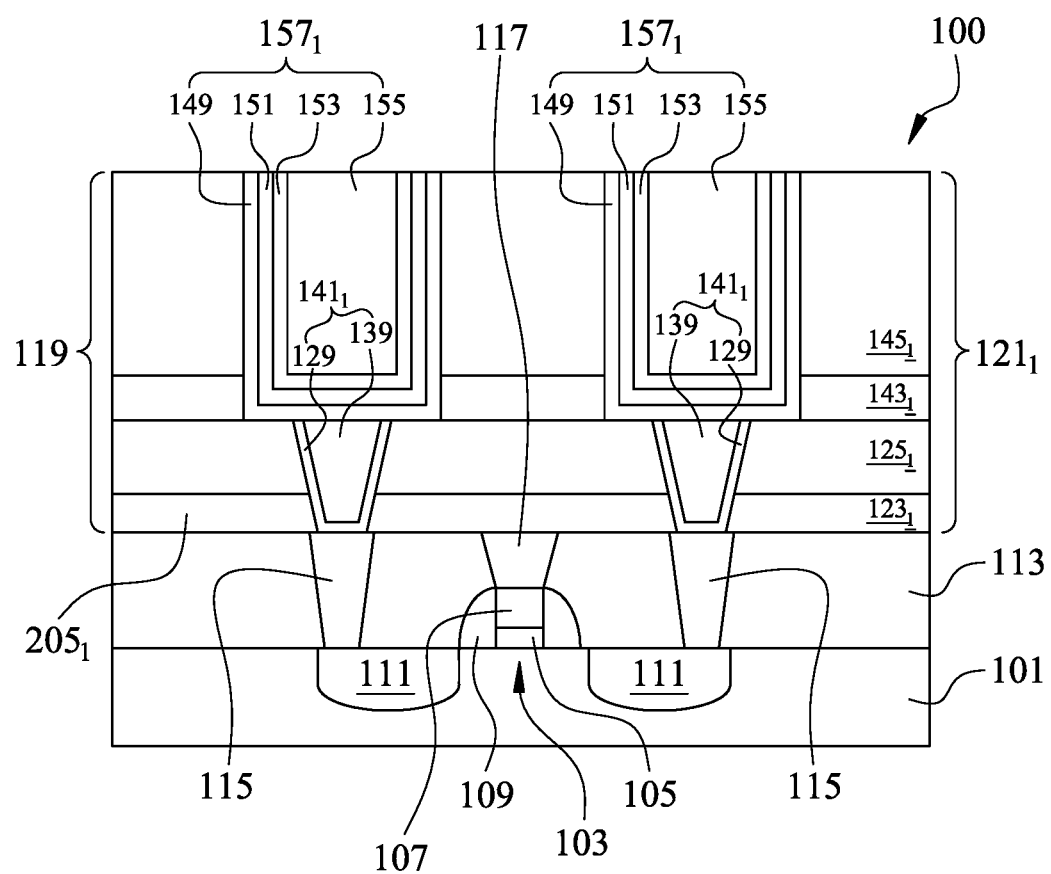

Referring to FIG. 16, portions of the barrier layer 149, the adhesion layer 151, the seed layer 153, and the conductive fill layer 155 overfilling the openings 147 (see FIG. 14) are removed to expose a top surface of the IMD layer $145_1$. In some embodiments, the removal process may be a planarization process comprising a CMP process, a grinding process, an etching process, a combination thereof, or the like. Remaining portions of the barrier layer 149, the adhesion layer 151, the seed layer 153, and the conductive fill layer 155 filling the openings 147 (see FIG. 14) form conductive lines $157_1$. In some embodiments, top surfaces of the conductive lines $157_1$ are substantially coplanar or level with a top surface of the IMD layer $145_1$ within process variations of the planarization process.

Figure 17:
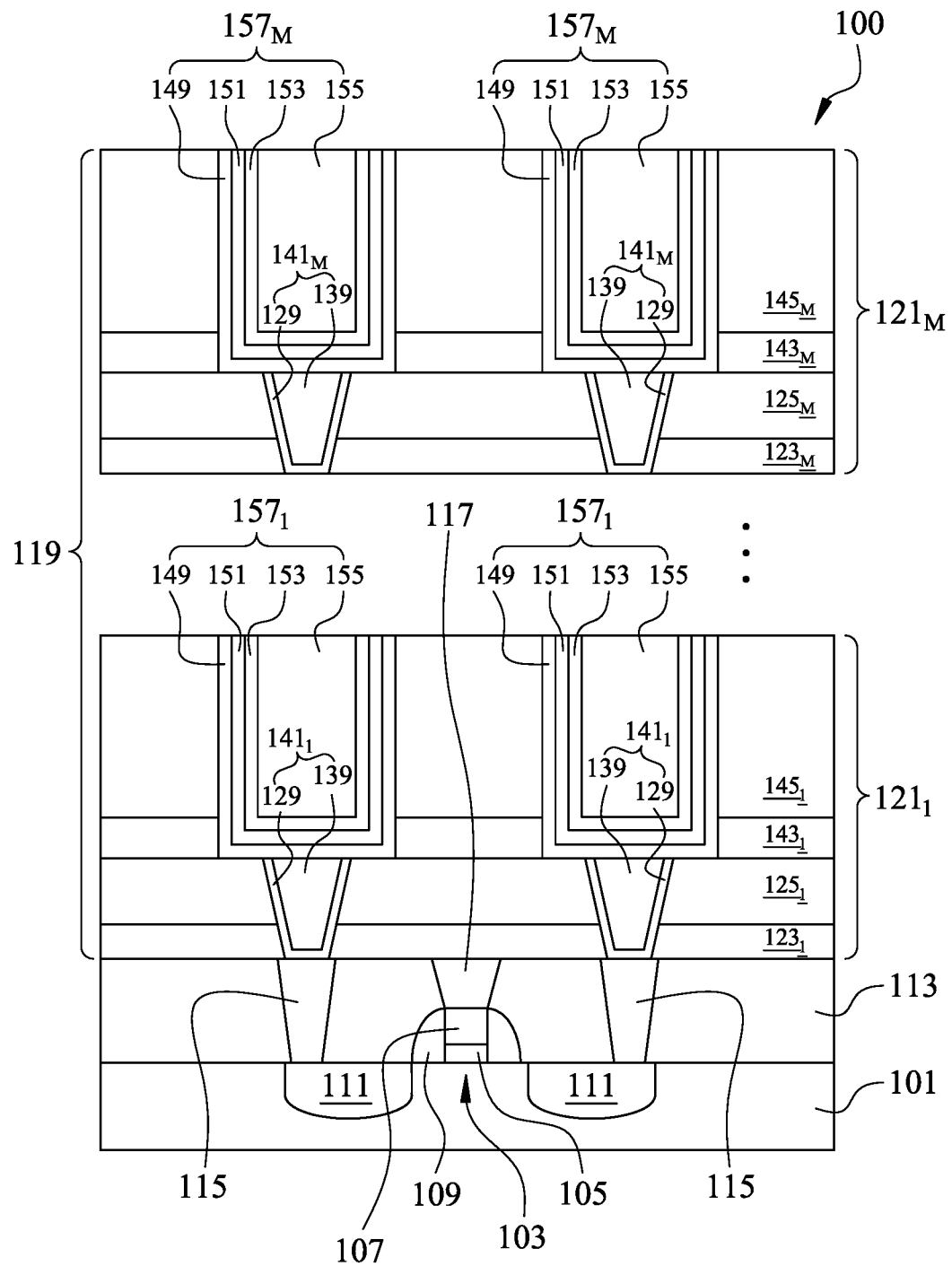

Referring to FIG. 17, one or more metallization layers similar to the metallization layer $121_1$ are formed over the metallization layer $121_1$ until a metallization layer $121_M$ is formed. In some embodiments, the metallization layer $121_M$ is the final metallization layer of the interconnect structure 119. In some embodiments, M may be between 1 and 12. In some embodiments, the intermediate metallization layers between the metallization layer $121_1$ and the metallization layer $121_M$ are formed in a similar manner as the metallization layer $121_1$ and the description is not repeated herein. In other embodiments, the metallization layer $121_M$ is not the final metallization layer of the interconnect structure 119 and additional metallization layers are formed over the metallization layer $121_M$.

In some embodiments, process steps for forming the metallization layer $121_M$ start with forming an ESL $123_M$ over a previous metallization layer. In some embodiments, the ESL $123_M$ is formed using similar materials and methods as the ESL $123_1$ and the description is not repeated herein. Subsequently, an IMD layer $125_M$ is formed over the ESL $123_M$. In some embodiments, the IMD layer $125_M$ is formed using similar materials and methods as the IMD layer $125_1$ and the description is not repeated herein. Subsequently, conductive vias $141_M$ are formed in the IMD layer $125_M$ and the ESL $123_M$. In some embodiments, features of the conductive vias $141_M$ are similar to features of the conductive vias $141_1$, with similar features being labeled by similar numerical references. In some embodiments, the conductive vias $141_M$ may be formed using process steps as described above with reference to FIGS. 2-11, and the description is not repeated herein.

In some embodiments, after forming the conductive vias $141_M$, an ESL $143_M$ is formed over the conductive vias $141_M$ and the IMD layer $125_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $157_M$ are formed in the IMD layer $145_M$ and the ESL $143_M$. In some embodiments, features of the conductive lines $157_M$ are similar to features of the conductive lines $157_1$, with similar features being labeled by similar numerical references. In some embodiments, the conductive lines $157_M$ may be formed using process steps as described above with reference to FIGS. 12-16, and the description is not repeated herein.

Figure 18:
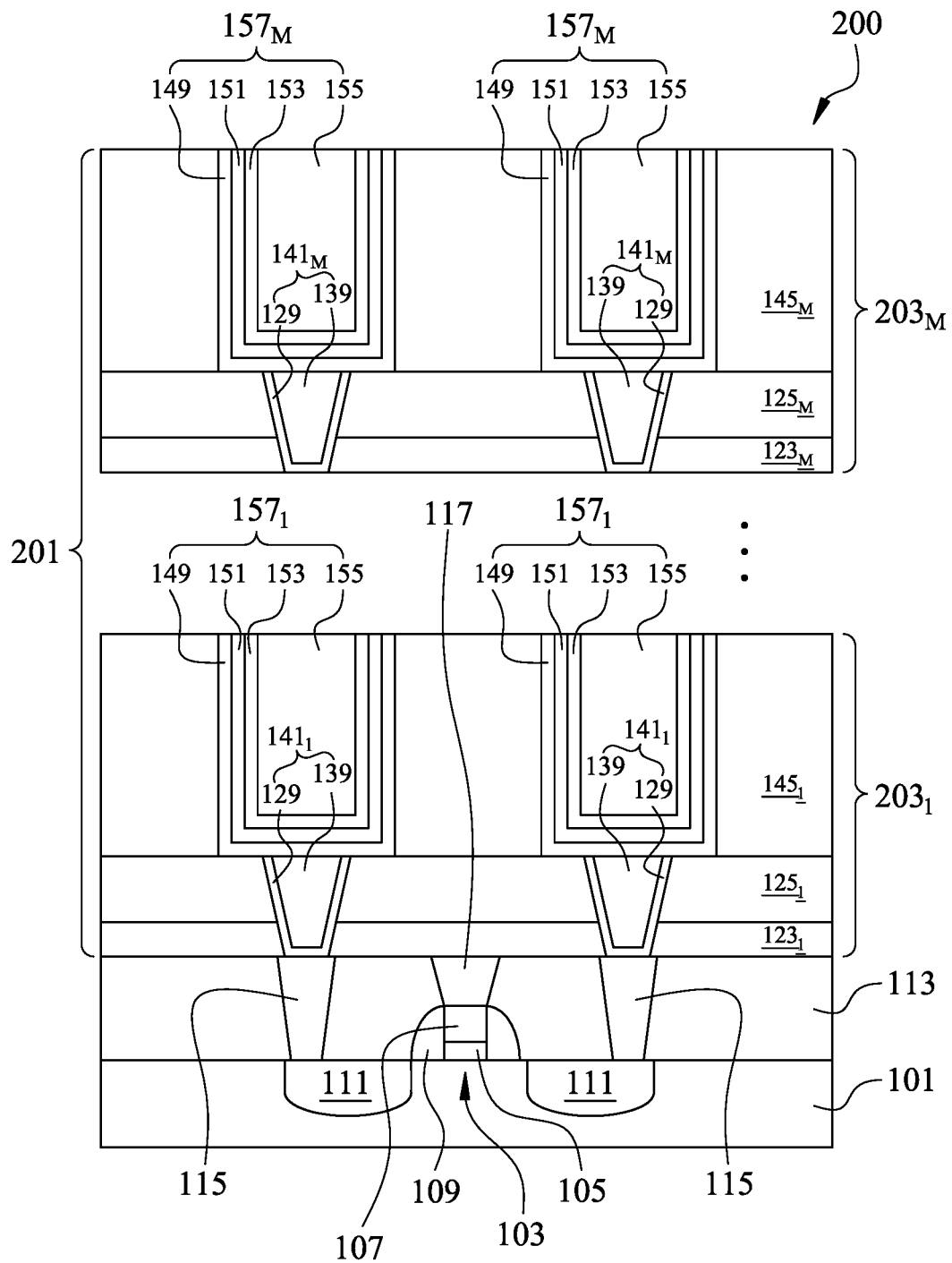
FIG. 18 illustrates a cross-sectional view of a semiconductor device in accordance with some embodiments.

FIG. 18 illustrates a cross-sectional view of a semiconductor device 200 in accordance with some embodiments. The semiconductor device 200 is similar to the semiconductor device 100 (see FIG. 17), with similar features being labeled by similar numerical references. In some embodiments, the interconnect structure 201 (comprising the metallization layers $203_1$ to $203_M$) of the semiconductor device 200 may be formed using process steps similar to the process steps for forming the interconnect structure 119 of the semiconductor device 100 described above with reference to FIGS. 2-17, and the description is not repeated herein. In the illustrated embodiment, the formation of the ESLs $141_1$ to $143_M$ (see FIG. 17) is omitted, such that the IMD layers $145_1$ to $145_M$ are formed directly over the IMD layers $125_1$ to $125_M$, respectively.

FIGS. 19-25 illustrate cross-sectional views of various intermediate stages of fabrication of a semiconductor device 300 in accordance with some embodiments. In particular, FIGS. 19-25 illustrate cross-sectional views of various intermediate stages of fabrication of an interconnect structure 301 over the structure of FIG. 1 in accordance with some embodiments.

Figure 19:
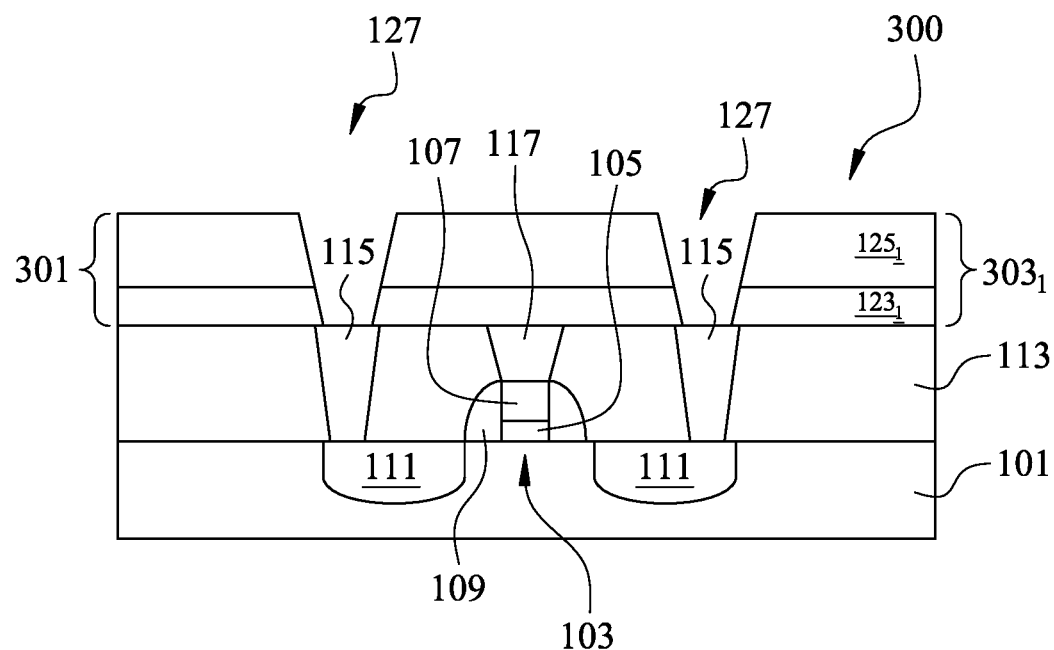
FIGS. 19-25 illustrate cross-sectional views of various intermediate stages of fabrication of a semiconductor device in accordance with some embodiments.

Referring to FIG. 19, in some embodiments, the steps for forming the interconnect structure 301 starts with forming a metallization layer $303_1$ over the one or more ILD layers 113 and the contact plugs 115 and 117. In some embodiments, the formation of the metallization layer $303_1$ starts with forming an ESL $123_1$ over the one or more ILD layers 113 and the contact plugs 115 and 117, and forming an IMD layer $125_1$ over the ESL $123_1$ as described above with reference to FIG. 2 and the description is not repeated herein.

In some embodiments, the IMD layer $125_1$ and the ESL $123_1$ are patterned to form openings 127 in the IMD layer $125_1$ and the ESL $123_1$ as described above with reference to FIG. 2 and the description is not repeated herein. In some embodiments, the openings 127 expose top surfaces of respective source/drain contact plugs 115.

Figure 20:
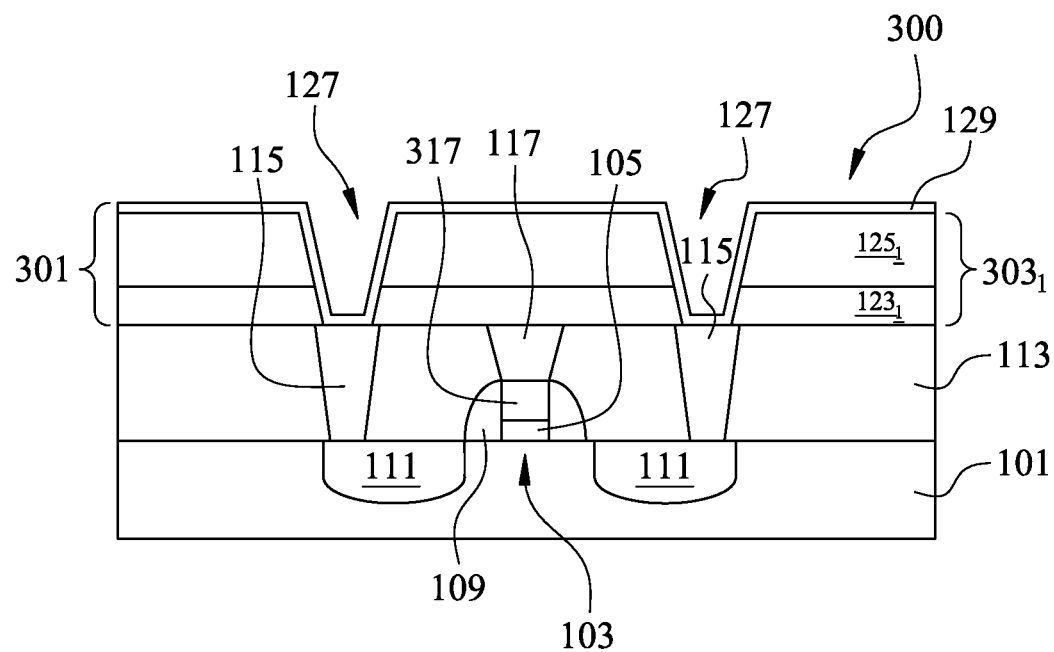

Referring to FIG. 20, a barrier/adhesion layer 129 is formed over the IMD layer $125_1$ and along sidewalls and bottoms of the openings 127 as described above with reference to FIGS. 3-6 and description is not repeated herein.

Figure 21:
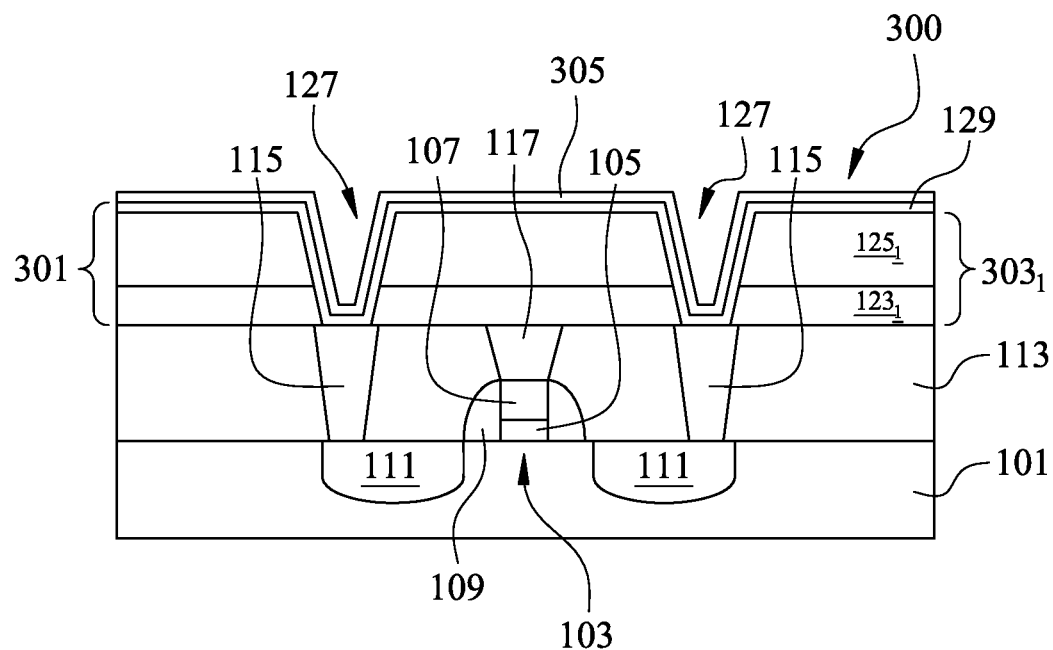

Referring to FIG. 21, a seed layer 305 is formed over the barrier/adhesion layer 129 in the openings 127 and over the IMD layer 1251. In some embodiments, the seed layer 305 may be formed using similar materials and methods as the seed layer 139 described above with reference to FIG. 10 and the description is not repeated herein. In some embodiments, the seed layer 305 may be formed having a thickness such that the seed layer 305 partially fills the openings 127.

Figure 22:
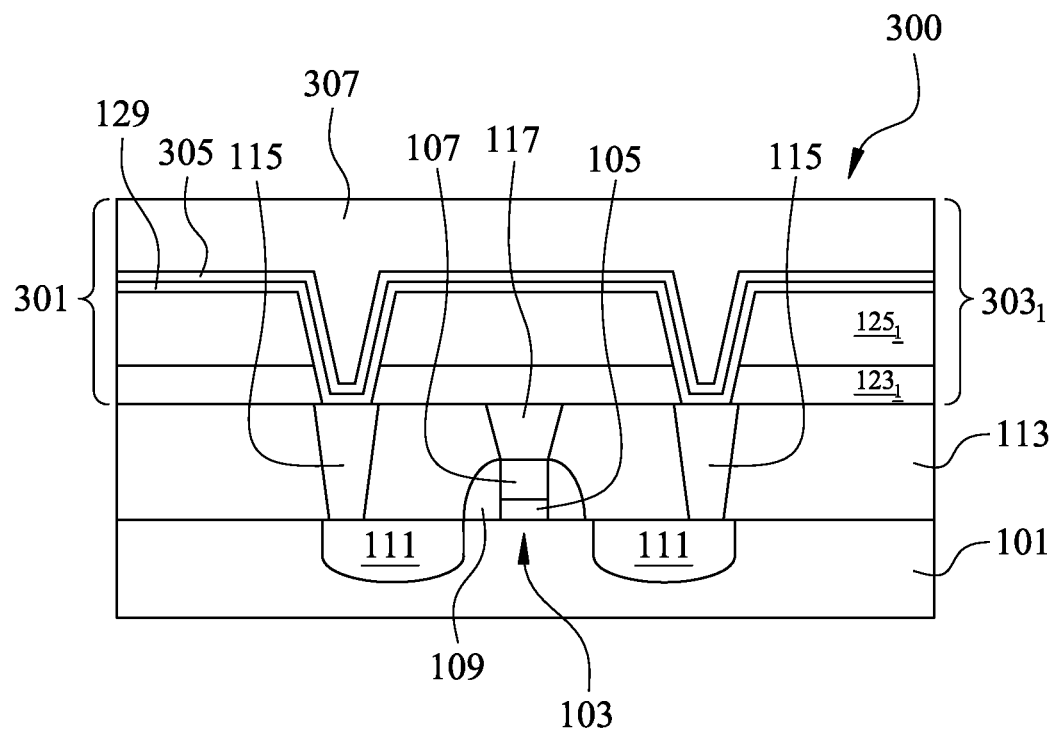

Referring to FIG. 22, a conductive fill layer 307 is formed in the openings 127 (see FIG. 21) and over the IMD layer $125_1$. In some embodiments, the conductive fill layer 307 overfills the openings 127. In some embodiments, the conductive fill layer 307 may be formed using similar materials and methods as the conductive fill layer 155 described above with reference to FIG. 15 and description is not repeated herein.

Figure 23:
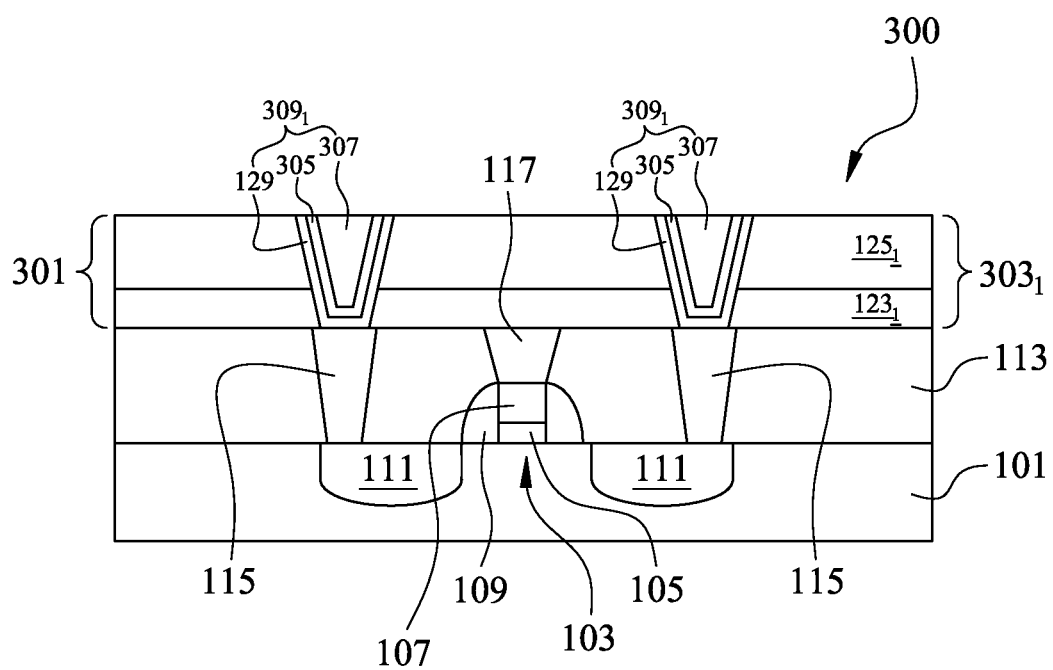

Referring to FIG. 23, portions of the barrier/adhesion layer 129, the seed layer 305, and the conductive fill layer 307 overfilling the openings 127 (see FIG. 21) are removed to expose a top surface of the IMD layer $125_1$. In some embodiments, the removal process may be a planarization process comprising a CMP process, a grinding process, an etching process, a combination thereof, or the like. Remaining portions of the barrier/adhesion layer 129, the seed layer 305, and the conductive fill layer 307 filling the openings 127 (see FIG. 21) form conductive vias $309_1$. In some embodiments, top surfaces of the conductive vias $309_1$ are substantially coplanar or level with the top surface of the IMD layer $125_1$ within process variations of the planarization process. In some embodiments, by forming the barrier/adhesion layer 129 as described above with reference to FIGS. 3-6, a volume of the conductive fill layer 307 is increased and scattering effects at an interface between the barrier/adhesion layer 129 and the seed layer 305 is reduced. Accordingly, a resistance of the conductive vias $309_1$ is reduced.

Figure 24:
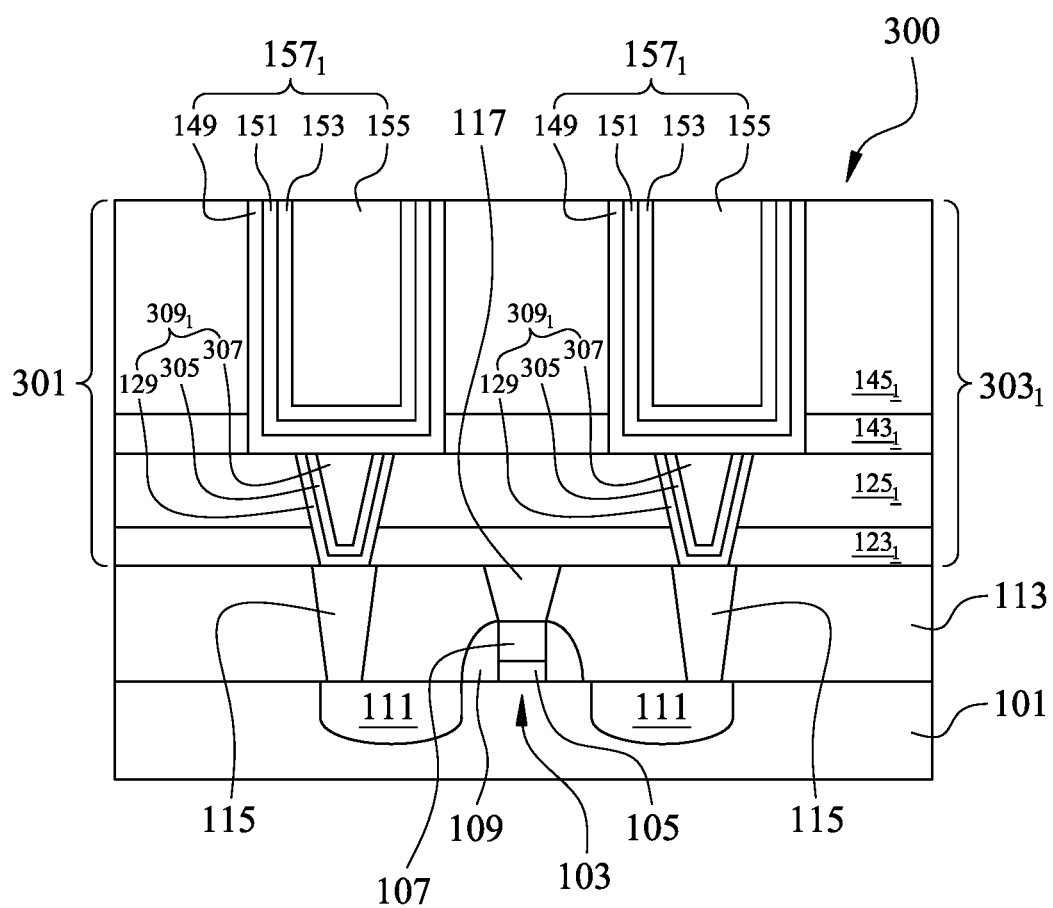

Referring to FIG. 24, after forming the conductive vias $309_1$, an ESL $141_1$ is formed over the IMD layer $125_1$ and the conductive vias $309_1$, and an IMD layer $145_1$ is formed over the ESL $141_1$ as described above with reference to FIG. 12 and the description is not repeated herein. Subsequently, conductive lines $157_1$ are formed in the IMD layer $145_1$ and the ESL $141_1$ as described above with reference to FIGS. 12-16 and the description is not repeated herein. In some embodiments, the conductive lines $157_1$ are in physical contact with respective conductive vias $309_1$.

Figure 25:
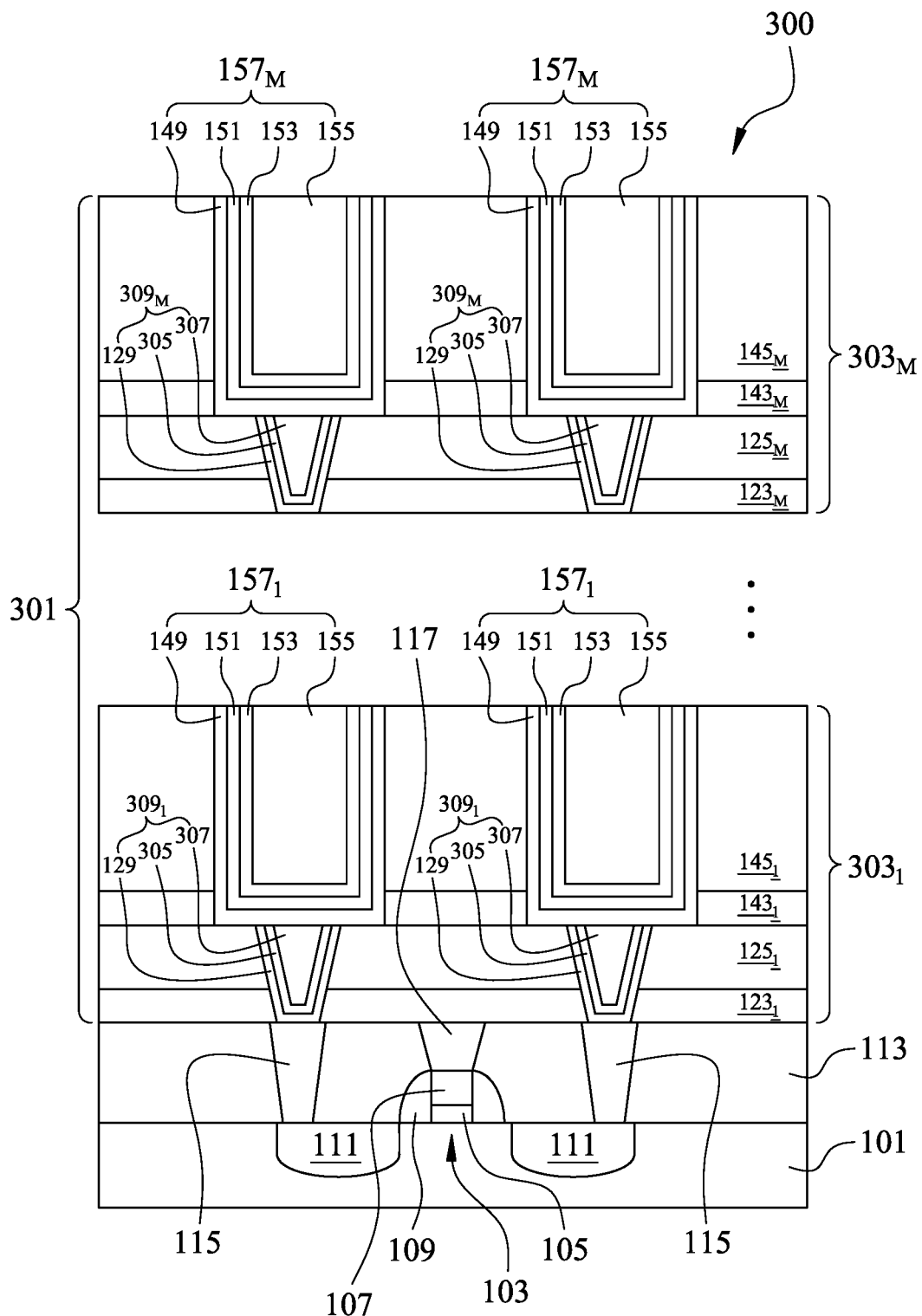

Referring to FIG. 25, one or more metallization layers similar to the metallization layer $303_1$ are formed over the metallization layer $303_1$ until a metallization layer $303_M$ is formed. In some embodiments, the metallization layer $303_M$ is the final metallization layer of the interconnect structure 301. In some embodiments, M may be between 1 and 12. In some embodiments, the intermediate metallization layers between the metallization layer $303_1$ and the metallization layer $303_M$ are formed in a similar manner as the metallization layer $303_1$ and the description is not repeated herein. In other embodiments, the metallization layer $303_M$ is not the final metallization layer of the interconnect structure 301 and additional metallization layers are formed over the metallization layer $303_M$.

In some embodiments, process steps for forming the metallization layer $303_M$ start with forming an ESL $123_M$ over a previous metallization layer. In some embodiments, the ESL $123_M$ is formed using similar materials and methods as the ESL $123_1$ and the description is not repeated herein. Subsequently, an IMD layer $125_M$ is formed over the ESL $123_M$. In some embodiments, the IMD layer $125_M$ is formed using similar materials and methods as the IMD layer $125_1$ and the description is not repeated herein. Subsequently, conductive vias $309_M$ are formed in the IMD layer $125_M$ and the ESL $123_M$. In some embodiments, features of the conductive vias $309_M$ are similar to features of the conductive vias $309_1$, with similar features being labeled by similar numerical references. In some embodiments, the conductive vias $309_M$ may be formed using process steps as described above with reference to FIGS. 19-23, and the description is not repeated herein.

In some embodiments, after forming the conductive vias $309_M$, an ESL $143_M$ is formed over the conductive vias $309_M$ and the IMD layer $125_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $157_M$ are formed in the IMD layer $145_M$ and the ESL $143_M$. In some embodiments, features of the conductive lines $157_M$ are similar to features of the conductive lines $157_1$, with similar features being labeled by similar numerical references. In some embodiments, the conductive lines $157_M$ may be formed using process steps as described above with reference to FIGS. 12-16, and the description is not repeated herein.

Figure 26:
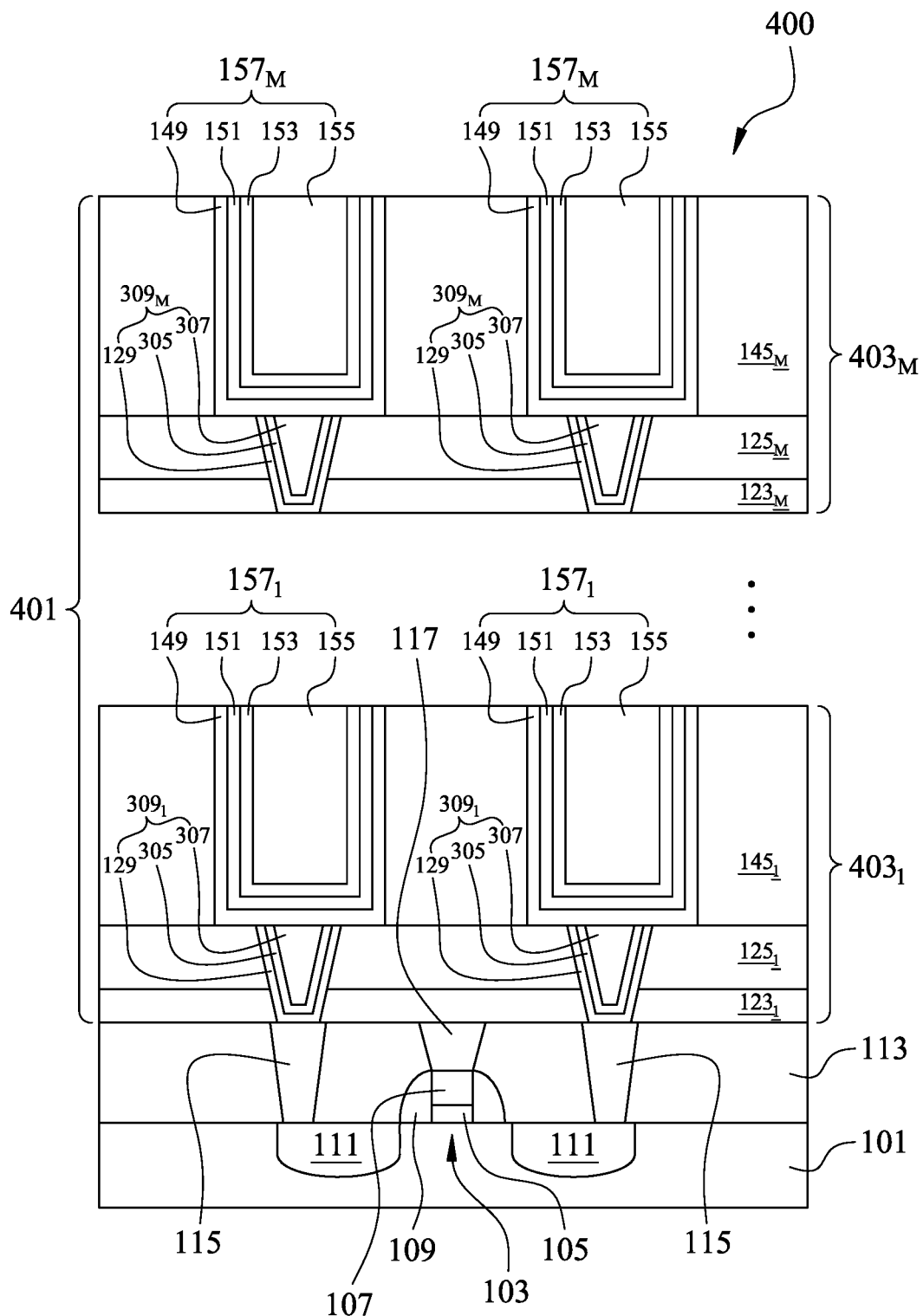
FIG. 26 illustrates a cross-sectional view of a semiconductor device in accordance with some embodiments.

FIG. 26 illustrates a cross-sectional view of a semiconductor device 400 in accordance with some embodiments. The semiconductor device 400 is similar to the semiconductor device 300 (see FIG. 25), with similar features being labeled by similar numerical references. In some embodiments, the interconnect structure 401 (comprising the metallization layers $403_1$ to $403_M$) of the semiconductor device 400 may be formed using process steps similar to the process steps for forming the interconnect structure 301 of the semiconductor device 300 described above with reference to FIGS. 19-25, and the description is not repeated herein. In the illustrated embodiment, the formation of the ESLs $141_1$ to $143_M$ (see FIG. 25) is omitted, such that the IMD layers $145_1$ to $145_M$ are formed directly over the IMD layers $125_1$ to $125_M$, respectively.

FIGS. 27-33 illustrate cross-sectional views of various intermediate stages of fabrication of a semiconductor device 500 in accordance with some embodiments. In particular, FIGS. 27-33 illustrate cross-sectional views of various intermediate stages of fabrication of an interconnect structure 501 over the structure of FIG. 1 in accordance with some embodiments.

Figure 27:
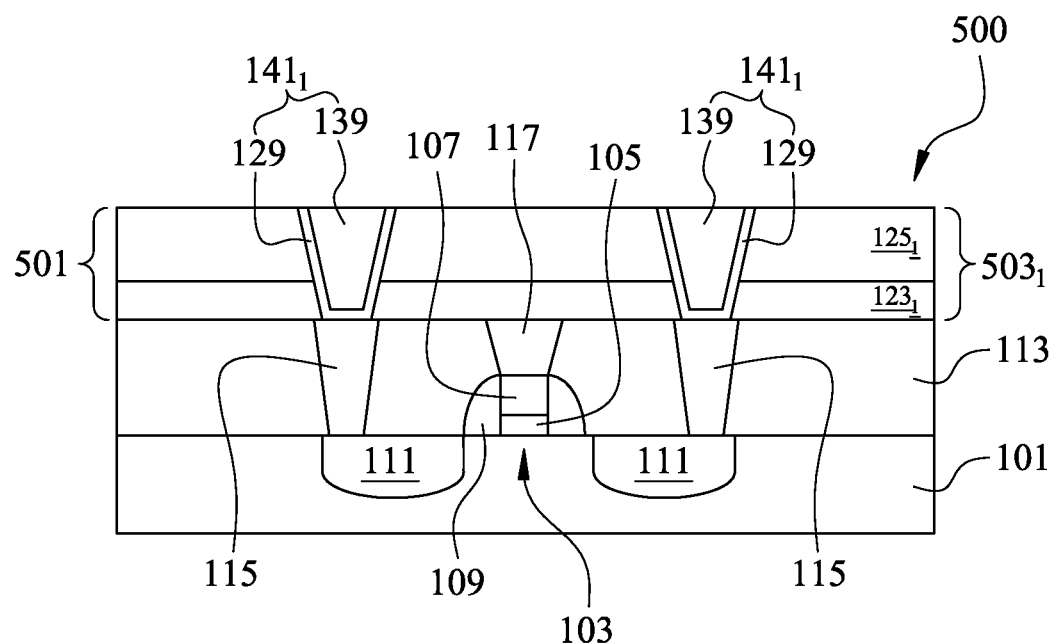
FIGS. 27-33 illustrate cross-sectional views of various intermediate stages of fabrication of a semiconductor device in accordance with some embodiments.

Referring to FIG. 27, in some embodiments, the steps for forming the interconnect structure 501 starts with forming a metallization layer $503_1$ over the one or more ILD layers 113 and the contact plugs 115 and 117. In some embodiments, the formation of the metallization layer $503_1$ starts with forming an ESL $123_1$ over the one or more ILD layers 113 and the contact plugs 115 and 117, and forming an IMD layer $125_1$ over the ESL $123_1$ as described above with reference to FIG. 2 and the description is not repeated herein. Subsequently, conductive vias $141_1$ are formed in the IMD layer $125_1$ and the ESL $123_1$ as described above with reference to FIGS. 2-11 and the description is not repeated herein. In some embodiments, the conductive vias $141_1$ are in physical contact with respective contact plugs 115.

Figure 28:
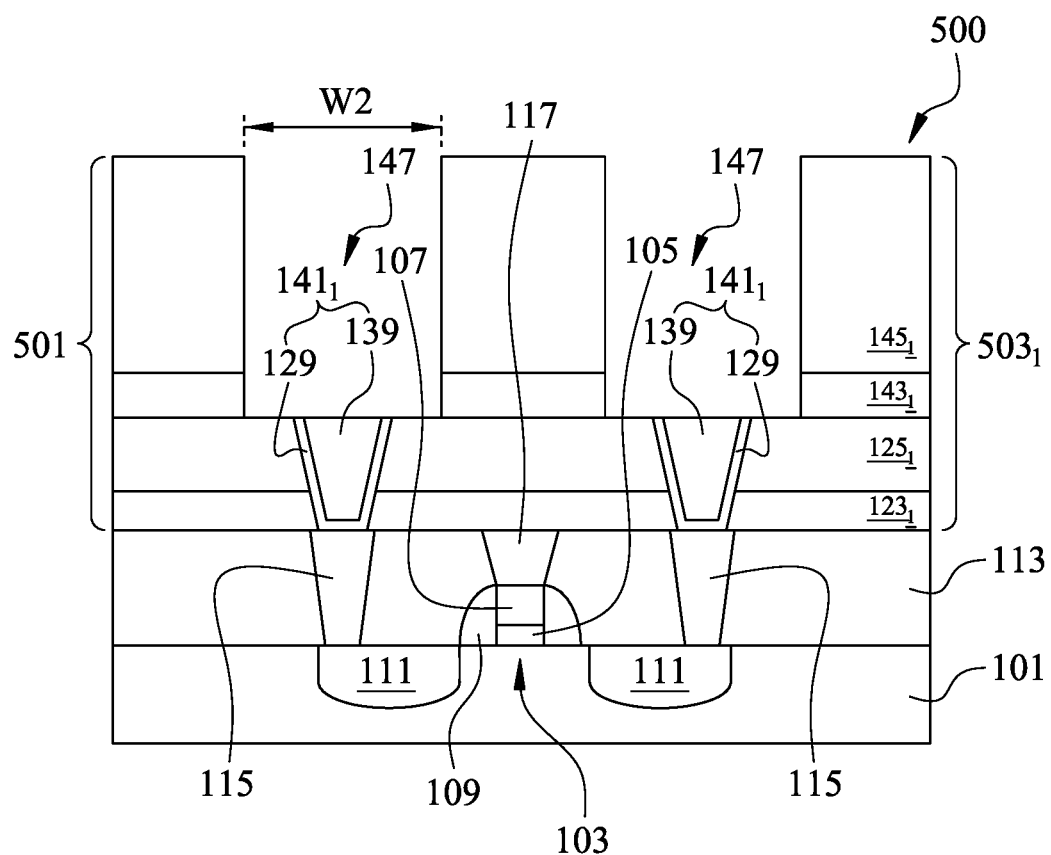

Referring to FIG. 28, after forming the conductive vias $141_1$, an ESL $141_1$ is formed over the IMD layer $125_1$ and the conductive vias $141_1$, and an IMD layer $145_1$ is formed over the ESL $141_1$ as described above with reference to FIG. 12 and the description is not repeated herein.

In some embodiments, the IMD layer $145_1$ and the ESL $141_1$ are patterned to form openings 147 in the IMD layer $145_1$ and the ESL $141_1$ as described above with reference to FIG. 12 and the description is not repeated herein. In some embodiments, the openings 147 expose top surfaces of respective conductive vias $141_1$.

Figure 29:
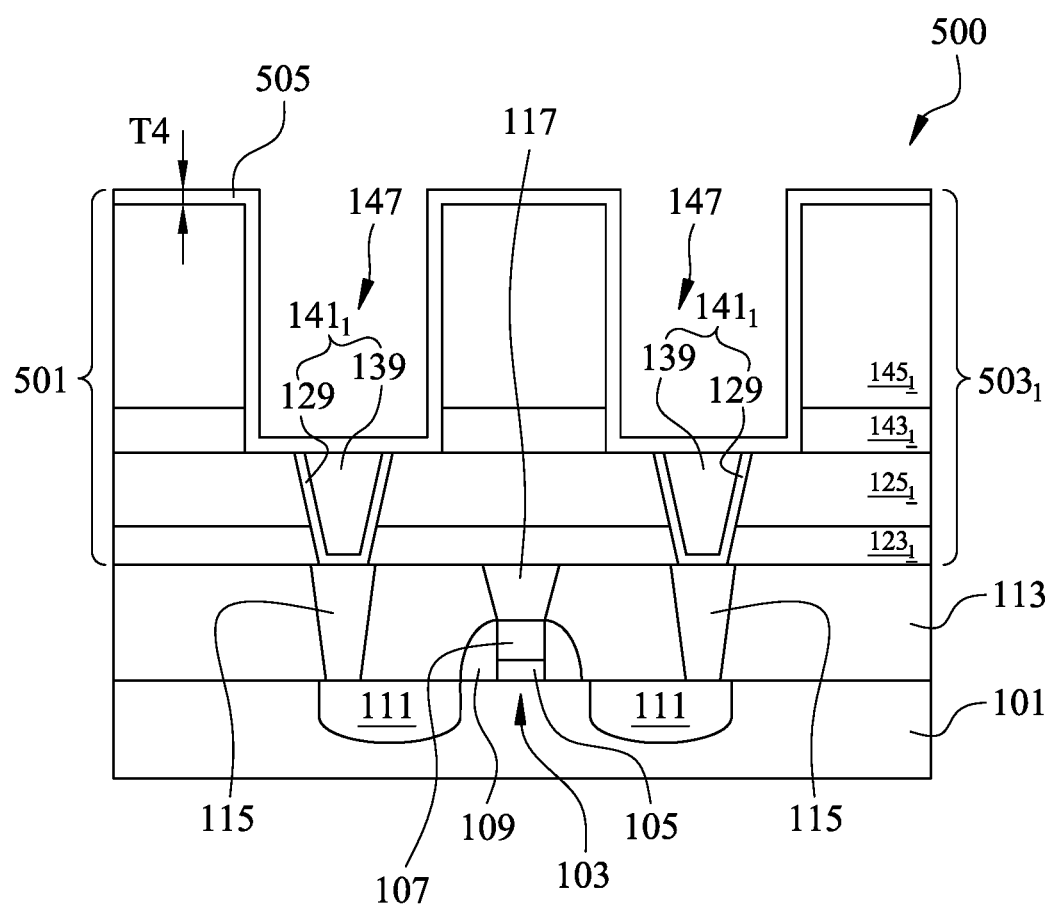

Referring to FIG. 29, a barrier/adhesion layer 505 is formed over the IMD layer $145_1$ and along sidewalls and bottoms of the openings 147. In some embodiments, the barrier/adhesion layer 505 may be formed using similar materials and methods as the barrier/adhesion layer 129 described above with reference to FIGS. 3-6 and description is not repeated herein. In some embodiments, the barrier/adhesion layer 505 has a thickness T4 between about 1 nm and about 3 nm. The barrier/adhesion layer 505 reduces a volume available for a conductive material that is subsequently formed in the openings 147. In particular, after forming the barrier/adhesion layer 505, a remaining width of the openings 147 is reduced to the original width W2 (see FIG. 28) of the openings 147 minus 2 times the thickness T4 of the barrier/adhesion layer 505. In some embodiments, a ratio of 2 times the thickness T4 of the barrier/adhesion layer 505 to the original width W2 (see FIG. 28) of the openings 147 is between about 0.05 and about 1. By forming the barrier/adhesion layer 505 from a single material as described above with reference to FIGS. 3-6, the thickness T4 of the barrier/adhesion layer 505 may be reduced compared to a dual-material barrier/adhesion layer. Accordingly, a volume available for a conductive material that is subsequently formed in the openings 147 is enlarged and a resistance of resulting interconnects is reduced.

Figure 30:
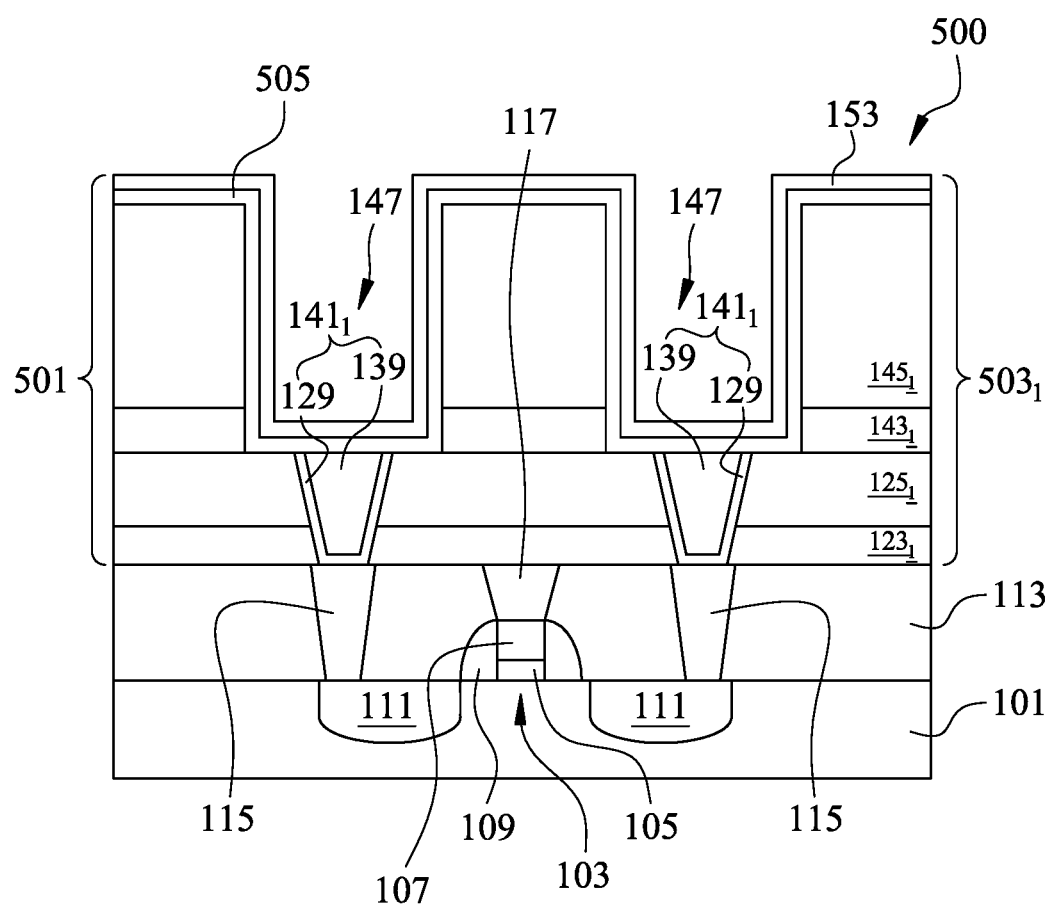

Referring to FIG. 30, a seed layer 153 is formed over the barrier/adhesion layer 505 in the openings 147 and over the IMD layer $145_1$ as described above in reference to FIG. 14 and the description is not repeated herein. In the illustrated embodiment, the seed layer 153 is formed having a thickness such that the seed layer 153 partially fills the openings 147.

Figure 31:
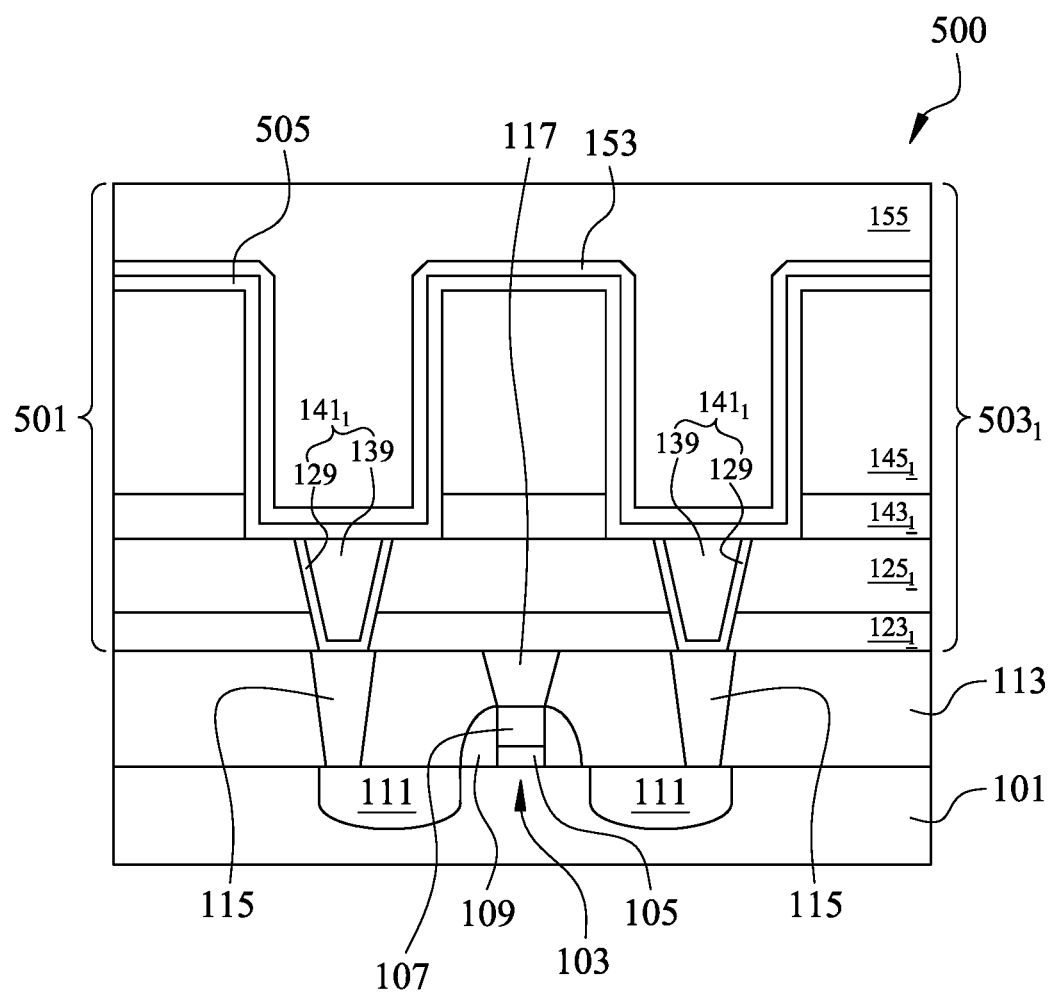

Referring to FIG. 31, a conductive fill layer 155 is formed in the openings 147 (see FIG. 30) and over the IMD layer $145_1$ as described above with reference to FIG. 15 and the description is not repeated herein.

Figure 32:
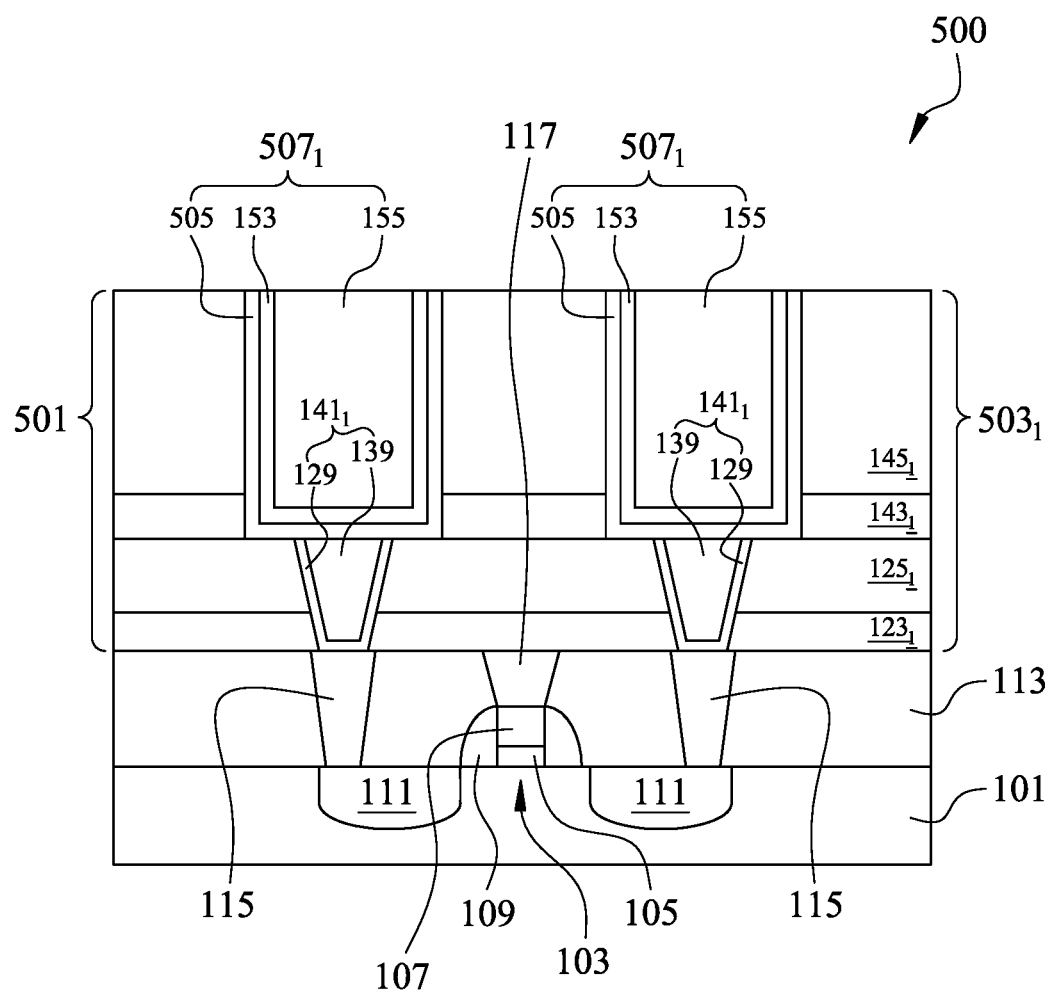

Referring to FIG. 32, portions of the barrier/adhesion layer 505, the seed layer 153, and the conductive fill layer 155 overfilling the openings 147 (see FIG. 30) are removed to expose a top surface of the IMD layer $145_1$. In some embodiments, the removal process may be a planarization process comprising a CMP process, a grinding process, an etching process, a combination thereof, or the like. Remaining portions of the barrier/adhesion layer 505, the seed layer 153, and the conductive fill layer 155 filling the openings 147 (see FIG. 30) form conductive lines $507_1$. In some embodiments, top surfaces of the conductive lines $507_1$ are substantially coplanar or level with the top surface of the IMD layer $145_1$ within process variations of the planarization process. By forming the barrier/adhesion layer 505 from a single material as described above with reference to FIGS. 3-6, a volume of the conductive fill layer 155 is increased and scattering effects at an interface between the barrier/adhesion layer 505 and the seed layer 153 is suppressed. Accordingly, a resistance of the conductive lines $507_1$ is reduced.

Figure 33:
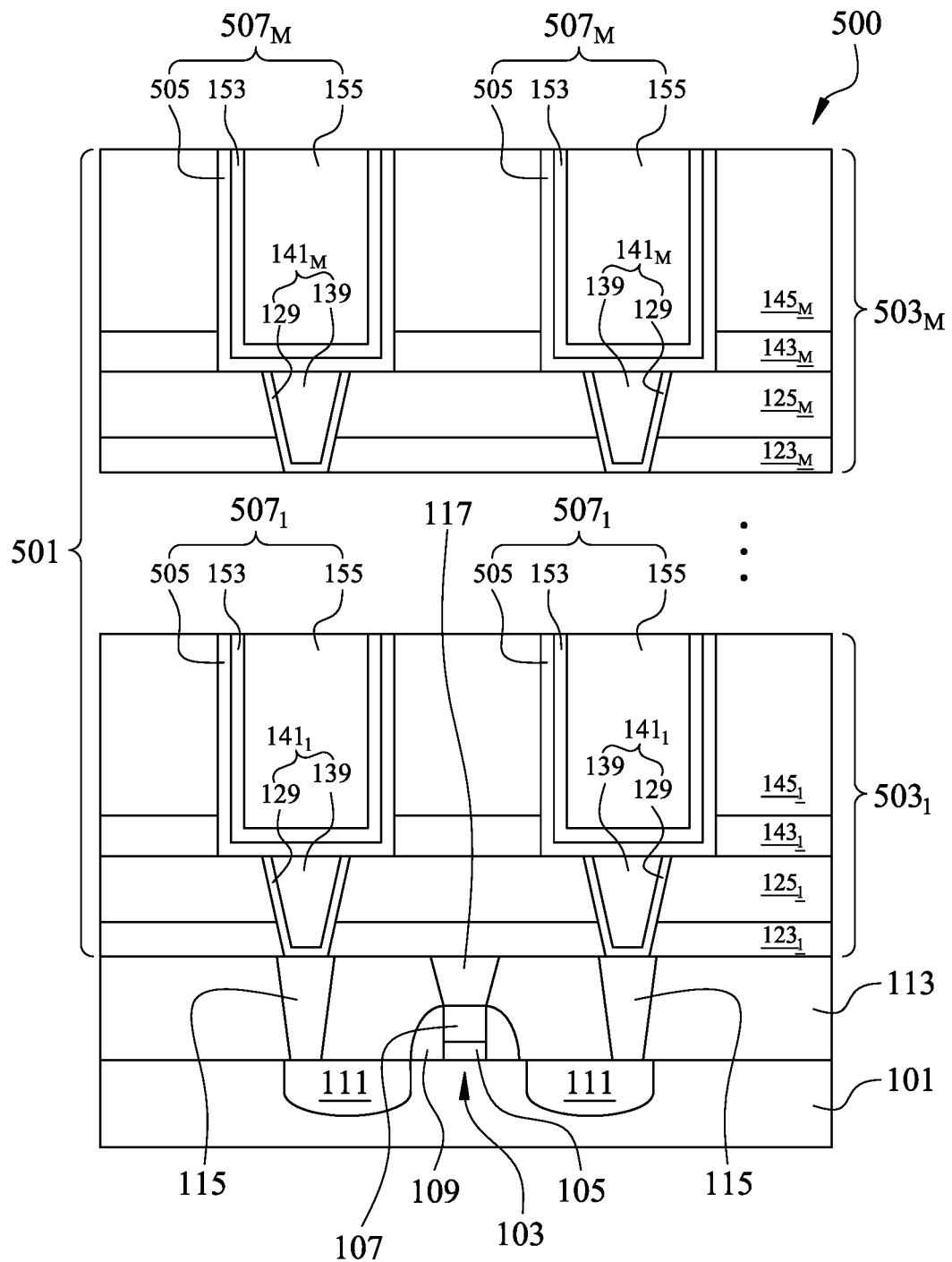

Referring to FIG. 33, one or more metallization layers similar to the metallization layer $503_1$ are formed over the metallization layer $503_1$ until a metallization layer $503_M$ is formed. In some embodiments, the metallization layer $503_M$ is the final metallization layer of the interconnect structure 501. In some embodiments, M may be between 1 and 12. In some embodiments, the intermediate metallization layers between the metallization layer $503_1$ and the metallization layer $503_M$ are formed in a similar manner as the metallization layer $503_1$ and the description is not repeated herein. In other embodiments, the metallization layer $503_M$ is not the final metallization layer of the interconnect structure 501 and additional metallization layers are formed over the metallization layer $503_M$.

In some embodiments, process steps for forming the metallization layer $503_M$ start with forming an ESL $123_M$ over a previous metallization layer. In some embodiments, the ESL $123_M$ is formed using similar materials and methods as the ESL $123_1$ and the description is not repeated herein. Subsequently, an IMD layer $125_M$ is formed over the ESL $123_M$. In some embodiments, the IMD layer $125_M$ is formed using similar materials and methods as the IMD layer $125_1$ and the description is not repeated herein. Subsequently, conductive vias $141_M$ are formed in the IMD layer $125_M$ and the ESL $123_M$. In some embodiments, features of the conductive vias $141_M$ are similar to features of the conductive vias $141_1$, with similar features being labeled by similar numerical references. In some embodiments, the conductive vias $141_M$ may be formed using process steps as described above with reference to FIG. 27, and the description is not repeated herein.

In some embodiments, after forming the conductive vias $141_M$, an ESL $143_M$ is formed over the conductive vias $141_M$ and the IMD layer $125_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $507_M$ are formed in the IMD layer $145_M$ and the ESL $143_M$. In some embodiments, features of the conductive lines $507_M$ are similar to features of the conductive lines $507_1$, with similar features being labeled by similar numerical references. In some embodiments, the conductive lines $507_M$ may be formed using process steps as described above with reference to FIGS. 28-32, and the description is not repeated herein.

Figure 34:
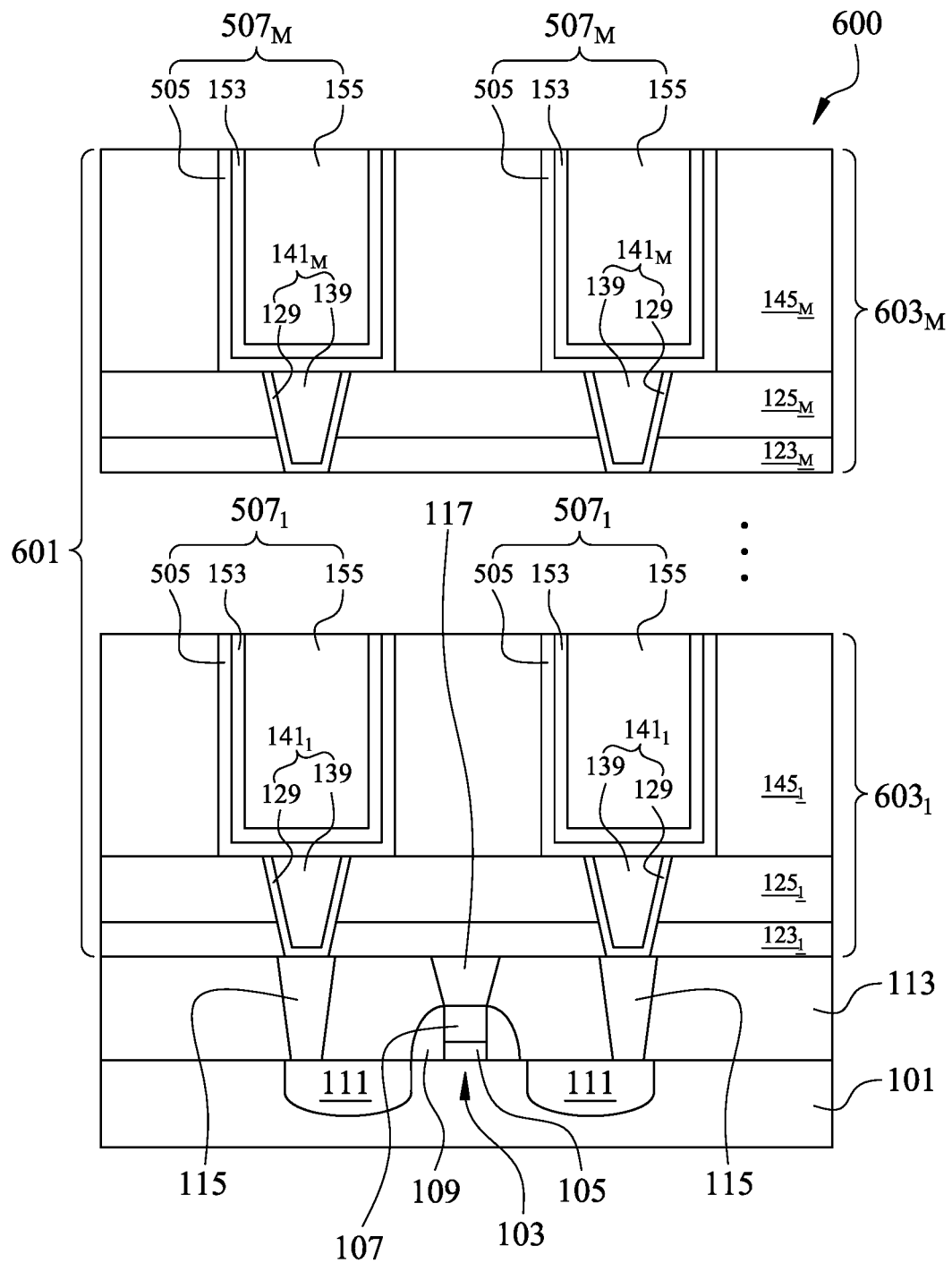
FIG. 34 illustrates a cross-sectional view of a semiconductor device in accordance with some embodiments.

FIG. 34 illustrates a cross-sectional view of a semiconductor device 600 in accordance with some embodiments. The semiconductor device 600 is similar to the semiconductor device 500 (see FIG. 33), with similar features being labeled by similar numerical references. In some embodiments, the interconnect structure 601 (comprising the metallization layers $603_1$ to $603_M$) of the semiconductor device 600 may be formed using process steps similar to the process steps for forming the interconnect structure 501 of the semiconductor device 500 described above with reference to FIGS. 27-33, and the description is not repeated herein. In the illustrated embodiment, the formation of the ESLs $141_1$ to $143_M$ (see FIG. 33) is omitted, such that the IMD layers $145_1$ to $145_M$ are formed directly over the IMD layers $125_1$ to $125_M$, respectively.

Figure 35:
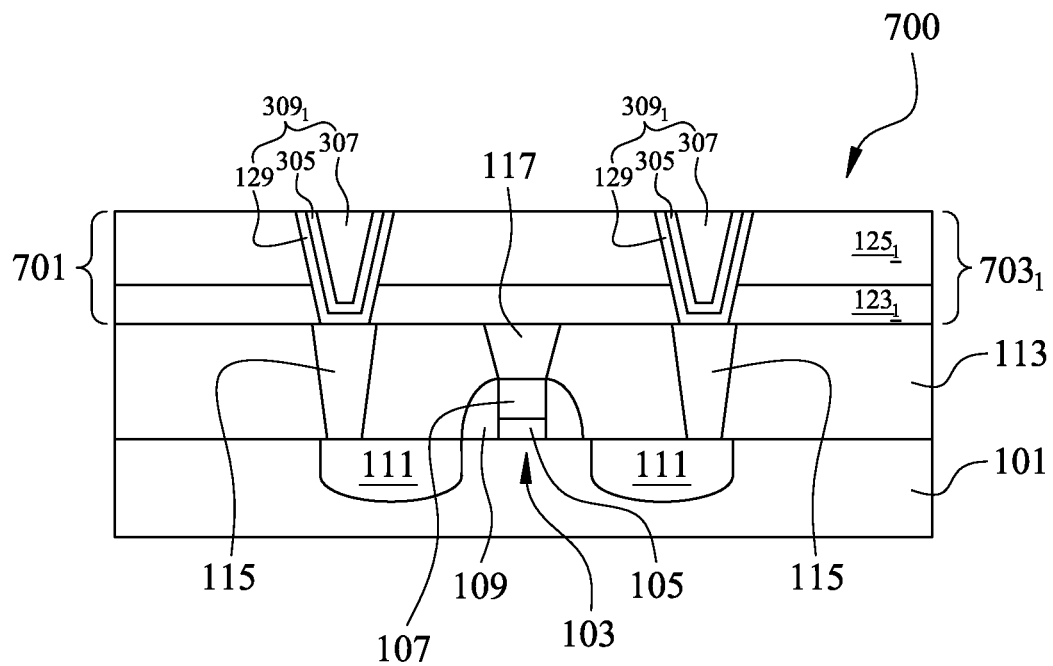
FIGS. 35-37 illustrate cross-sectional views of various intermediate stages of fabrication of a semiconductor device in accordance with some embodiments.
Figure 36:
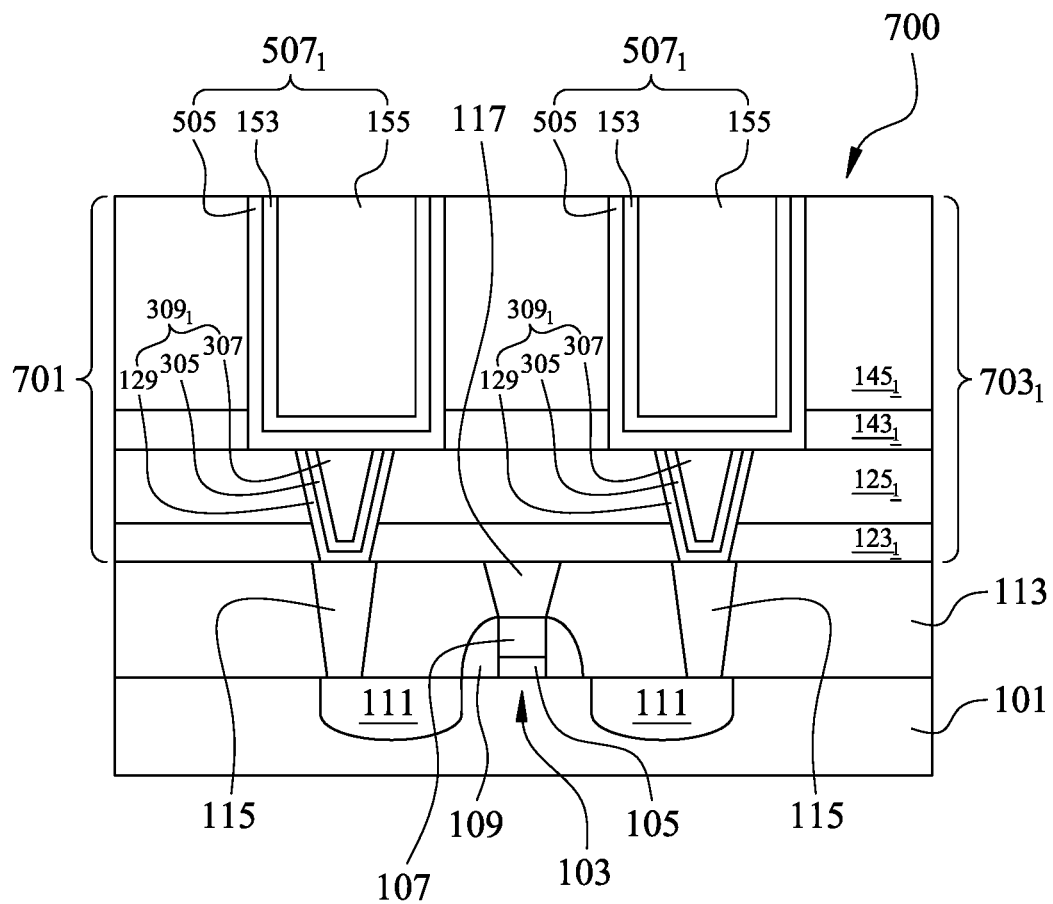
Figure 37:
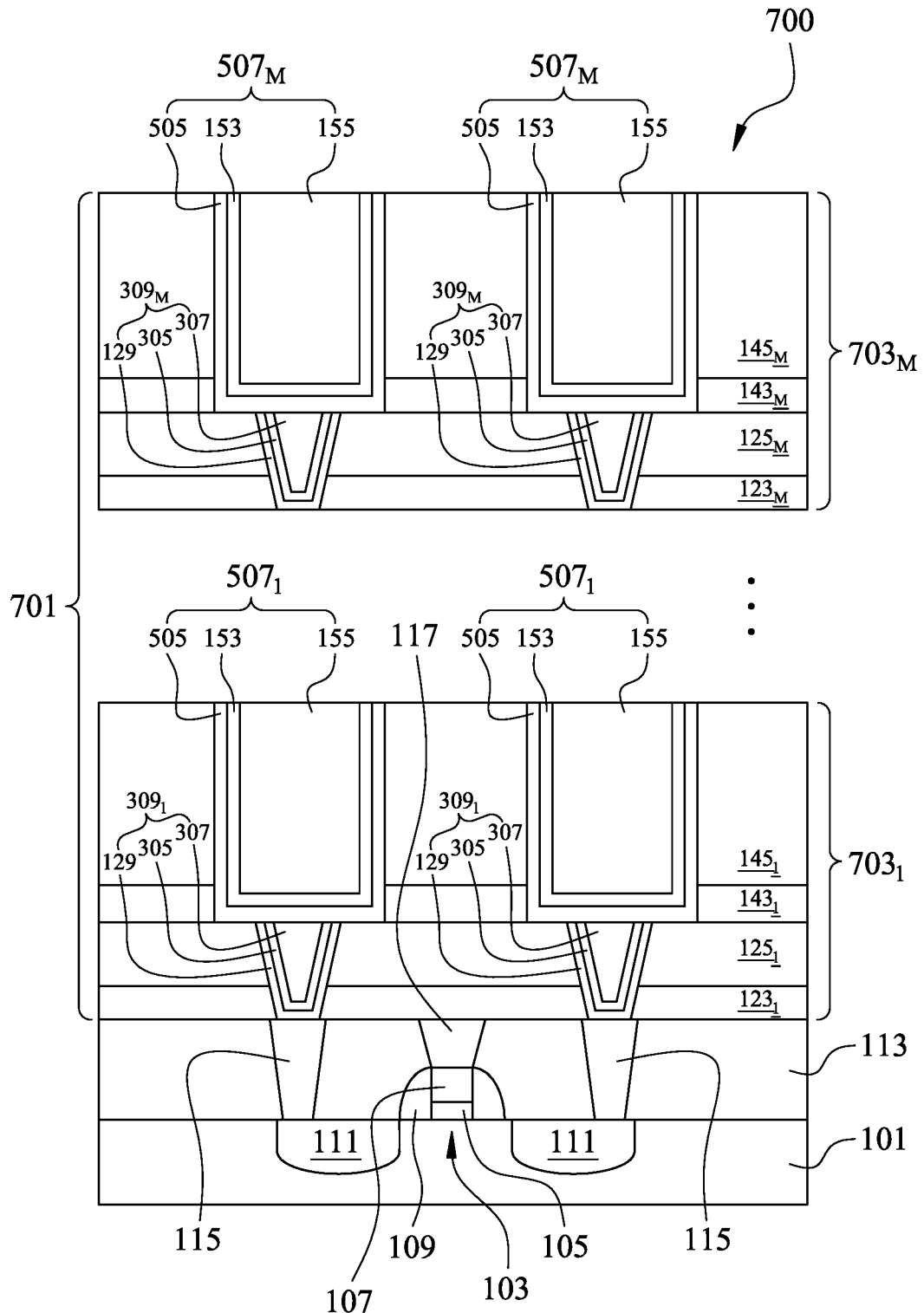

FIGS. 35-37 illustrate cross-sectional views of various intermediate stages of fabrication of a semiconductor device 700 in accordance with some embodiments. In particular, FIGS. 35-37 illustrate cross-sectional views of various intermediate stages of fabrication of an interconnect structure 701 over the structure of FIG. 1 in accordance with some embodiments.

Referring to FIG. 35, in some embodiments, the steps for forming the interconnect structure 701 starts with forming a metallization layer $703_1$ over the one or more ILD layers 113 and the contact plugs 115 and 117. In some embodiments, the formation of the metallization layer $703_1$ starts with forming an ESL $123_1$ over the one or more ILD layers 113 and the contact plugs 115 and 117, and forming an IMD layer $125_1$ over the ESL $123_1$ as described above with reference to FIG. 2 and the description is not repeated herein. Subsequently, conductive vias $309_1$ are formed in the IMD layer $125_1$ and the ESL $123_1$ as described above with reference to FIGS. 19-23, and the description is not repeated herein. In some embodiments, the conductive vias $309_1$ are in physical contact with respective contact plugs 115.

Referring to FIG. 36, after forming the conductive vias $309_1$, an ESL $141_1$ is formed over the IMD layer $125_1$ and the conductive vias $309_1$, and an IMD layer $145_1$ is formed over the ESL $141_1$ as described above with reference to FIG. 12 and the description is not repeated herein. Subsequently, conductive lines $507_1$ are formed in the IMD layer $145_1$ and the ESL $141_1$ as described above with reference to FIGS. 28-32, and the description is not repeated herein. In some embodiments, the conductive lines $507_1$ are in physical contact with respective conductive vias $309_1$.

Referring to FIG. 37, one or more metallization layers similar to the metallization layer $703_1$ are formed over the metallization layer $703_1$ until a metallization layer $703_M$ is formed. In some embodiments, the metallization layer $703_M$ is the final metallization layer of the interconnect structure 701. In some embodiments, M may be between 1 and 12. In some embodiments, the intermediate metallization layers between the metallization layer $703_1$ and the metallization layer $703_M$ are formed in a similar manner as the metallization layer $703_1$ and the description is not repeated herein. In other embodiments, the metallization layer $703_M$ is not the final metallization layer of the interconnect structure 701 and additional metallization layers are formed over the metallization layer $703_M$.

In some embodiments, process steps for forming the metallization layer $703_M$ start with forming an ESL $123_M$ over a previous metallization layer. In some embodiments, the ESL $123_M$ is formed using similar materials and methods as the ESL $123_1$ and the description is not repeated herein. Subsequently, an IMD layer $125_M$ is formed over the ESL $123_M$. In some embodiments, the IMD layer $125_M$ is formed using similar materials and methods as the IMD layer $125_1$ and the description is not repeated herein. Subsequently, conductive vias $309_M$ are formed in the IMD layer $125_M$ and the ESL $123_M$. In some embodiments, features of the conductive vias $309_M$ are similar to features of the conductive vias $309_1$, with similar features being labeled by similar numerical references. In some embodiments, the conductive vias $309_M$ may be formed using process steps as described above with reference to FIGS. 19-23 and the description is not repeated herein.

In some embodiments, after forming the conductive vias $309_M$, an ESL $143_M$ is formed over the conductive vias $309_M$ and the IMD layer $125_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $507_M$ are formed in the IMD layer $145_M$ and the ESL $143_M$. In some embodiments, features of the conductive lines $507_M$ are similar to features of the conductive lines $507_1$, with similar features being labeled by similar numerical references. In some embodiments, the conductive lines $507_M$ may be formed using process steps as described above with reference to FIGS. 28-32 and the description is not repeated herein.

Figure 38:
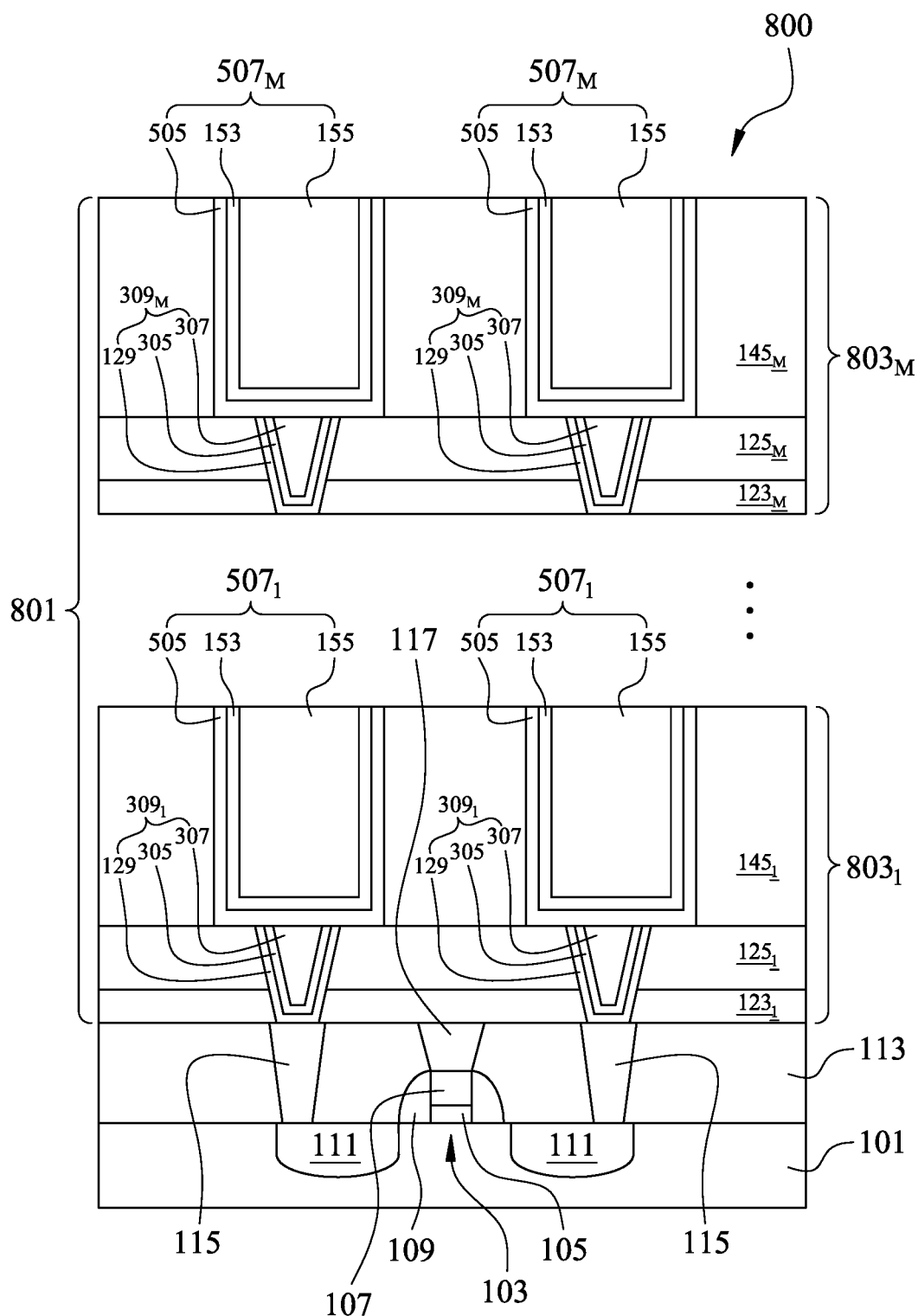
FIG. 38 illustrates a cross-sectional view of a semiconductor device in accordance with some embodiments.

FIG. 38 illustrates a cross-sectional view of a semiconductor device 800 in accordance with some embodiments. The semiconductor device 800 is similar to the semiconductor device 700 (see FIG. 37), with similar features being labeled by similar numerical references. In some embodiments, the interconnect structure 801 (comprising the metallization layers $803_1$ to $803_M$) of the semiconductor device 800 may be formed using process steps similar to the process steps for forming the interconnect structure 701 of the semiconductor device 700 described above with reference to FIGS. 35-37, and the description is not repeated herein. In the illustrated embodiment, the formation of the ESLs $141_1$ to $143_M$ (see FIG. 37) is omitted, such that the IMD layers $145_1$ to $145_M$ are formed directly over the IMD layers $125_1$ to $125_M$, respectively.

Figure 39:
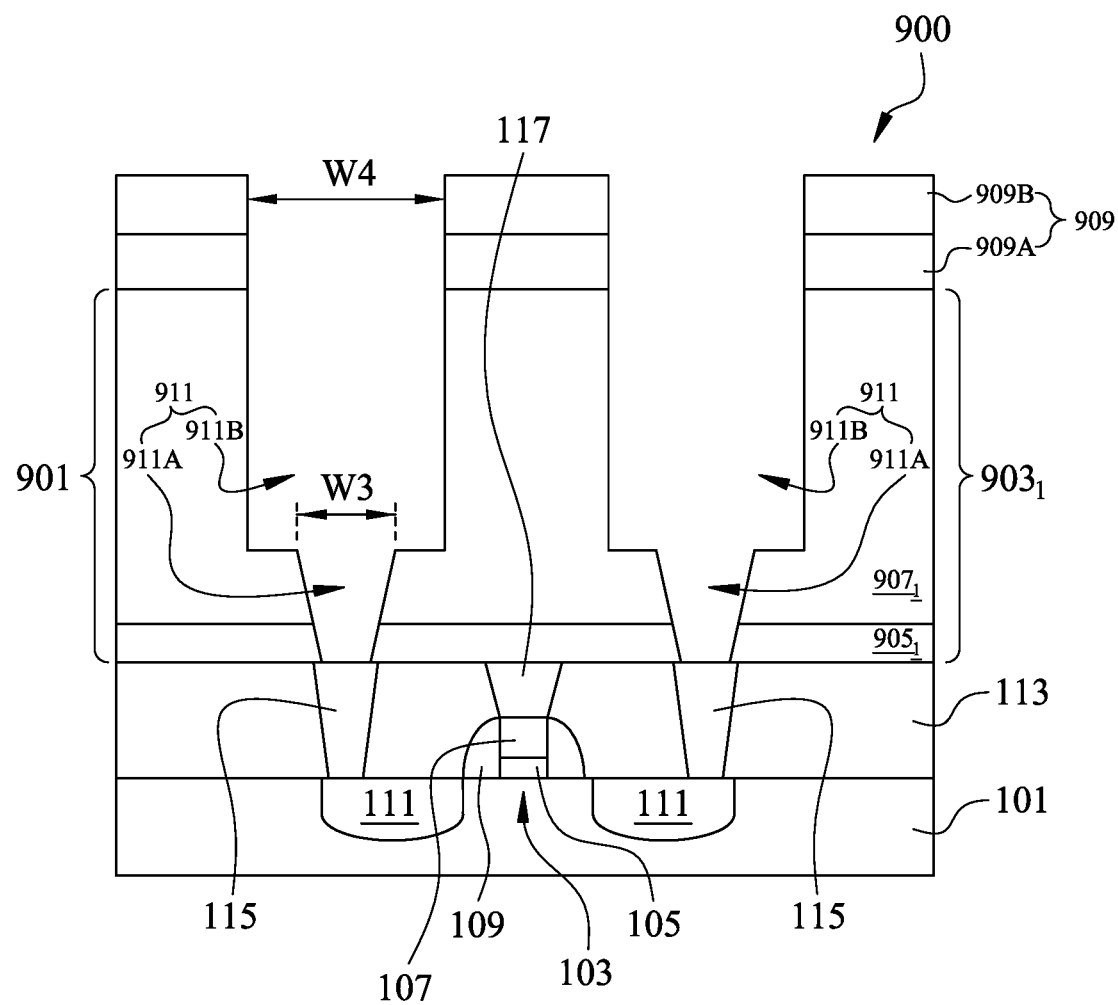
FIGS. 39-44 illustrate cross-sectional views of various intermediate stages of fabrication of a semiconductor device in accordance with some embodiments.

FIGS. 39-44 illustrate cross-sectional views of various intermediate stages of fabrication of a semiconductor device 900 in accordance with some embodiments. In particular, FIGS. 39-44 illustrate cross-sectional views of various intermediate stages of fabrication of an interconnect structure 901 over the structure of FIG. 1 in accordance with some embodiments. Referring to FIG. 39, in some embodiments, the steps for forming the interconnect structure 901 starts with forming a metallization layer $903_1$ over the one or more ILD layers 113 and the contact plugs 115 and 117. In some embodiments, the formation of the metallization layer $901_1$ starts with forming an ESL $905_1$ over the one or more ILD layers 113 and the contact plugs 115 and 117, and forming an IMD layer $907_1$ over the ESL $905_1$.

In some embodiments, a material for the ESL $905_1$ is chosen such that an etch rate of the ESL $905_1$ is less than an etch rate of the IMD layer $907_1$. In some embodiments, the ESL $905_1$ may be formed using similar materials and methods as the ESL $123_1$ described above with references to FIG. 2 and the description is not repeated herein. In some embodiments, the IMD layer $907_1$ may be formed using similar materials and methods as the IMD layer $125_1$ described above with references to FIG. 2 and the description is not repeated herein.

In some embodiments, a mask stack 909 is formed over the IMD layer $907_1$. As described below in greater detail, the mask stack 909 is used to aid in patterning of the IMD layer $907_1$. In some embodiments, the mask stack 909 comprises one or more mask layers. In the illustrated embodiment, the mask stack 909 comprises a first mask layer 909A and a second mask layer 909B over the first mask layer 909A. In some embodiments, the first mask layer 909A includes a dielectric material, such as silicon oxide, silicon nitride, silicon oxynitride, silicon carbide, silicon carbonitride, a combination thereof, or the like, and may be formed using an oxidation process, ALD, CVD, PVD, a combination thereof, or the like. The first mask layer 909A may be also referred to as a dielectric mask layer. In some embodiments, the second mask layer 909B may comprise a metal nitride compound, such as titanium nitride (TiN), tantalum nitride (TaN), or the like, and may be formed using CVD, PECVD, ALD, a combination thereof, or the like. The second mask layer 909B may be also referred to as a metal mask layer.

Referring further to FIG. 39, the mask stack 909, the IMD layer $907_1$, and the ESL $905_1$ are patterned to form openings 911. The openings 911 comprise lower portions 911A, which may be also referred to as via openings 911A, and upper portions 911B, which may be also referred to as line openings 911B. In some embodiments, the openings 911 may be formed by a "via first" process. In other embodiments, the openings 911 may be formed by a "trench first" process.

In some embodiments when the openings 911 are formed using a "via first" process, the via openings 911A are formed before forming the line openings 911B. In some embodiments, a first patterned mask (not shown) is formed on the second mask layer 909B. A material of the first patterned mask is deposited on the second mask layer 909B. The material of the first patterned mask is then irradiated (exposed), cured, and developed to remove a portion of the material of the first patterned mask, thereby forming the first patterned mask. In some embodiments, the first patterned mask may comprise a photoresist, or any suitable photopatternable material.

In some embodiments, the first patterned mask is used to pattern the first mask layer 909A, the second mask layer 909B, and the IMD layer $907_1$ to form the via openings 911A. Portions of the first mask layer 909A, the second mask layer 909B, and the IMD layer $907_1$ unprotected by the first patterned mask are etched using a first etch process. In some embodiments, the first etch process may comprise one or more suitable etch processes, such as, for example, an anisotropic dry etch process, or the like. In some embodiments, the entire first patterned mask may be fully consumed prior to completion of the first etch process. In such embodiments, the first mask layer 909A and the second mask layer 909B are used as an etch mask to complete the first etch process.

In some embodiments, the first etch process stops when the via openings 911A reach the ESL $905_1$, such that bottoms of the via openings 911A expose portions of the ESL $905_1$. In alternative embodiments, the first etch process stops before the via openings 911A reach the ESL $905_1$. In such embodiments, the bottoms of the via openings 911A expose portions of the IMD layer $907_1$. Subsequently, remaining portions of the first patterned mask, if any, are removed. In some embodiments when the first patterned mask is formed of a photoresist material, the remaining portions of the first patterned mask may be removed using, for example, an ashing process in combination with a wet clean process.

After forming the via openings 911A, the line openings 911B are formed in the IMD layer $907_1$. In some embodiments, a second patterned mask (not shown) is formed on the second mask layer 909B. A material of the second patterned mask is deposited on the second mask layer 909B. The material of the second patterned mask is then irradiated (exposed), cured, and developed to remove a portion of the material of the second patterned mask, thereby forming the second patterned mask. In some embodiments, the second patterned mask may comprise a photoresist, or any suitable photo-patternable material.

In some embodiments, the second patterned mask is used to pattern the first mask layer 909A, the second mask layer 909B, and the IMD layer $907_1$ to form the line openings 911B. Portions of the first mask layer 909A, the second mask layer 909B, and the IMD layer $907_1$ unprotected by the second patterned mask are etched using a second etch process. In some embodiments, the second etch process may comprise one or more suitable etch processes, such as, for example, an anisotropic dry etch process, or the like. In some embodiments, the second etch process may be different from the first etch process. In some embodiments, the entire second patterned mask may be fully consumed prior to completion of the second etch process. In such embodiments, the first mask layer 909A and the second mask layer 909B are used as an etch mask to complete the second etch process.

In some embodiments, the second etch process may further extend the via openings 911A. In some embodiments when the ESL $905_1$ is not exposed after the first etch process, the second etch process further etches the IMD layer $907_1$ and the ESL $905_1$, such that the via openings 911A extend through the ESL $905_1$ and expose the respective source/drain contact plugs 115.

In other embodiments when the ESL $905_1$ is exposed after the first etch process, the second etch process etches the ESL $905_1$, such that the via openings 911A extend through the ESL $905_1$ and expose the respective source/drain contact plugs 115. Subsequently, remaining portions of the second patterned mask, if any, are removed. In some embodiments when the second patterned mask is formed of a photoresist material, the remaining portions of the second patterned mask may be removed using, for example, an ashing process in combination with a wet clean process.

Referring further to FIG. 39, in alternative embodiments, the openings 911 are formed using a "trench first" process.

In such embodiments, formation process of the openings 911 is similar to the "via first process" described above with a distinction that the line openings 911B are formed before forming the via openings 911A. In some embodiments, the via openings 911A have a width W3 at tops of the via openings 911A and the line openings 911B have a width W4 at tops of the line openings 911B. In some embodiments, the width W3 is between about 2 nm and about 20 nm. In some embodiments, the width W4 is between about 5 nm and about 40 nm.

Figure 40:
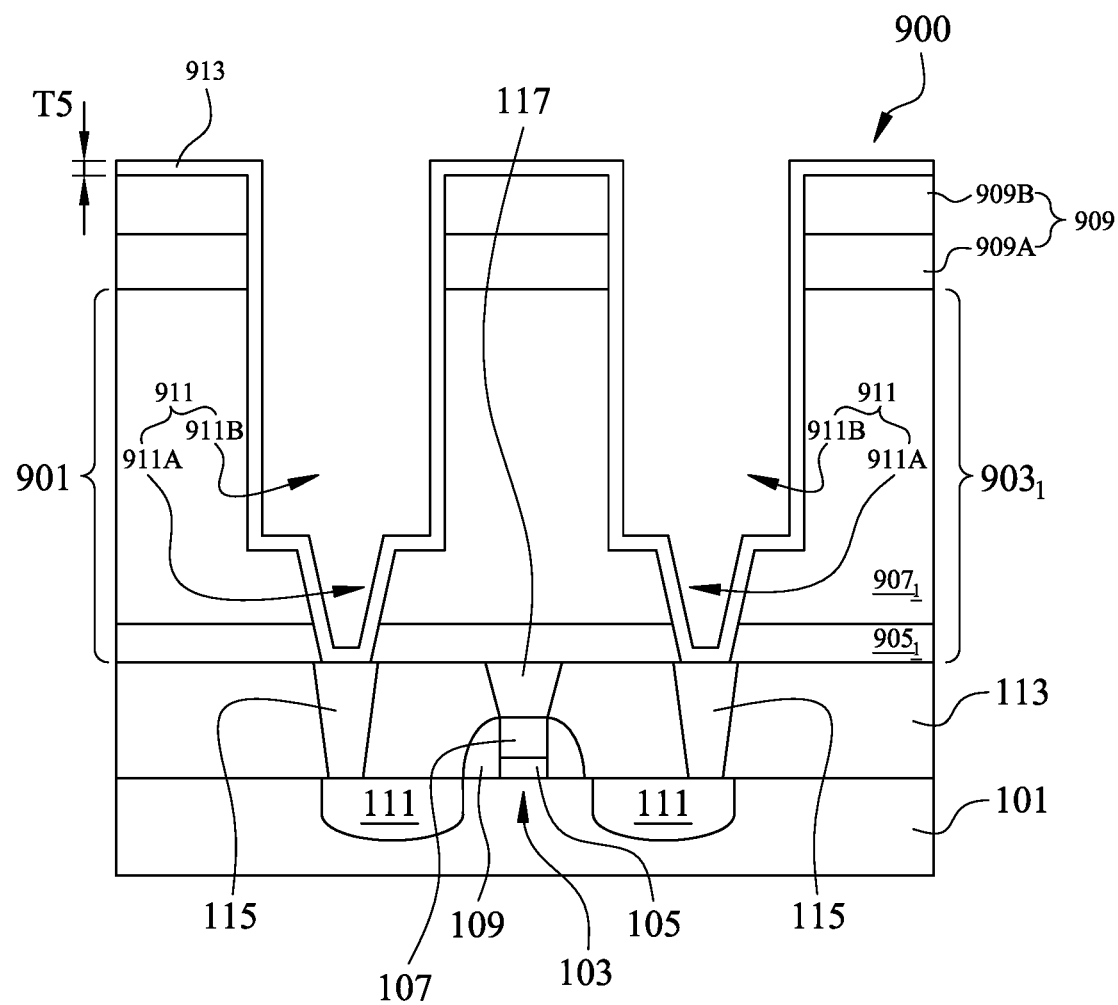

Referring to FIG. 40, a barrier/adhesion layer 913 is formed over the mask stack 909, along sidewalls and bottoms of the via openings 911A, and along sidewalls and bottoms of the line openings 911B. In some embodiments, the barrier/adhesion layer 913 may be formed using similar materials and methods as the barrier/adhesion layer 129 described above with reference to FIGS. 3-6 and the description is not repeated herein. In some embodiments, the barrier/adhesion layer 913 has a thickness T5 between about 1 nm and about 3 nm. The barrier/adhesion layer 913 reduces a volume available for a conductive material that is subsequently formed in the openings 911. In particular, after forming the barrier/adhesion layer 913, a remaining width of the via openings 911A is reduced to the original width W3 (see FIG. 39) of the via openings 911A minus 2 times the thickness T5 of the barrier/adhesion layer 913, and a remaining width of the line openings 911B is reduced to the original width W4 (see FIG. 39) of the line openings 911B minus 2 times the thickness T5 of the barrier/adhesion layer 913. In some embodiments, a ratio of 2 times the thickness T5 of the barrier/adhesion layer 913 to the original width W3 (see FIG. 39) of the via openings 911A is between about 0.1 and about 1. In some embodiments, a ratio of 2 times the thickness T5 of the barrier/adhesion layer 913 to the original width W4 (see FIG. 39) of the line openings 911B is between about 0.05 and about 1. By forming the barrier/adhesion layer 913 using similar materials and methods as the barrier/adhesion layer 129 described above with reference to FIGS. 3-6, the thickness T5 of the barrier/adhesion layer 913 may be reduced compared to a dual-material barrier/adhesion layer. Accordingly, a volume available for a conductive material that is subsequently formed in the openings 911 is enlarged and a resistance of resulting interconnects is reduced.

Figure 41:
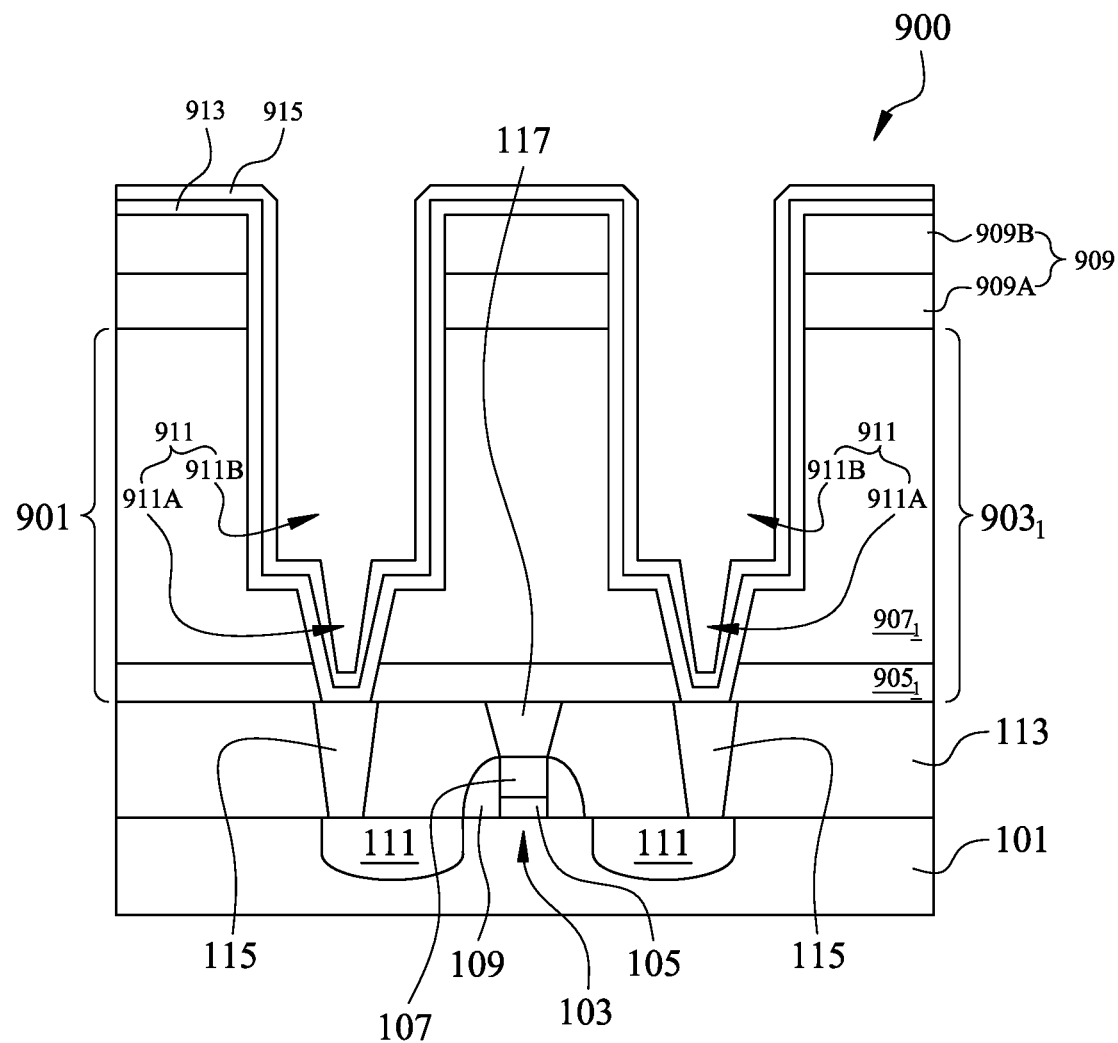

Referring to FIG. 41, a seed layer 915 is formed over the barrier/adhesion layer 913 in the openings 911 and over the mask stack 909. In some embodiments, the seed layer 915 may be formed using similar materials and methods as the seed layer 139 described above with reference to FIG. 10 and the description is not repeated herein. In some embodiments, the seed layer 915 may be formed having a thickness such that the seed layer 915 partially fills the via openings 911A and the line opening 911B.

Figure 42:
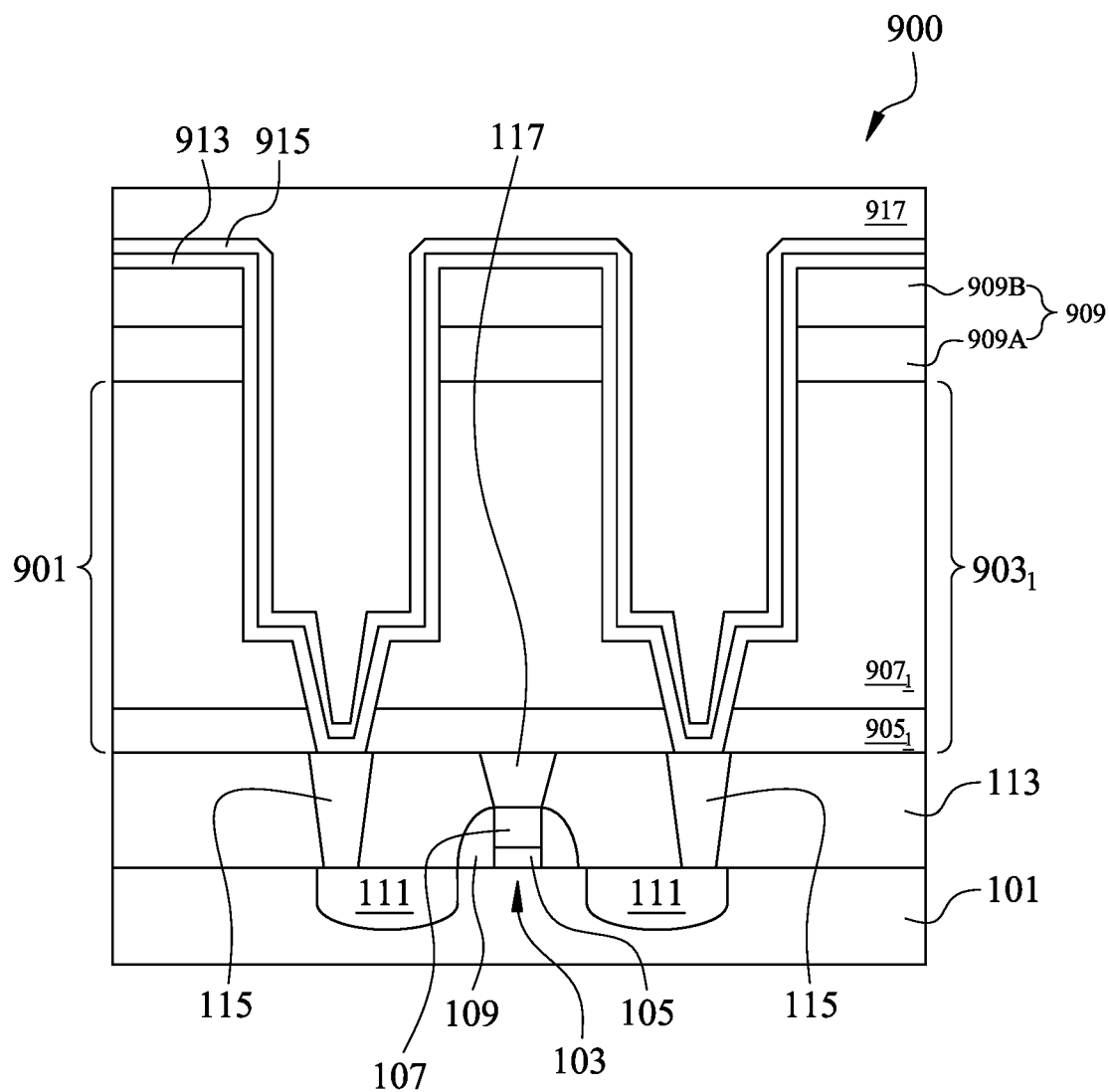

Referring to FIG. 42, a conductive fill layer 917 is formed in the openings 911 (see FIG. 41) and over the mask stack 909. In some embodiments, the conductive fill layer 917 overfills the openings 911. In some embodiments, the conductive fill layer 917 may be formed using similar materials and methods as the conductive fill layer 155 described above with reference to FIG. 15 and description is not repeated herein.

Figure 43:
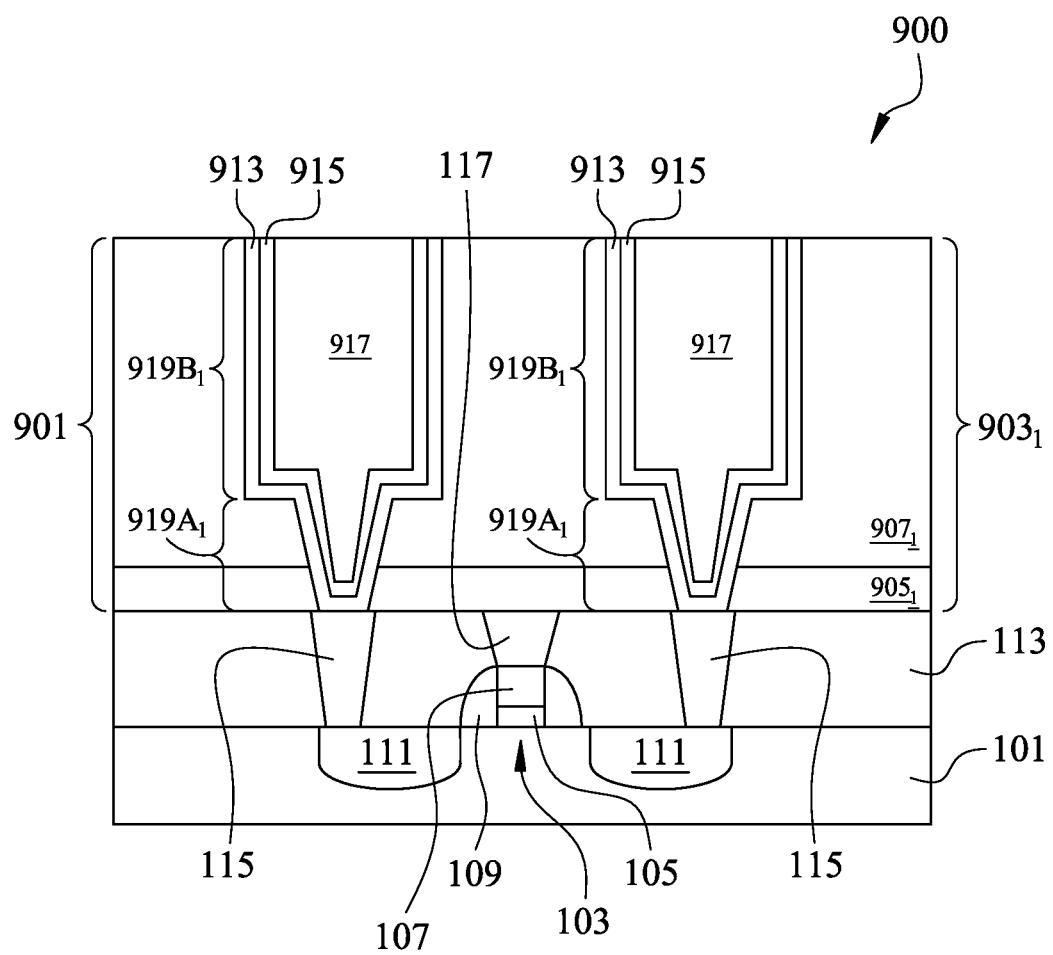

Referring to FIG. 43, portions of the barrier/adhesion layer 913, the seed layer 915, and the conductive fill layer 917 overfilling the openings 911 (see FIG. 41) are removed to expose a top surface of the IMD layer $907_1$. In some embodiments, the removal process further removes the mask stack 909 (see FIG. 42). In some embodiments, the removal process may be a planarization process comprising a CMP process, a grinding process, an etching process, a combination thereof, or the like. Remaining portions of the barrier/adhesion layer 913, the seed layer 915, and the conductive fill layer 917 filling the via openings 911A (see FIG. 41) form conductive vias $919A_1$. Remaining portions of the barrier/adhesion layer 913, the seed layer 915, and the conductive fill layer 917 filling the line openings 911B (see FIG. 41) form conductive lines $919B_1$. In some embodiments, top surfaces of the conductive lines $919B_1$ are substantially coplanar or level with the top surface of the IMD layer $907_1$ within process variations of the planarization process. In some embodiments, by forming the barrier/adhesion layer 913 using similar materials and methods as the barrier/adhesion layer 129 described above with reference to FIGS. 3-6, a volume of the conductive fill layer 917 is increased and scattering effects at an interface between the barrier/adhesion layer 913 and the seed layer 915 is reduced. Accordingly, a resistance of the conductive vias $919A_1$ and a resistance of the conductive line $919B_1$ are reduced.

Figure 44:
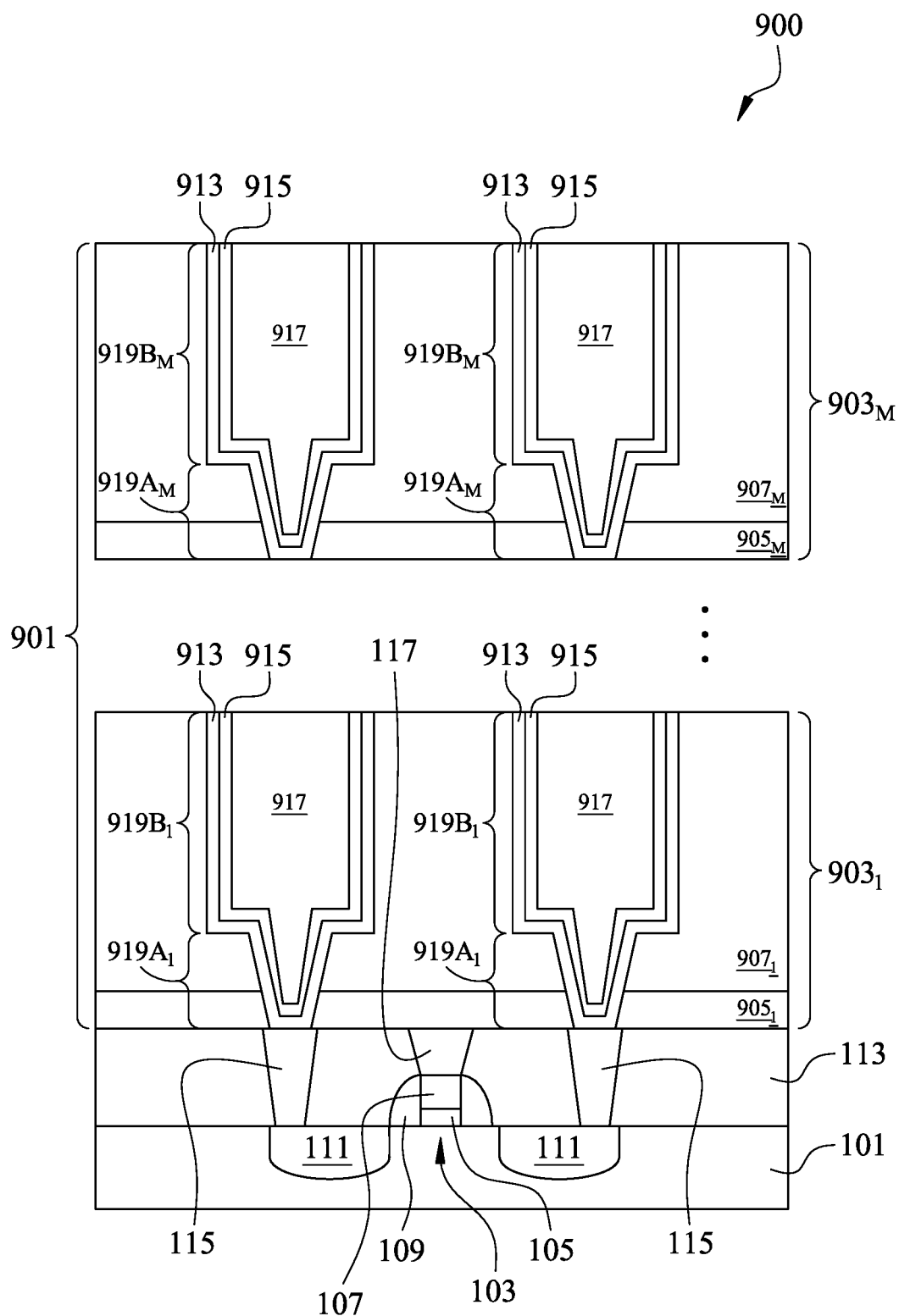

Referring to FIG. 44, one or more metallization layers similar to the metallization layer $903_1$ are formed over the metallization layer $903_1$ until a metallization layer $903_M$ is formed. In some embodiments, the metallization layer $903_M$ is the final metallization layer of the interconnect structure 901. In some embodiments, M may be between 1 and 12. In some embodiments, the intermediate metallization layers between the metallization layer $903_1$ and the metallization layer $903_M$ are formed in a similar manner as the metallization layer $903_1$ and the description is not repeated herein. In other embodiments, the metallization layer $903_M$ is not the final metallization layer of the interconnect structure 901 and additional metallization layers are formed over the metallization layer $903_M$.

In some embodiments, process steps for forming the metallization layer $903_M$ start with forming an ESL $905_M$ over a previous metallization layer. In some embodiments, the ESL $905_M$ is formed using similar materials and methods as the ESL $905_1$ and the description is not repeated herein. Subsequently, an IMD layer $907_M$ is formed over the ESL $905_M$. In some embodiments, the IMD layer $907_M$ is formed using similar materials and methods as the IMD layer $907_1$ and the description is not repeated herein.

Subsequently, conductive vias $919A_M$ and conductive lines $919B_M$ are formed in the IMD layer $907_M$ and the ESL $905_M$. In some embodiments, features of the conductive vias $919A_M$ and the conductive lines $919B_M$ are similar to features of the conductive vias $919A_1$ and the conductive lines $919B_1$, respectively, with similar features being labeled by similar numerical references. In some embodiments, the conductive vias $919A_M$ and the conductive lines $919B_M$ may be formed using process steps as described above with reference to FIGS. 39-43, and the description is not repeated herein.

FIGS. 45-52 illustrate cross-sectional views of various intermediate stages of fabrication of a semiconductor device 1000 in accordance with some embodiments. In particular, FIGS. 45-52 illustrate cross-sectional views of various intermediate stages of fabrication of an interconnect structure 1001 (see FIG. 52) over the structure of FIG. 1 in accordance with some embodiments.

Figure 45:
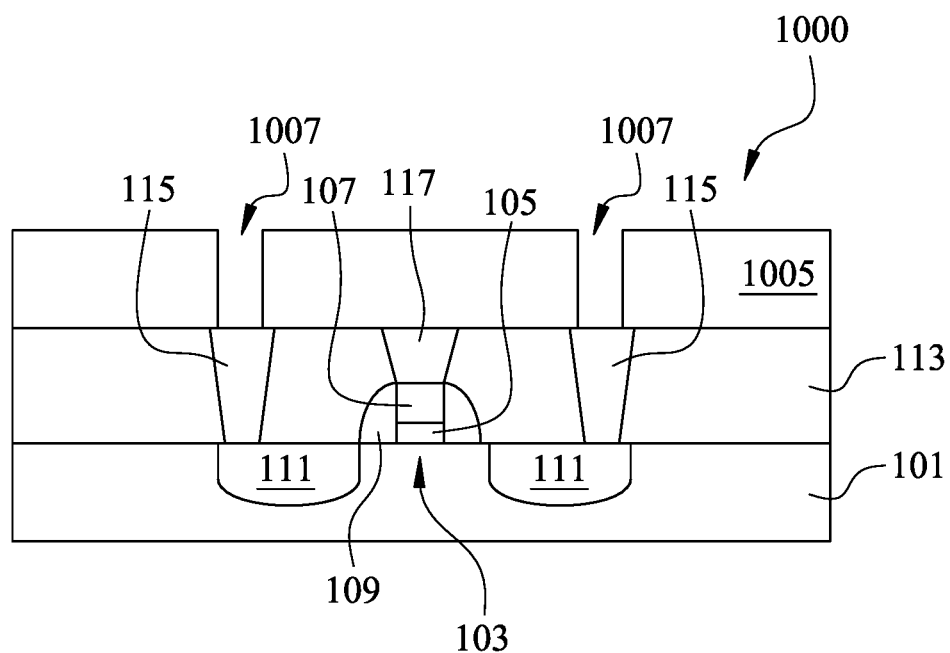
FIGS. 45-52 illustrate cross-sectional views of various intermediate stages of fabrication of a semiconductor device in accordance with some embodiments.

Referring to FIG. 45, in some embodiments, the steps for forming the interconnect structure 1001 starts with forming a metallization layer $1003_1$ (see FIG. 51) over the one or more ILD layers 113 and the contact plugs 115 and 117. In some embodiments, the formation of the metallization layer $1003_1$ starts with forming a mask 1005 over the one or more ILD layers 113 and the contact plugs 115 and 117. The mask 1005 may comprise a photoresist material, a polymer material, a dielectric material, or the like. After forming the mask 1005, the mask 1005 is patterned to form openings 1007 in the mask 1005. The openings 1007 expose respective contact plugs 115. In some embodiments when the mask 1005 comprises a photoresist material, the patterning process comprises exposing the photoresist material to light followed by curing and developing processes. In some embodiments when the mask 1005 comprises a dielectric material, the patterning process comprises suitable photolithography and etch processes.

Figure 46:
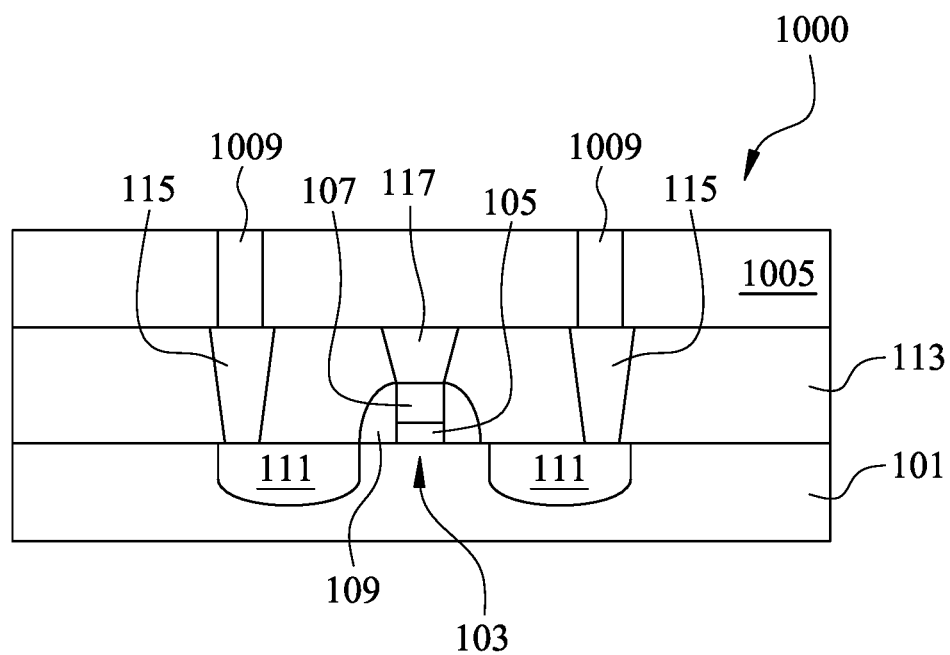

Referring to FIG. 46, conductive columns 1009 are formed in the opening 1007 (see FIG. 45). In some embodiments, the conductive columns 1009 may comprise copper, aluminum, tungsten, ruthenium, cobalt, nickel, combinations thereof, alloys thereof, multilayers thereof, or the like, and may be formed using electroless plating, PVD, CVD, a combination thereof, or the like. The conductive columns 1009 are in physical contact with respective contact plugs 115.

Figure 47:
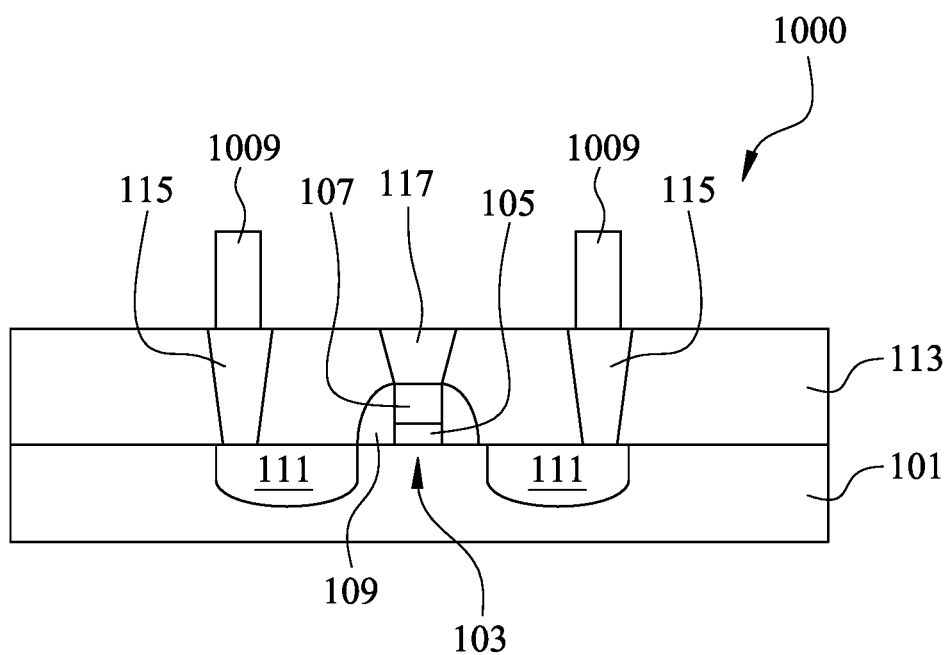

Referring to FIG. 47, the mask 1005 (see FIG. 46) is removed to expose sidewalls of the conductive columns 1009. In some embodiments when the mask 1005 comprises a photoresist material, the mask 1005 is removed by an ashing process followed by a wet clean process. In some embodiments when the mask 1005 comprises a dielectric material, the mask 1005 is removed by a suitable etch process that is selective to a material of the mask 1005.

Figure 48:
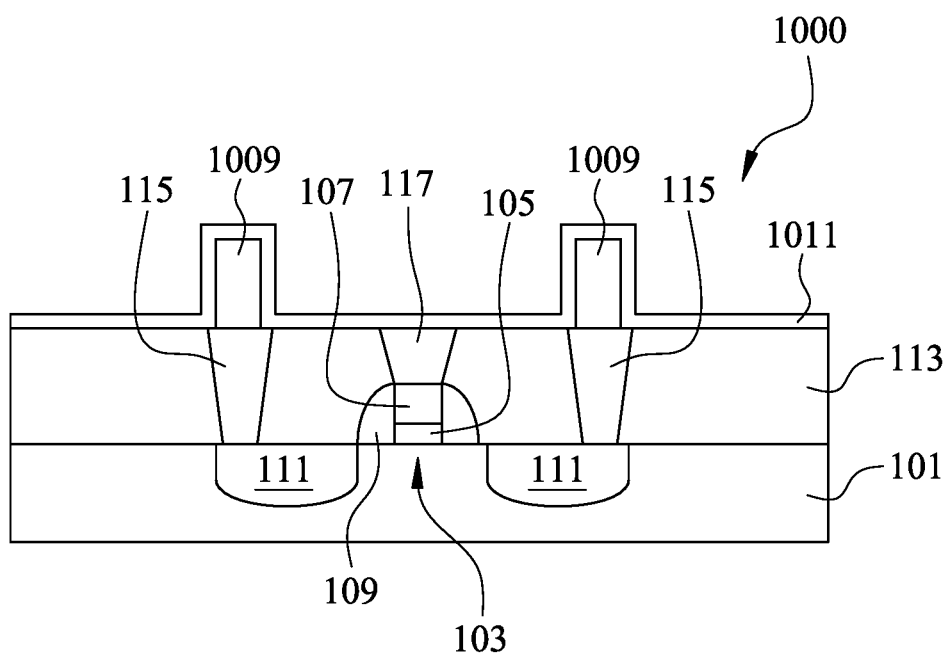

Referring to FIG. 48, a barrier/adhesion layer 1011 is formed over the conductive columns 1009 and the one or more ILD layers 113. The barrier/adhesion layer 1011 extends along a top surface and sidewalls of each of the conductive columns 1009. In some embodiments, the barrier/adhesion layer 1011 may be formed using similar materials and methods as the barrier/adhesion layer 129 described above with reference to FIGS. 3-6, and description is not repeated herein. In some embodiments, the barrier/adhesion layer 1011 has a thickness between about 0.5 nm and about 5 nm. In the illustrated embodiment, the barrier/adhesion layer 1011 is formed having a thickness such that the barrier/adhesion layer 1011 partially fills gaps between adjacent conductive columns 1009.

Figure 49:
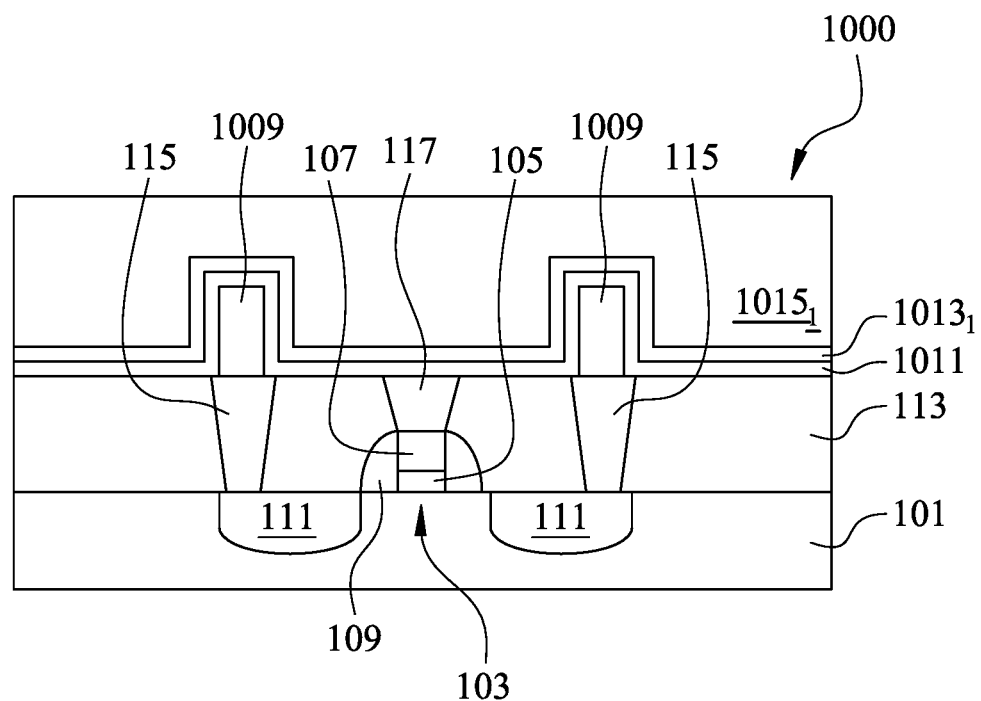

Referring to FIG. 49, a capping layer $1013_1$ is formed over the barrier/adhesion layer 1011. The capping layer $1013_1$ may comprise silicon oxide, a metal oxide, silicon carbide, silicon nitride, a combination thereof, or the like, and may be formed using ALD, CVD, a combination thereof, or the like. In some embodiments, the capping layer $1013_1$ has a thickness between about 1 nm and about 10 nm. In the illustrated embodiment, the capping layer $1013_1$ is formed having a thickness such that the capping layer $1013_1$ partially fills the gaps between adjacent conductive columns 1009.

Subsequently, a dielectric layer $1015_1$ is formed over the capping layer $1013_1$. The dielectric layer $1015_1$ may be also referred to as an IMD layer $1015_1$. In some embodiments, the IMD layer $1015_1$ may be formed using similar materials and methods as the one or more ILD layers 113 and the description is not repeated herein. In the illustrated embodiment, the IMD layer $1015_1$ is formed having a thickness such that the IMD layer $1015_1$ overfills the gaps between adjacent conductive columns 1009.

Figure 50:
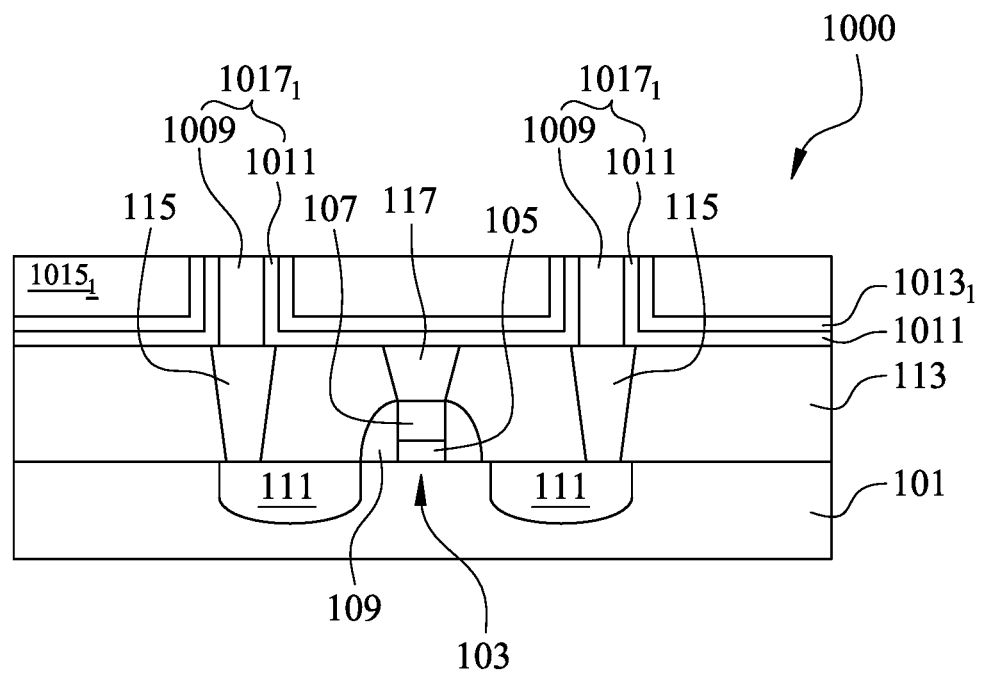

Referring to FIG. 50, portions of the barrier/adhesion layer 1011, the capping layer $1013_1$, and the IMD layer $1015_1$ extending above top surfaces of the conductive columns 1009 are removed to expose the top surfaces of the conductive columns 1009. In some embodiments, the removal process may also remove portions of the conductive columns 1009. The removal process may be a planarization process comprising a CMP process, a grinding process, an etching process, a combination thereof, or the like. The remaining portions of the conductive columns 1009 and portions of the barrier/adhesion layer 1011 extending along the sidewalls of the conductive columns 1009 form conductive vias $1017_1$. In some embodiments, after performing the planarization process, top surfaces of the conductive vias $1017_1$ are substantially coplanar or level with a top surface of the capping layer $1013_1$ and a top surface of the IMD layer $1015_1$ within process variations of the planarization process.

Figure 51:
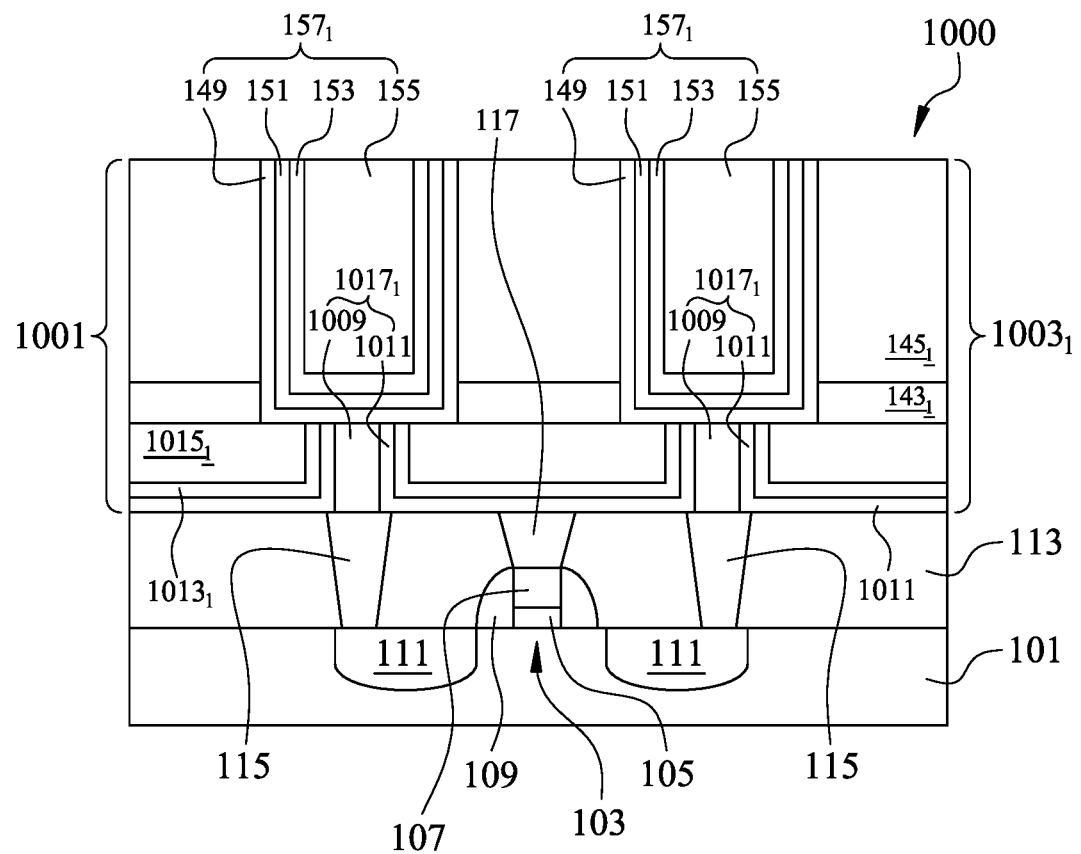

Referring to FIG. 51, after performing the planarization process, an ESL $141_1$ is formed over the IMD layer $1015_1$ and the conductive vias $1017_1$, and an IMD layer $145_1$ is formed over the ESL $141_1$ as described above with reference to FIG. 12 and the description is not repeated herein. Subsequently, conductive lines $157_1$ are formed in the IMD layer $145_1$ and the ESL $141_1$ as described above with reference to FIGS. 12-16 and the description is not repeated herein. In some embodiments, the conductive lines $157_1$ are in physical contact with respective conductive vias $1017_1$.

Figure 52:
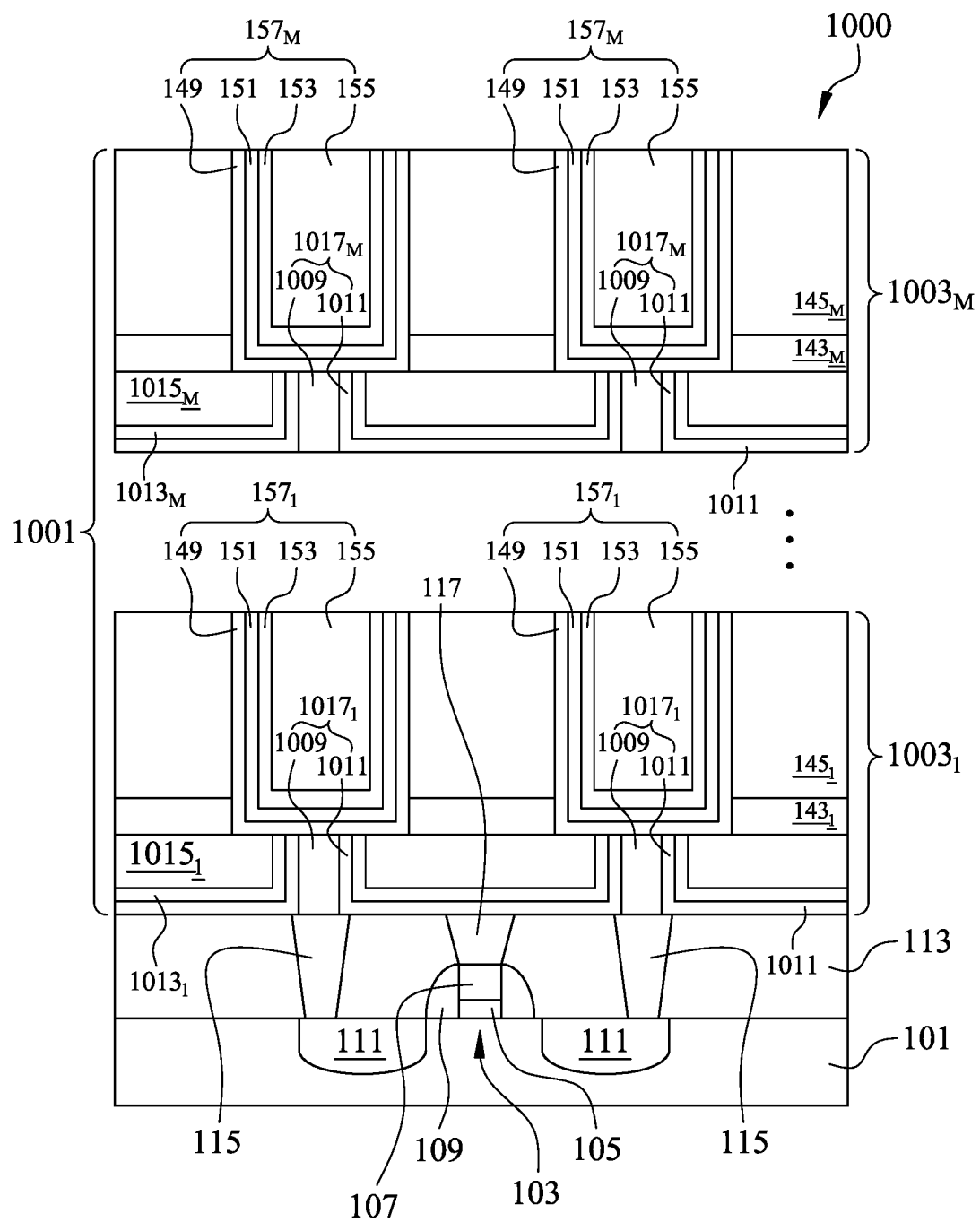

Referring to FIG. 52, one or more metallization layers similar to the metallization layer $1003_1$ are formed over the metallization layer $1003_1$ until a metallization layer $1003_M$ is formed. In some embodiments, the metallization layer $1003_M$ is the final metallization layer of the interconnect structure 1001. In some embodiments, M may be between 1 and 12. In some embodiments, the intermediate metallization layers between the metallization layer $1003_1$ and the metallization layer $1003_M$ are formed in a similar manner as the metallization layer $1003_1$ and the description is not repeated herein. In other embodiments, the metallization layer $1003_M$ is not the final metallization layer of the interconnect structure 1001 and additional metallization layers are formed over the metallization layer $1003_M$.

In some embodiments, process steps for forming the metallization layer $1003_M$ start with forming an IMD layer $1015_M$, a capping layer $1013_M$, and conductive vias $1017_M$ over a previous metallization layer. In some embodiments, the IMD layer $1015_M$ is formed using similar materials and methods as the IMD layer $1015_1$ and the description is not repeated herein. In some embodiments, the capping layer $1013_M$ is formed using similar materials and methods as the capping layer $1013_1$ and the description is not repeated herein. In some embodiments, features of the conductive vias $1017_M$ are similar to features of the conductive vias $1017_1$, with similar features being labeled by similar numerical references. In some embodiments, the conductive vias $1017_M$ may be formed using process steps as described above with reference to FIGS. 45-50, and the description is not repeated herein.

In some embodiments, after forming the conductive vias $1017_M$, an ESL $143_M$ is formed over the conductive vias $1017_M$ and the IMD layer $1015_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $157_M$ are formed in the IMD layer $145_M$ and the ESL $143_M$. In some embodiments, features of the conductive lines $157_M$ are similar to features of the conductive lines $157_1$, with similar features being labeled by similar numerical references. In some embodiments, the conductive lines $157_M$ may be formed using process steps as described above with reference to FIGS. 12-16, and the description is not repeated herein.

Figure 53:
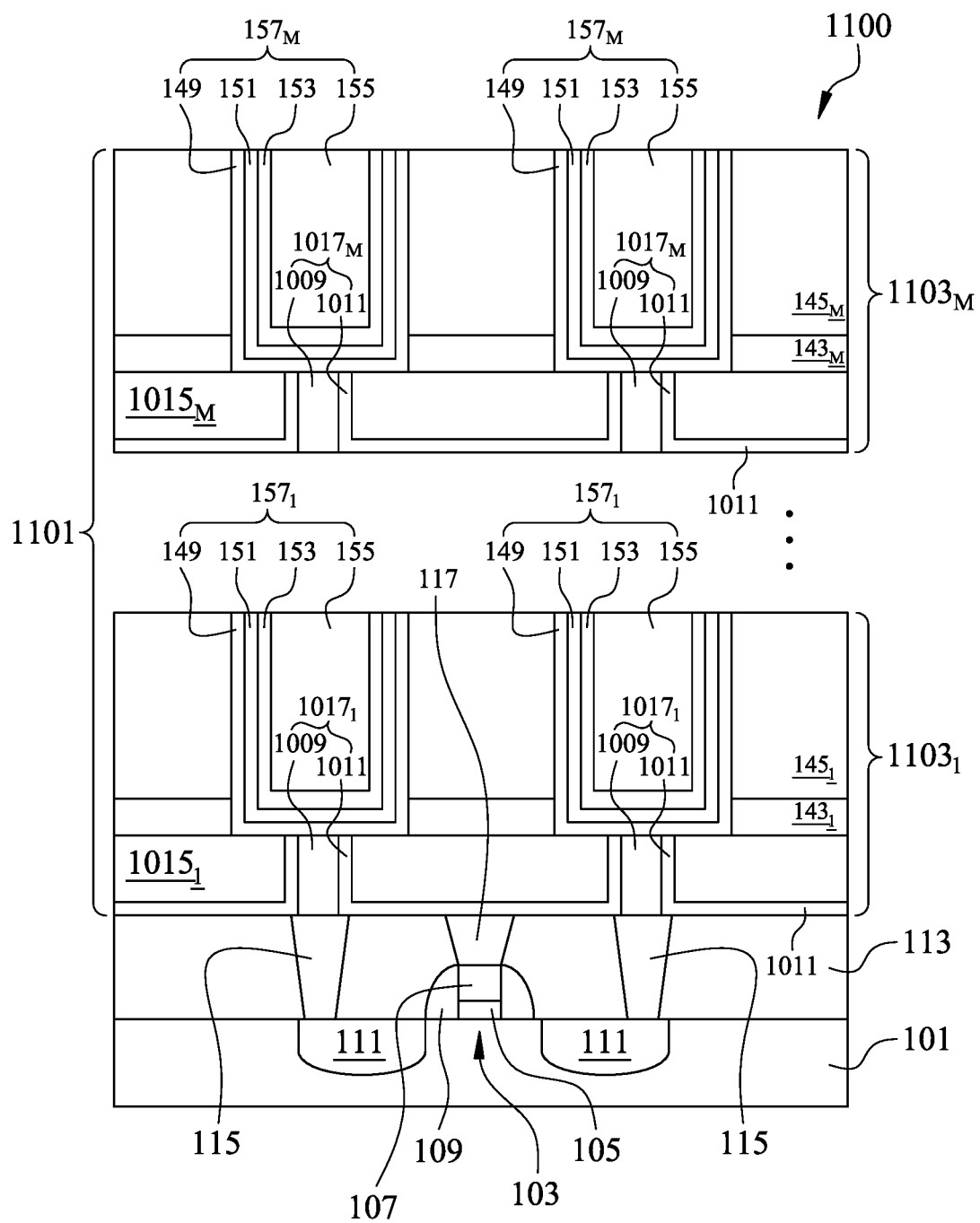
FIG. 53 illustrates a cross-sectional view of a semiconductor device in accordance with some embodiments.

FIG. 53 illustrates a cross-sectional view of a semiconductor device 1100 in accordance with some embodiments. The semiconductor device 1100 is similar to the semiconductor device 1000 (see FIG. 52), with similar features being labeled by similar numerical references. In some embodiments, the interconnect structure 1101 (comprising the metallization layers $1103_1$ to $1103_M$) of the semiconductor device 1100 may be formed using process steps similar to the process steps for forming the interconnect structure 1001 of the semiconductor device 1000 described above with reference to FIGS. 45-52, and the description is not repeated herein. In the illustrated embodiment, the formation of the capping layers $1013_1$ to $1013_M$ (see FIG. 52) is omitted, such that the IMD layers $1015_1$ to $1015_M$ are formed directly over respective barrier/adhesion layers 1011.

Figure 54:
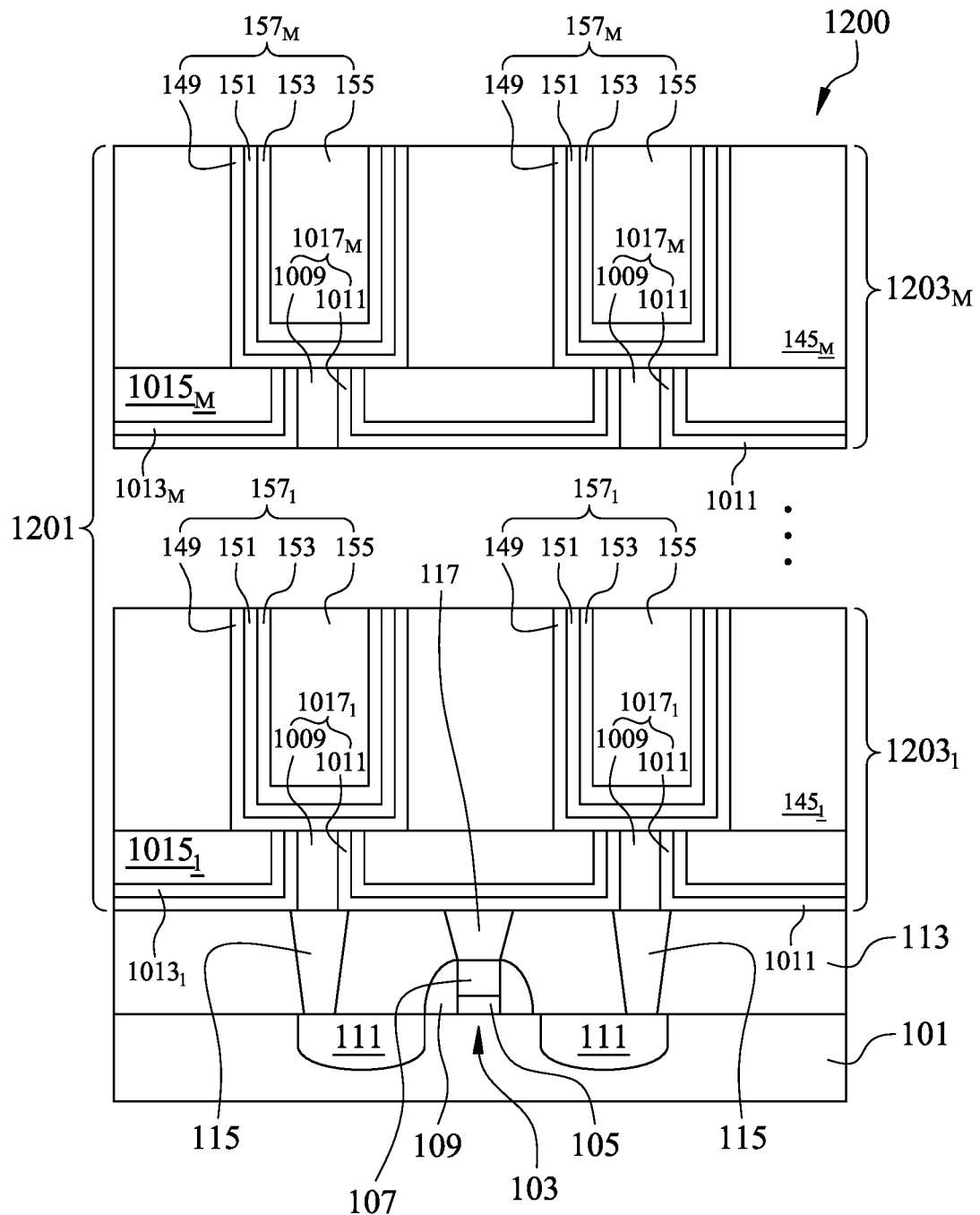
FIG. 54 illustrates a cross-sectional view of a semiconductor device in accordance with some embodiments.

FIG. 54 illustrates a cross-sectional view of a semiconductor device 1200 in accordance with some embodiments. The semiconductor device 1200 is similar to the semiconductor device 1000 (see FIG. 52), with similar features being labeled by similar numerical references. In some embodiments, the interconnect structure 1201 (comprising the metallization layers $1203_1$ to $1203_M$) of the semiconductor device 1200 may be formed using process steps similar to the process steps for forming the interconnect structure 1001 of the semiconductor device 1000 described above with reference to FIGS. 45-52, and the description is not repeated herein. In the illustrated embodiment, the formation of the ESLs $141_1$ to $143_M$ (see FIG. 52) is omitted, such that the IMD layers $145_1$ to $145_M$ are formed directly over the IMD layers $1015_1$ to $1015_M$, respectively.

Figure 55:
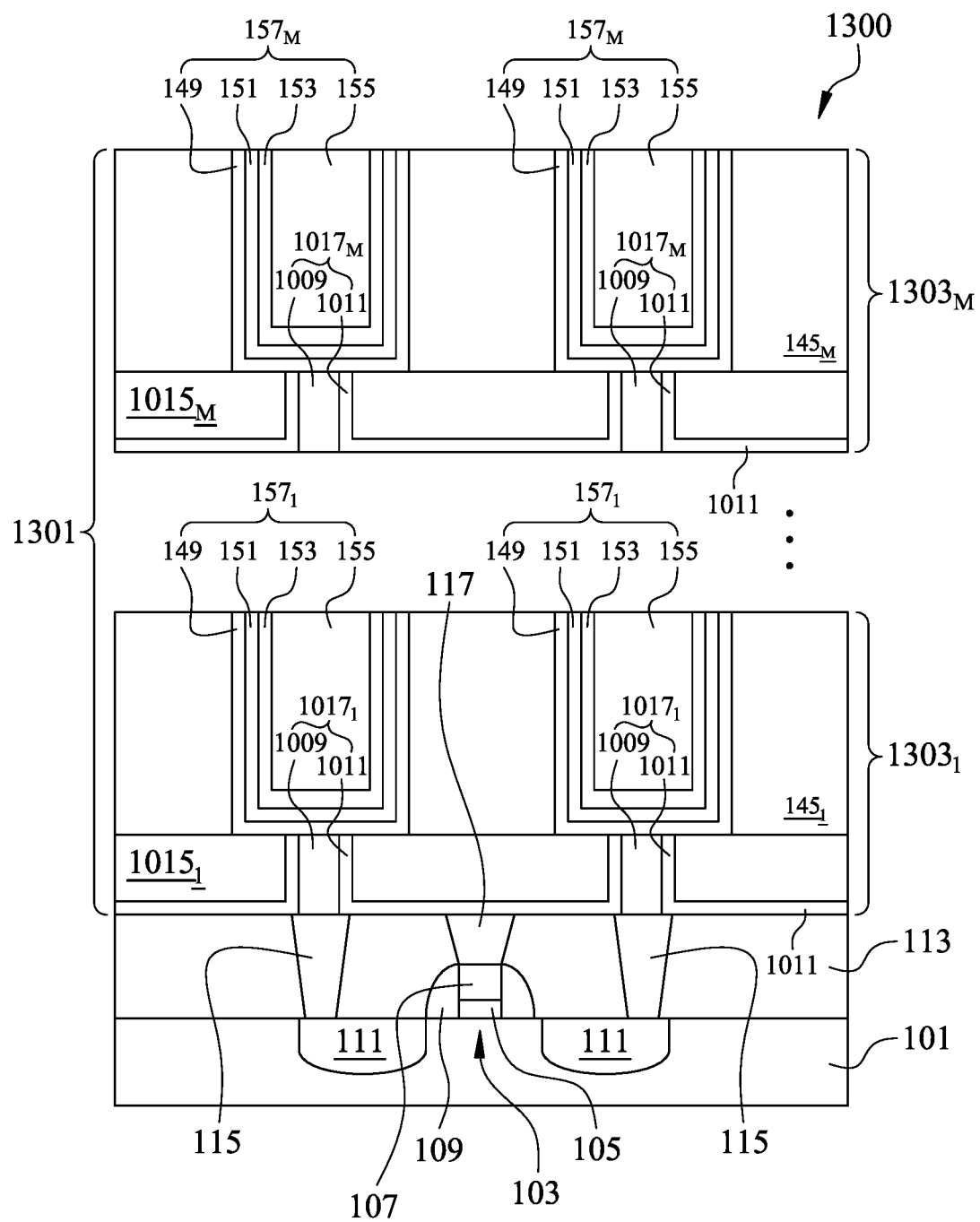
FIG. 55 illustrates a cross-sectional view of a semiconductor device in accordance with some embodiments.

FIG. 55 illustrates a cross-sectional view of a semiconductor device 1300 in accordance with some embodiments. The semiconductor device 1300 is similar to the semiconductor device 1200 (see FIG. 54), with similar features being labeled by similar numerical references. In some embodiments, the interconnect structure 1301 (comprising the metallization layers $1303_1$ to $1303_M$) of the semiconductor device 1300 may be formed using process steps similar to the process steps for forming the interconnect structure 1201 of the semiconductor device 1200 described above with reference to FIG. 54 and the description is not repeated herein. In the illustrated embodiment, the formation of the capping layers $1013_1$ to $1013_M$ (see FIG. 54) is omitted, such that the IMD layers $1015_1$ to $1015_M$ are formed directly over respective barrier/adhesion layers 1011.

Figure 56:
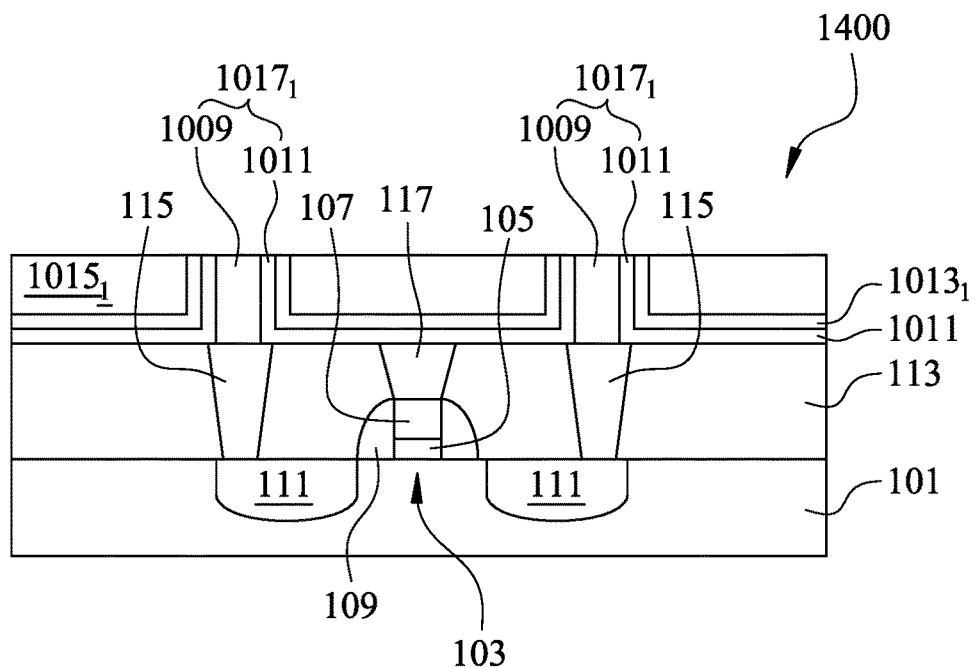
FIGS. 56-58 illustrate cross-sectional views of various intermediate stages of fabrication of a semiconductor device in accordance with some embodiments.
Figure 57:
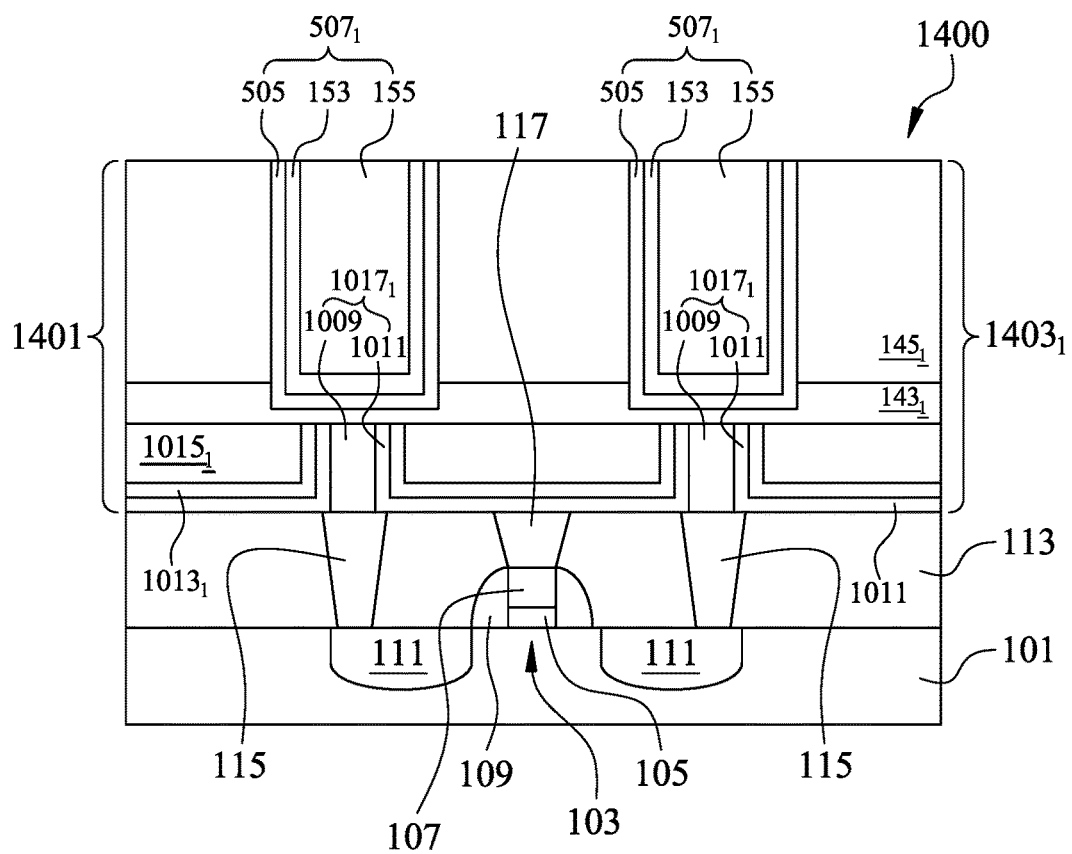
Figure 58:
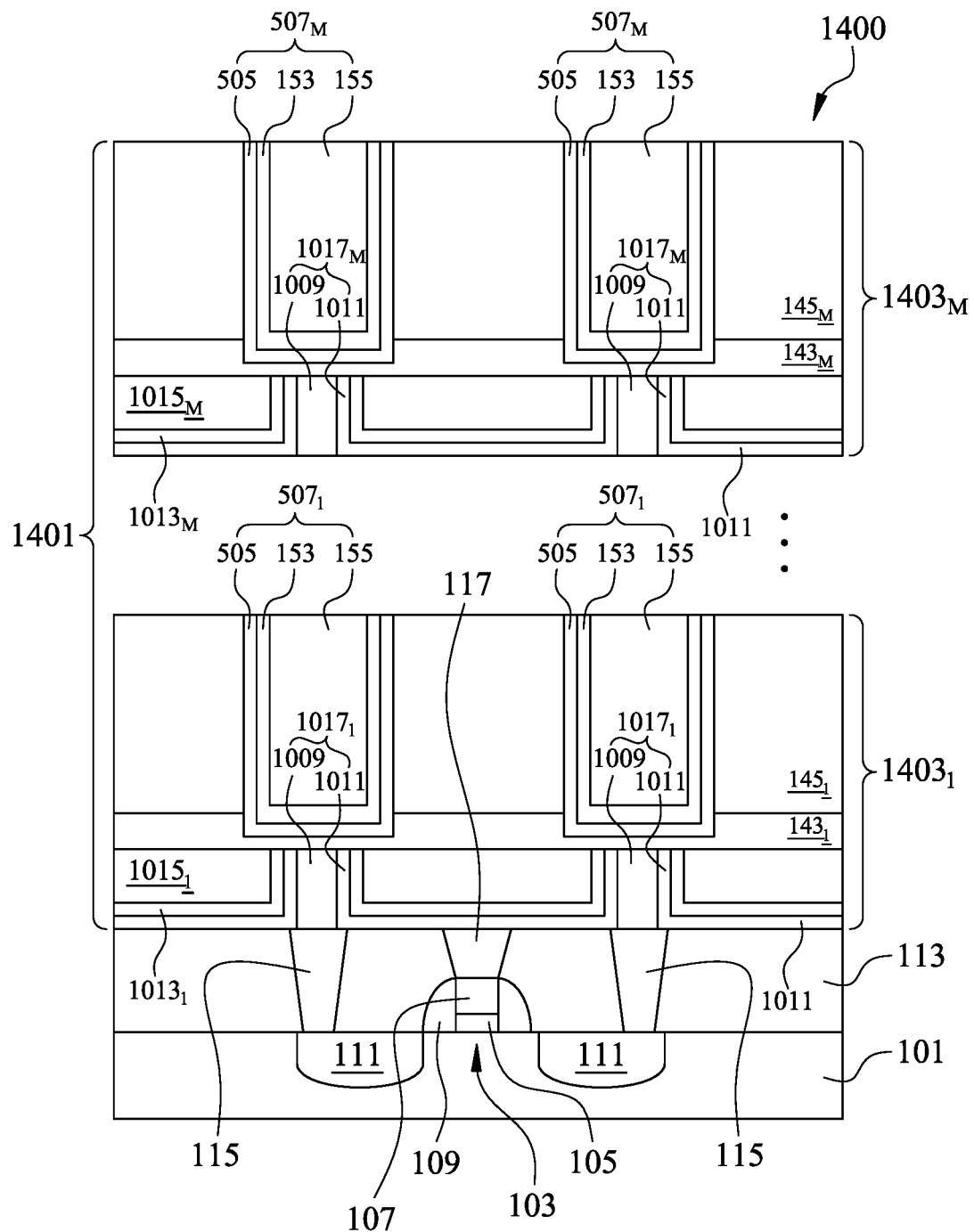

FIGS. 56-58 illustrate cross-sectional views of various intermediate stages of fabrication of a semiconductor device 1400 in accordance with some embodiments. In particular, FIGS. 56-58 illustrate cross-sectional views of various intermediate stages of fabrication of an interconnect structure 1401 (see FIG. 58) over the structure of FIG. 1 in accordance with some embodiments.

Referring to FIG. 56, in some embodiments, the steps for forming the interconnect structure 1401 starts with forming a metallization layer $1403_1$ (see FIG. 57) over the one or more ILD layers 113 and the contact plugs 115 and 117. Process steps for forming the metallization layer $1403_1$ start with forming an IMD layer $1015_1$, a capping layer $1013_1$, and conductive vias $1017_1$ over the one or more ILD layers 113 and the contact plugs 115 and 117. In some embodiments, the IMD layer $1015_1$, the capping layer $1013_1$, and the conductive vias $1017_1$ are formed using process steps described above with reference to FIGS. 45-50, and the description is not repeated herein.

Referring to FIG. 57, after forming the conductive vias $1017_1$, an ESL $141_1$ is formed over the IMD layer $1015_1$ and the conductive vias $1017_1$, and an IMD layer $145_1$ is formed over the ESL $141_1$ as described above with reference to FIG. 12 and the description is not repeated herein. Subsequently, conductive lines $507_1$ are formed in the IMD layer $145_1$ and the ESL $141_1$ as described above with reference to FIGS. 28-32, and the description is not repeated herein. In some embodiments, the conductive lines $507_1$ are in physical contact with respective conductive vias $1017_1$.

Referring to FIG. 58, one or more metallization layers similar to the metallization layer $1403_1$ are formed over the metallization layer $1403_1$ until a metallization layer $1403_M$ is formed. In some embodiments, the metallization layer $1403_M$ is the final metallization layer of the interconnect structure 1401. In some embodiments, M may be between 1 and 12. In some embodiments, the intermediate metallization layers between the metallization layer $1403_1$ and the metallization layer $1403_M$ are formed in a similar manner as the metallization layer $1403_1$ and the description is not repeated herein. In other embodiments, the metallization layer $1403_M$ is not the final metallization layer of the interconnect structure 1401 and additional metallization layers are formed over the metallization layer $1403_M$.

In some embodiments, process steps for forming the metallization layer $1403_M$ start with forming an IMD layer $1015_M$, a capping layer $1013_M$, and conductive vias $1017_M$ over a previous metallization layer. In some embodiments, the IMD layer $1015_M$ is formed using similar materials and methods as the IMD layer $1015_1$ and the description is not repeated herein. In some embodiments, the capping layer $1013_M$ is formed using similar materials and methods as the capping layer $1013_1$ and the description is not repeated herein. In some embodiments, features of the conductive vias $1017_M$ are similar to features of the conductive vias $1017_1$, with similar features being labeled by similar numerical references. In some embodiments, the conductive vias $1017_M$ may be formed using process steps as described above with reference to FIGS. 45-50, and the description is not repeated herein.

In some embodiments, after forming the conductive vias $1017_M$, an ESL $143_M$ is formed over the conductive vias $1017_M$ and the IMD layer $1015_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $507_M$ are formed in the IMD layer $145_M$ and the ESL $143_M$. In some embodiments, features of the conductive lines $507_M$ are similar to features of the conductive lines $507_1$, with similar features being labeled by similar numerical references. In some embodiments, the conductive lines $507_M$ may be formed using process steps as described above with reference to FIGS. 28-32, and the description is not repeated herein.

Figure 59:
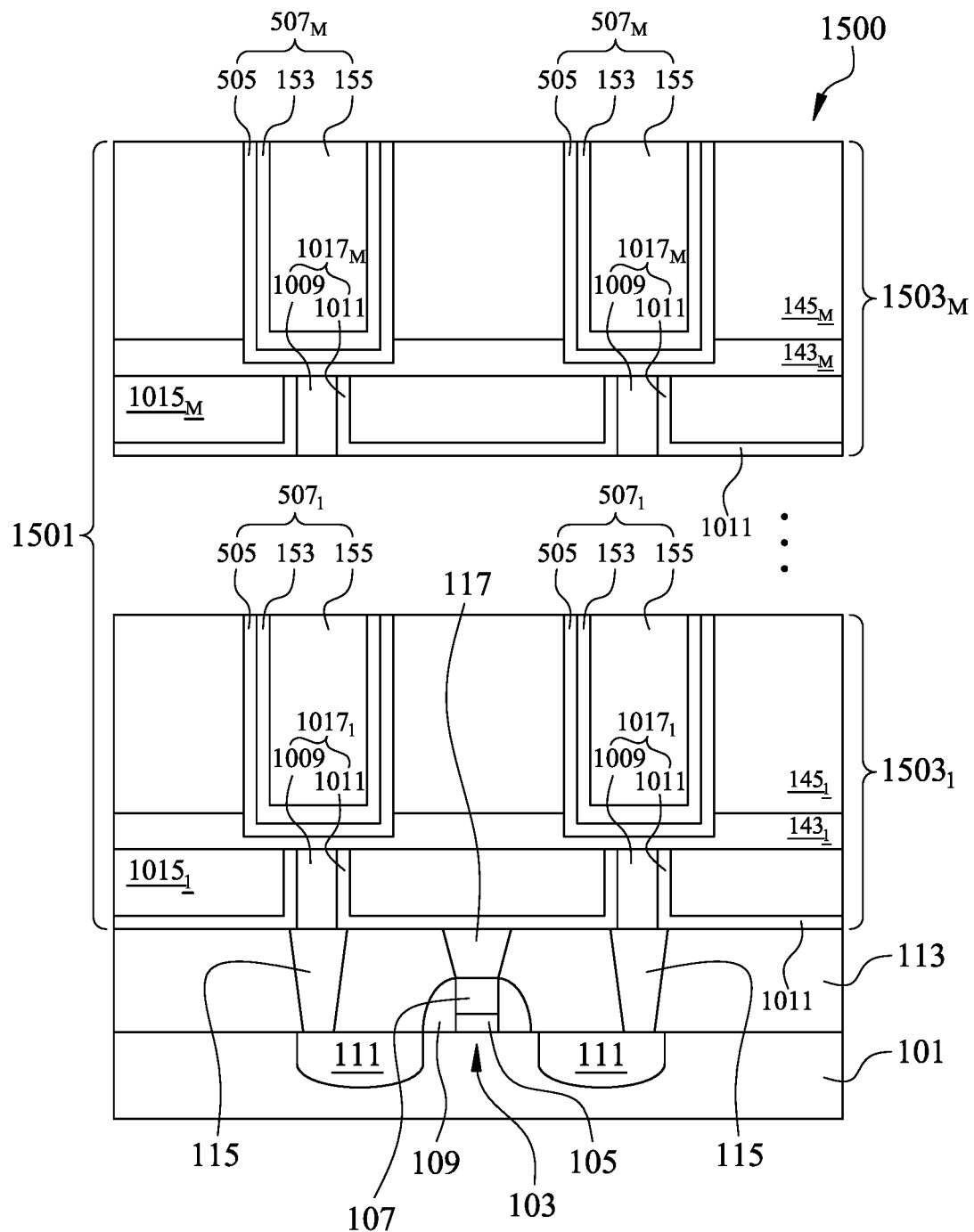
FIG. 59 illustrates a cross-sectional view of a semiconductor device in accordance with some embodiments.

FIG. 59 illustrates a cross-sectional view of a semiconductor device 1500 in accordance with some embodiments. The semiconductor device 1500 is similar to the semiconductor device 1400 (see FIG. 58), with similar features being labeled by similar numerical references. In some embodiments, the interconnect structure 1501 (comprising the metallization layers $1503_1$ to $1503_M$) of the semiconductor device 1500 may be formed using process steps similar to the process steps for forming the interconnect structure 1401 of the semiconductor device 1400 described above with reference to FIGS. 56-58, and the description is not repeated herein. In the illustrated embodiment, the formation of the capping layers $1013_1$ to $1013_M$ (see FIG. 58) is omitted, such that the IMD layers $1015_1$ to $1015_M$ are formed directly over respective barrier/adhesion layers 1011.

Figure 60:
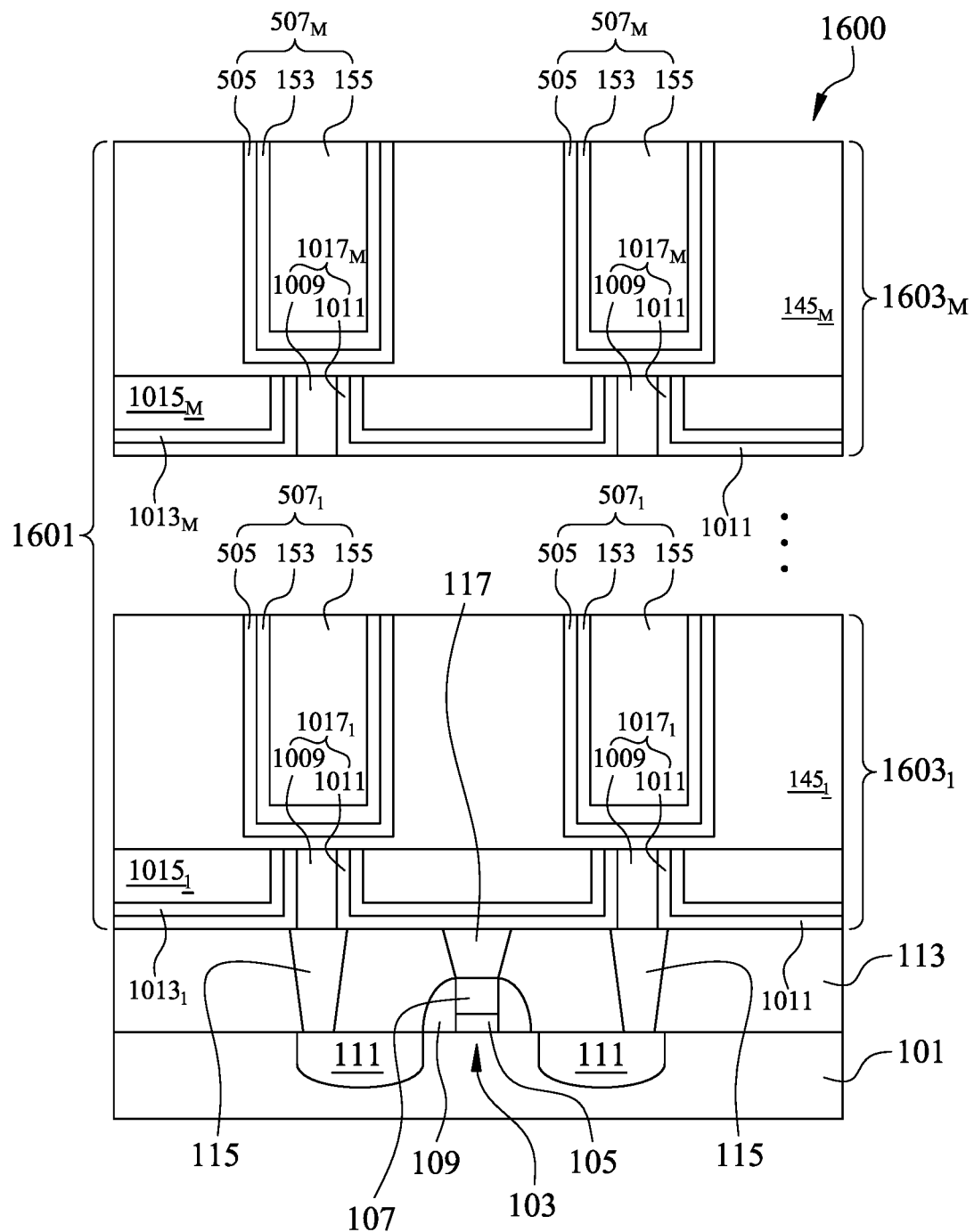
FIG. 60 illustrates a cross-sectional view of a semiconductor device in accordance with some embodiments.

FIG. 60 illustrates a cross-sectional view of a semiconductor device 1600 in accordance with some embodiments. The semiconductor device 1600 is similar to the semiconductor device 1400 (see FIG. 58), with similar features being labeled by similar numerical references. In some embodiments, the interconnect structure 1601 (comprising the metallization layers $1603_1$ to $1603_M$) of the semiconductor device 1600 may be formed using process steps similar to the process steps for forming the interconnect structure 1401 of the semiconductor device 1400 described above with reference to FIGS. 56-58, and the description is not repeated herein. In the illustrated embodiment, the formation of the ESLs $141_1$ to $143_M$ (see FIG. 58) is omitted, such that the IMD layers $145_1$ to $145_M$ are formed directly over the IMD layers $1015_1$ to $1015_M$, respectively.

Figure 61:
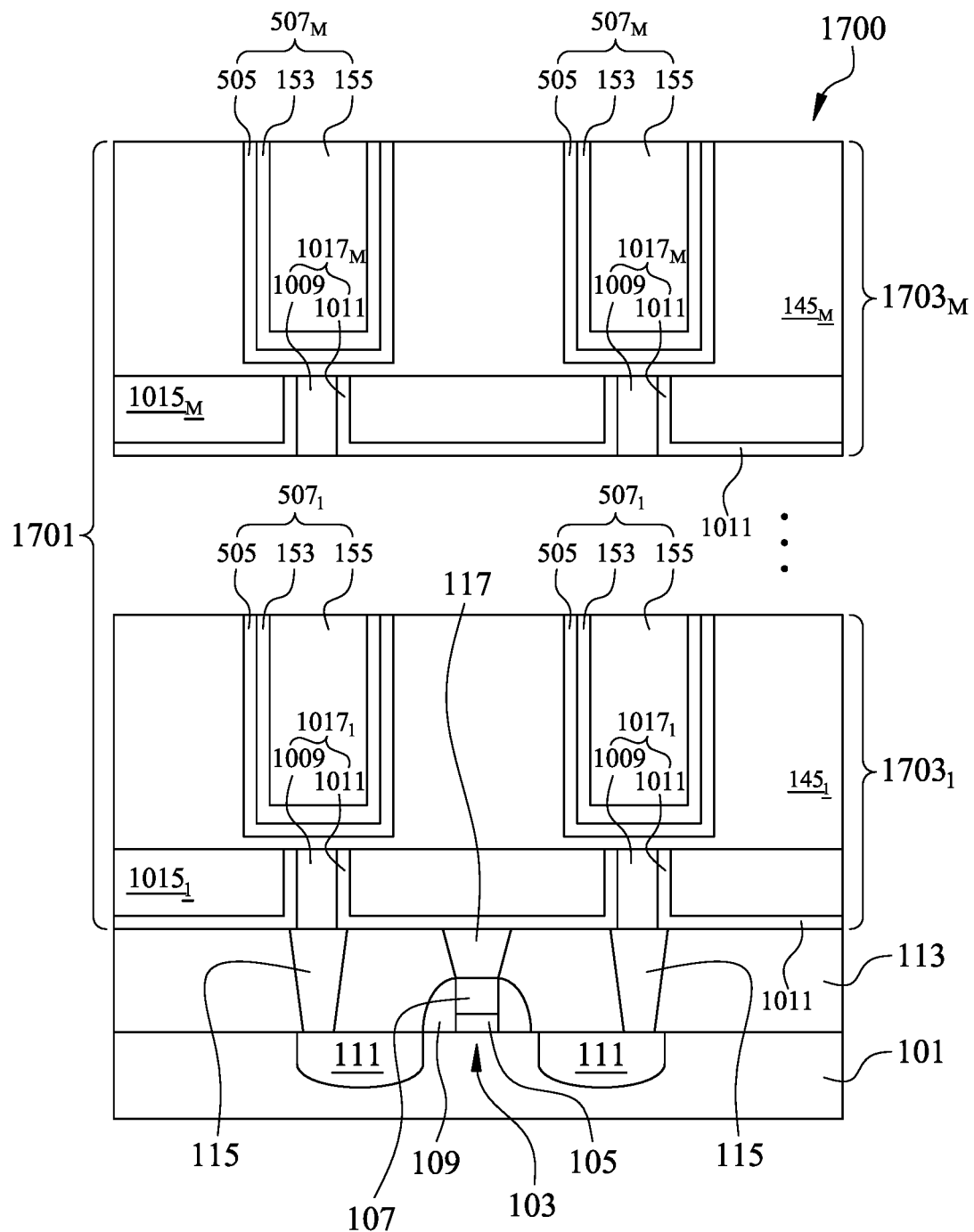
FIG. 61 illustrates a cross-sectional view of a semiconductor device in accordance with some embodiments.

FIG. 61 illustrates a cross-sectional view of a semiconductor device 1700 in accordance with some embodiments. The semiconductor device 1700 is similar to the semiconductor device 1600 (see FIG. 60), with similar features being labeled by similar numerical references. In some embodiments, the interconnect structure 1701 (comprising the metallization layers $1703_1$ to $1703_M$) of the semiconductor device 1700 may be formed using process steps similar to the process steps for forming the interconnect structure 1601 of the semiconductor device 1600 described above with reference to FIG. 60 and the description is not repeated herein. In the illustrated embodiment, the formation of the capping layers $1013_1$ to $1013_M$ (see FIG. 60) is omitted, such that the IMD layers $1015_1$ to $1015_M$ are formed directly over respective barrier/adhesion layers 1011.

FIGS. 62, 63, 65-67, and 69-75 illustrate cross-sectional views of various intermediate stages of fabrication of a semiconductor device 1800 in accordance with some embodiments. In particular, FIGS. 62, 63, 65-67, and 69-75 illustrate cross-sectional views of various intermediate stages of fabrication of an interconnect structure 1801 (see FIG. 75) over the structure of FIG. 1 in accordance with some embodiments.

Figure 62:
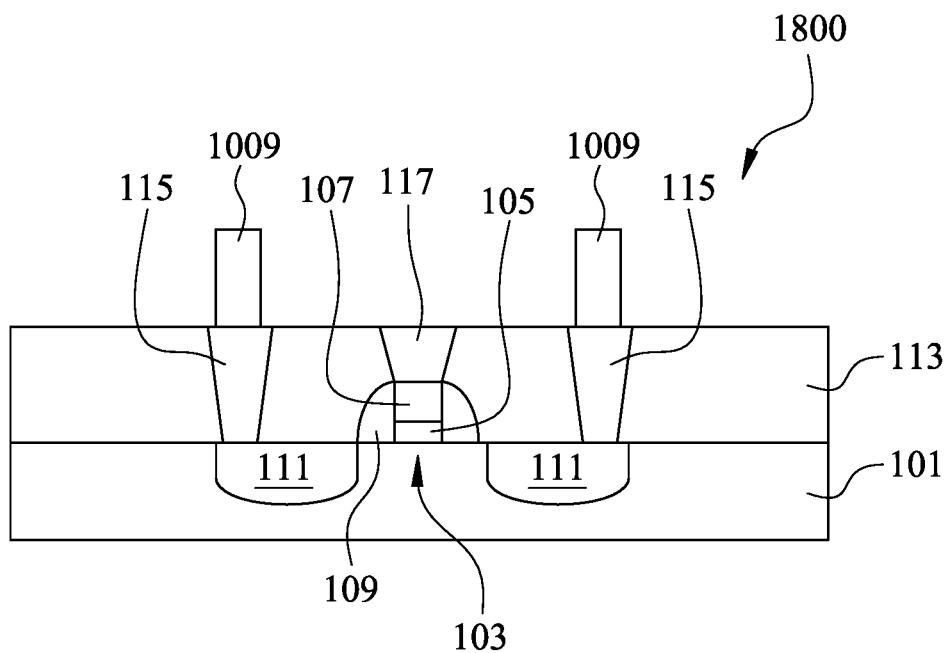
FIGS. 62, 63, 65-67, and 69-75 illustrate cross-sectional views of various intermediate stages of fabrication of a semiconductor device in accordance with some embodiments.

Referring to FIG. 62, in some embodiments, the steps for forming the interconnect structure 1801 starts with forming a metallization layer $1803_1$ (see FIG. 74) over the one or more ILD layers 113 and the contact plugs 115 and 117. Process steps for forming the metallization layer $1803_1$ start with forming conductive columns 1009 over respective contact plugs 115 as described above with reference to FIGS. 45-47, and the description is not repeated herein.

Figure 63:
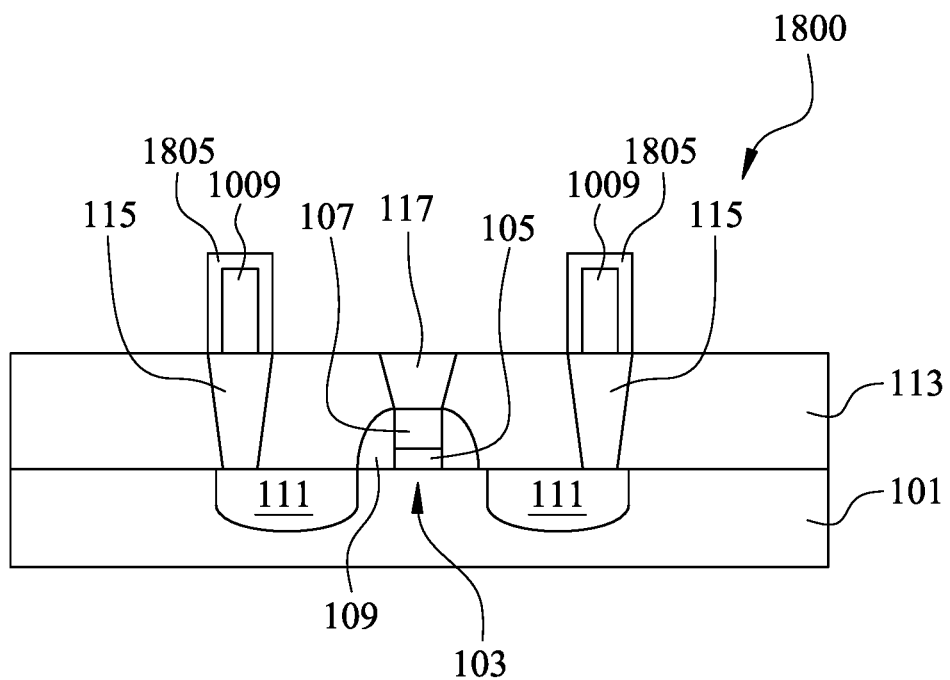

Referring to FIG. 63, a barrier/adhesion layer 1805 is formed along sidewalls and a top surface of each of the conductive columns 1009. The barrier/adhesion layers 1805 may be formed using similar materials as the barrier/adhesion layer 129 described above with reference to FIGS. 3-6, and the description is not repeated herein. In some embodiments, the barrier/adhesion layers 1805 have a thickness between about 0.5 nm and about 5 nm.

Figure 64:
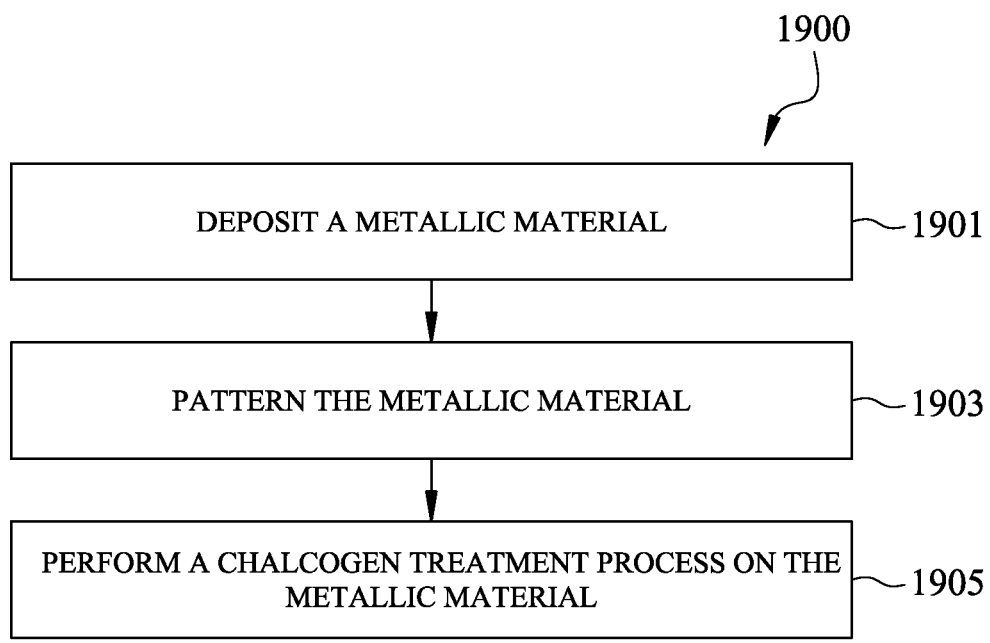
FIG. 64 is a flow diagram illustrating a method of forming a barrier/adhesion layer in accordance with some embodiments.
Figure 65:
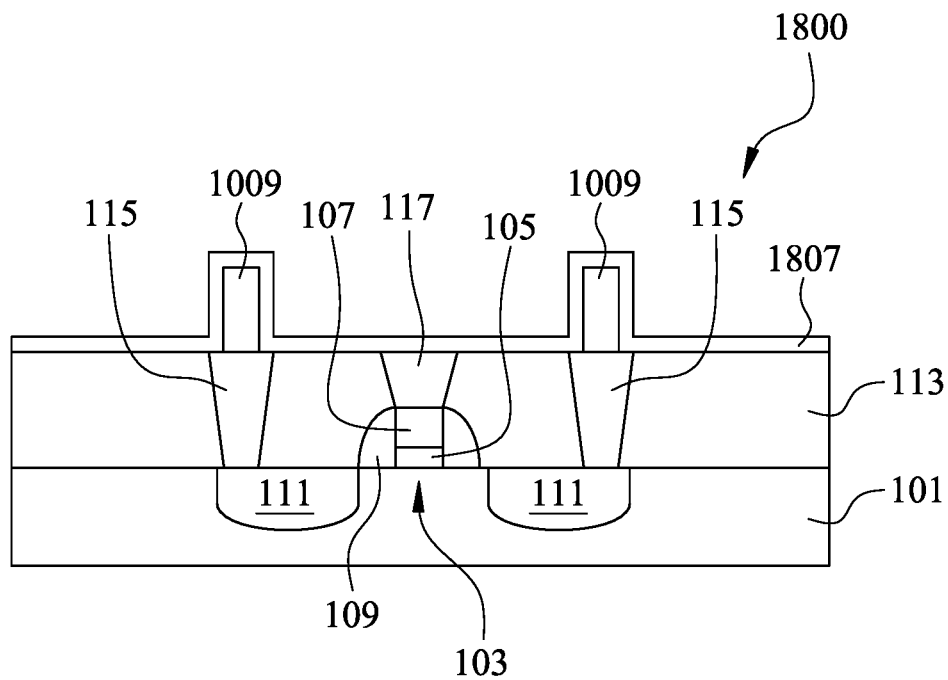
Figure 66:
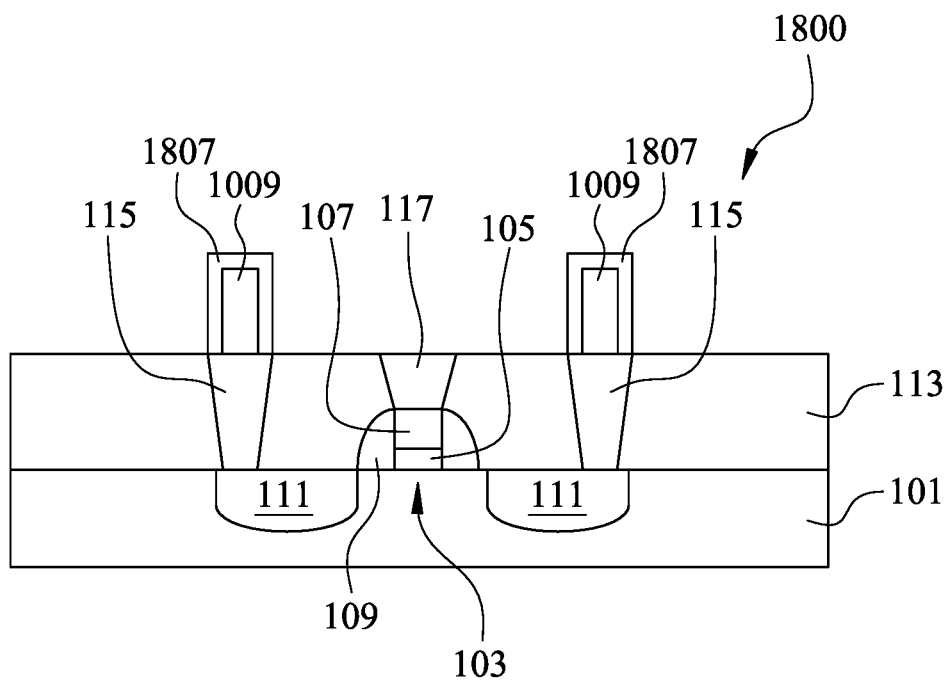
Figure 67:
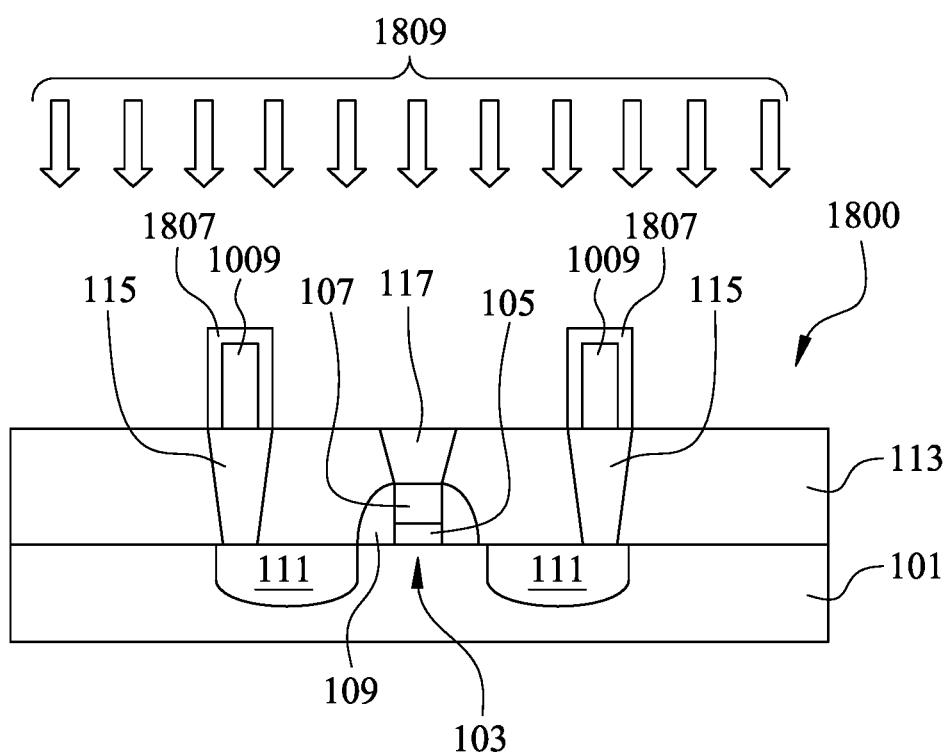

FIG. 64 is a flow diagram illustrating a method 1900 of forming the barrier/adhesion layers 1805 (see FIG. 63) in accordance with some embodiments. FIGS. 65-67 illustrate cross-sectional views of various intermediate stages of fabrication of the barrier/adhesion layers 1805 in accordance with the method 1900. Referring to FIGS. 64 and 65, in step

1901, a metallic material 1807 is deposited over the one or more ILD layers 113 and along the sidewalls and top surfaces of the conductive columns 1009. The metallic material 1807 may be formed using similar materials and methods as the metallic material 133 described above with reference to FIG. 5 and the description is not repeated herein.

Referring to FIGS. 64 and 66, in step 1903, the metallic material 1807 is patterned to remove portions of the metallic material 1807 that are in physical contact with the one or more ILD layers 113 and the contact plugs 115 and 117, such that remaining portions of the metallic material 1807 extend along the sidewalls and top surfaces of the conductive columns 1009. In some embodiments, the patterning process may comprise suitable photolithography and etch processes. The suitable etch process may comprise a dry etch process, a wet etch process, a combination thereof, or the like.

Referring to FIGS. 64 and 67, in step 1905, a chalcogen treatment process 1809 is performed on remaining portions of the metallic material 1807 to form the barrier/adhesion layers 1805 (see FIG. 63). In some embodiments, the chalcogen treatment process 1809 is similar to the chalcogen treatment process 135 described above with reference to FIG. 6 and the description is not repeated herein.

Figure 68:
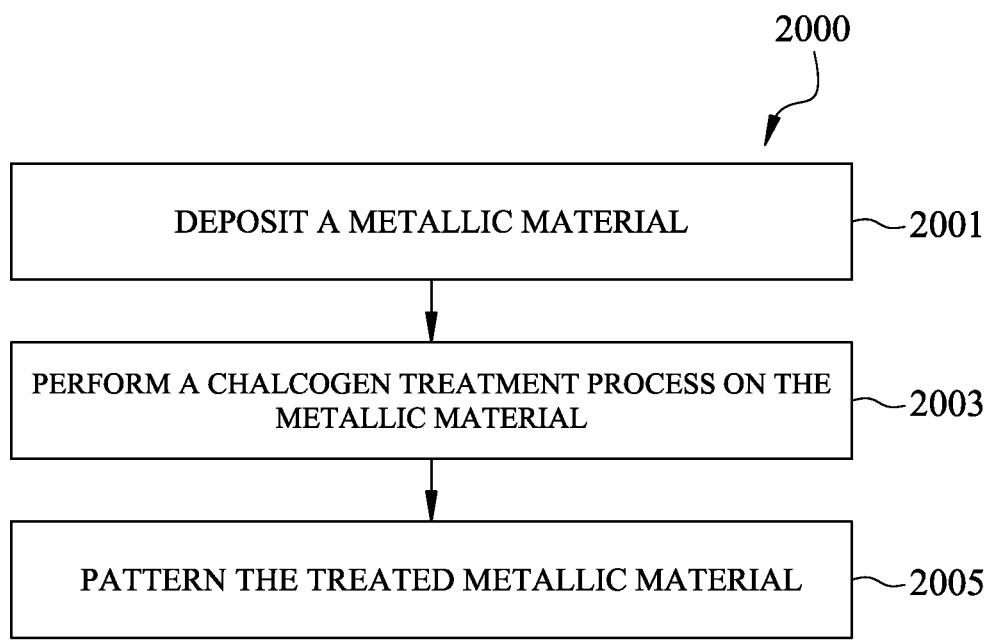
FIG. 68 is a flow diagram illustrating a method of forming a barrier/adhesion layer in accordance with some embodiments.
Figure 69:
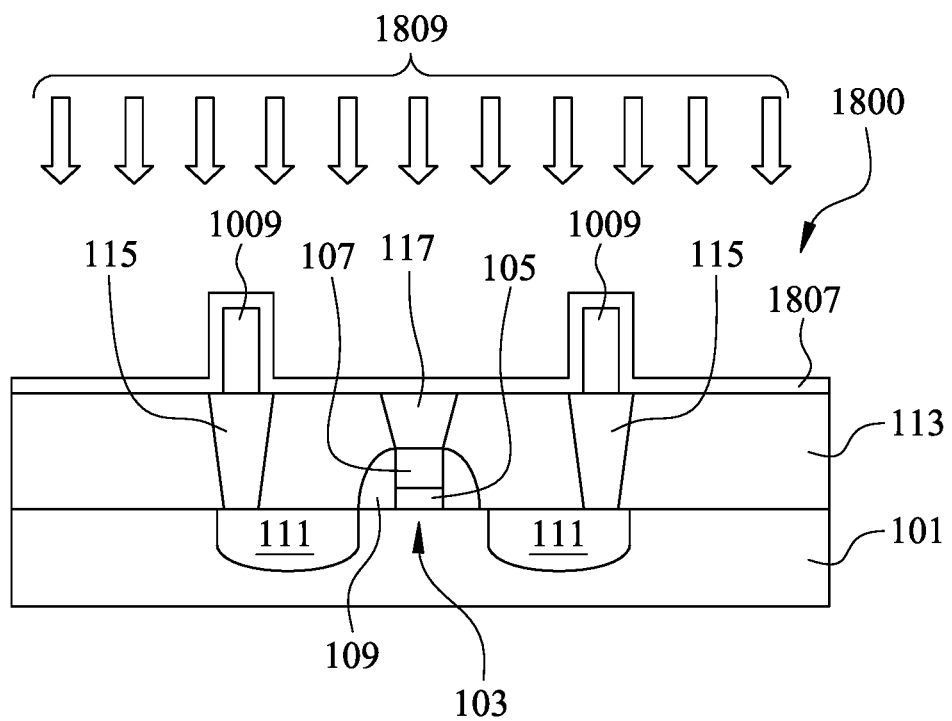
Figure 70:
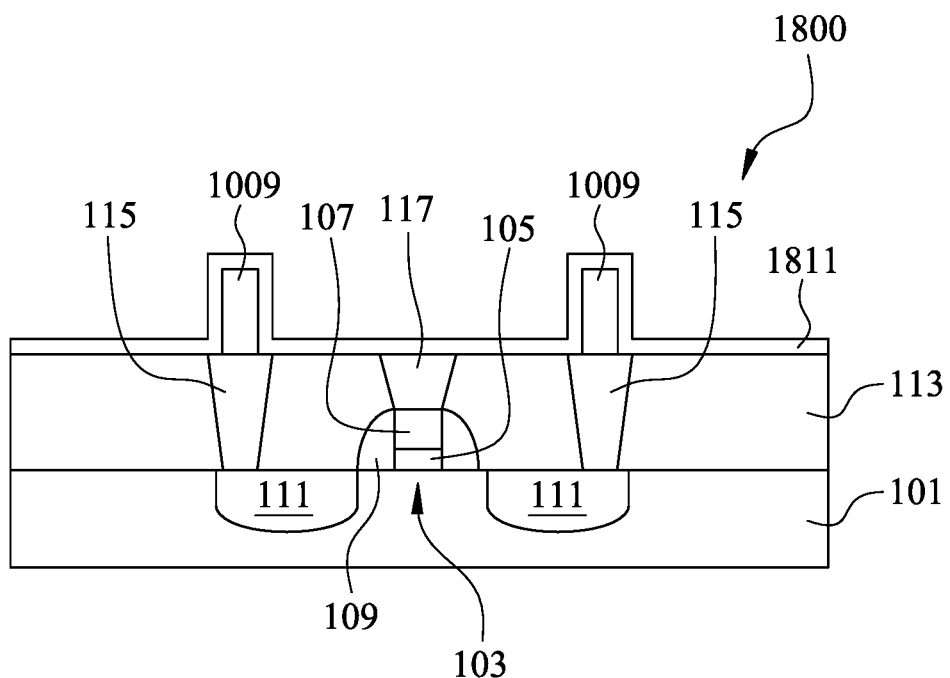
Figure 71:
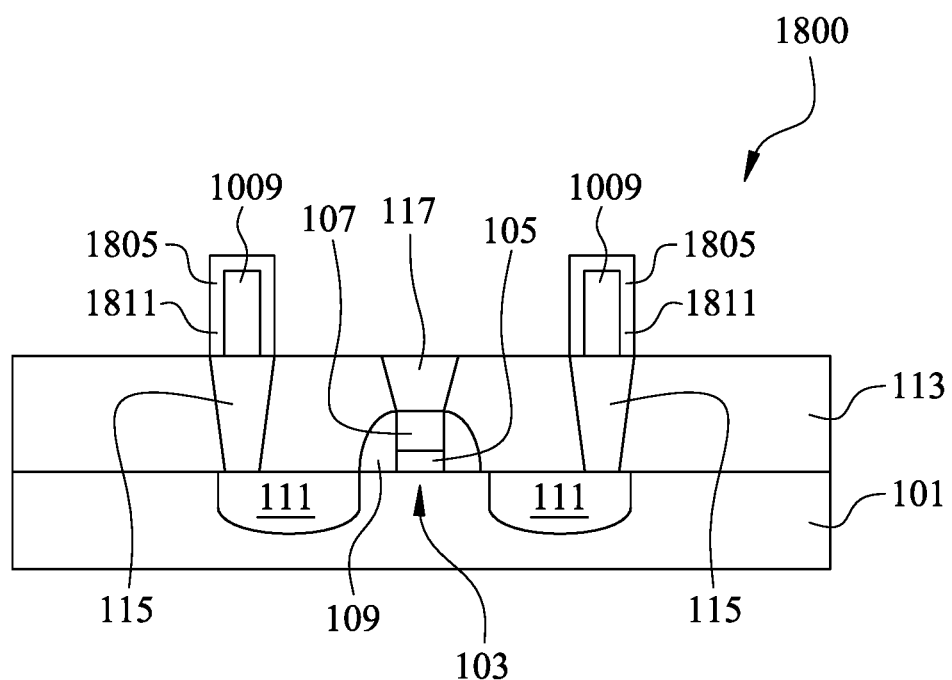

FIG. 68 is a flow diagram illustrating a method 2000 of forming the barrier/adhesion layers 1805 (see FIG. 63) in accordance with some embodiments. FIGS. 69-71 illustrate cross-sectional views of various intermediate stages of fabrication of the barrier/adhesion layers 1805 in accordance with the method 2000. Referring to FIGS. 68 and 69, in step 2001, a metallic material 1807 is deposited over the one or more ILD layers 113 and along the sidewalls and top surfaces of the conductive columns 1009. The metallic material 1807 may be formed using similar materials and methods as the metallic material 133 described above with reference to FIG. 5 and the description is not repeated herein.

Referring to FIGS. 68 and 70, in step 2003, a chalcogen treatment process 1809 is performed on remaining portions of the metallic material 1807 to form a treated metallic material 1811. In some embodiments, the chalcogen treatment process 1809 is similar to the chalcogen treatment process 135 described above with reference to FIG. 6 and the description is not repeated herein. In alternative embodiments, the layer 1811 is formed using a single-step process such as ALD, CVD, or the like. In such embodiments, ALD or CVD may be performed using a suitable metal-containing precursor and a suitable chalcogen-containing precursor.

Referring to FIGS. 68 and 71, in step 2005, the treated metallic material 1811 is patterned to remove portions of the treated metallic material 1811 that are in physical contact with the one or more ILD layers 113 and the contact plugs 115 and 117, such that remaining portions of the treated metallic material 1811 extend along the sidewalls and top surfaces of the conductive columns 1009 and form the barrier/adhesion layers 1805. In some embodiments, the patterning process may comprise suitable photolithography and etch processes. The suitable etch process may comprise a dry etch process, a wet etch process, a combination thereof, or the like.

Figure 72:
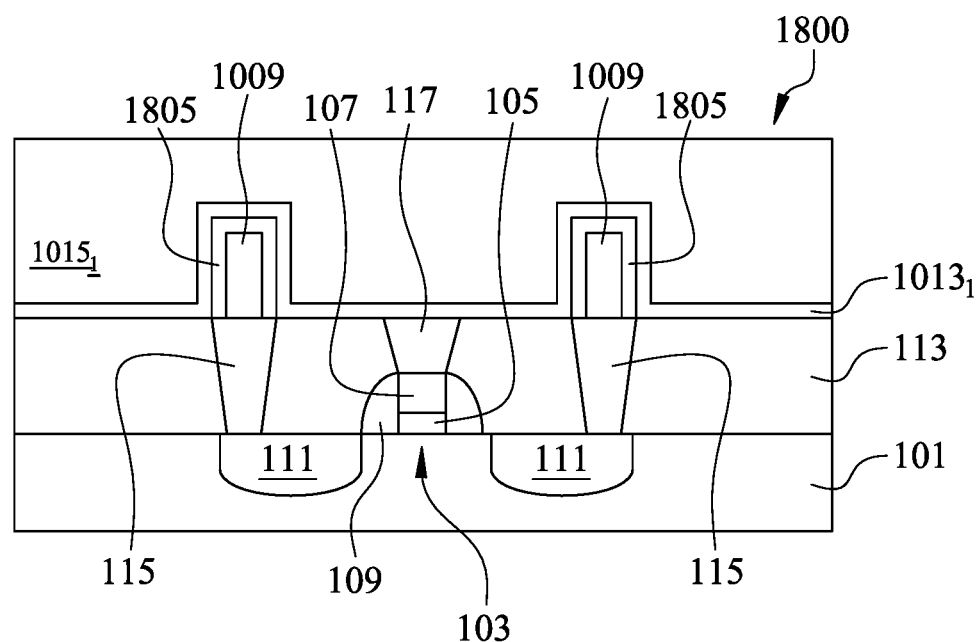

Referring to FIG. 72, after forming the barrier/adhesion layers 1805, a capping layer 1013$_1$ is formed over the barrier/adhesion layers 1805 and over the one or more ILD layers 113 and the contact plugs 115 and 117 as described above with reference to FIG. 49 and the description is not repeated herein. In the illustrated embodiment, the capping layer 1013$_1$ is formed having a thickness such that the capping layer 1013$_1$ partially fills gaps between adjacent conductive columns 1009. Subsequently, an IMD layer 1015$_1$ is formed over the capping layer 1013$_1$ as described above with reference to FIG. 49 and the description is not repeated herein. In the illustrated embodiment, the IMD layer 1015$_1$ is formed having a thickness such that the IMD layer 1015$_1$ overfills the gaps between adjacent conductive columns 1009.

Figure 73:
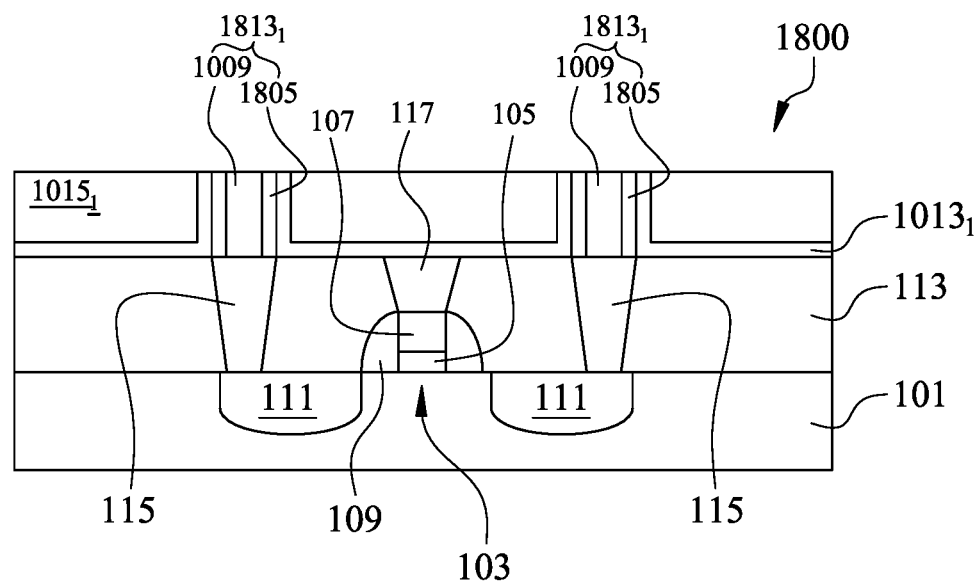

Referring to FIG. 73, portions of the barrier/adhesion layers 1805, the capping layer 1013$_1$, and the IMD layer 1015$_1$ extending above top surfaces of the conductive columns 1009 are removed to expose the top surfaces of the conductive columns 1009. In some embodiments, the removal process may also remove portions of the conductive columns 1009. The removal process may be a planarization process comprising a CMP process, a grinding process, an etching process, a combination thereof, or the like. The remaining portions of the conductive columns 1009 and respective barrier/adhesion layers 1805 form conductive vias 1813$_1$. In some embodiments, after performing the planarization process, top surfaces of the conductive vias 1813$_1$ are substantially coplanar or level with a top surface of the capping layer 1013$_1$ and a top surface of the IMD layer 1015$_1$ within process variations of the planarization process.

Figure 74:
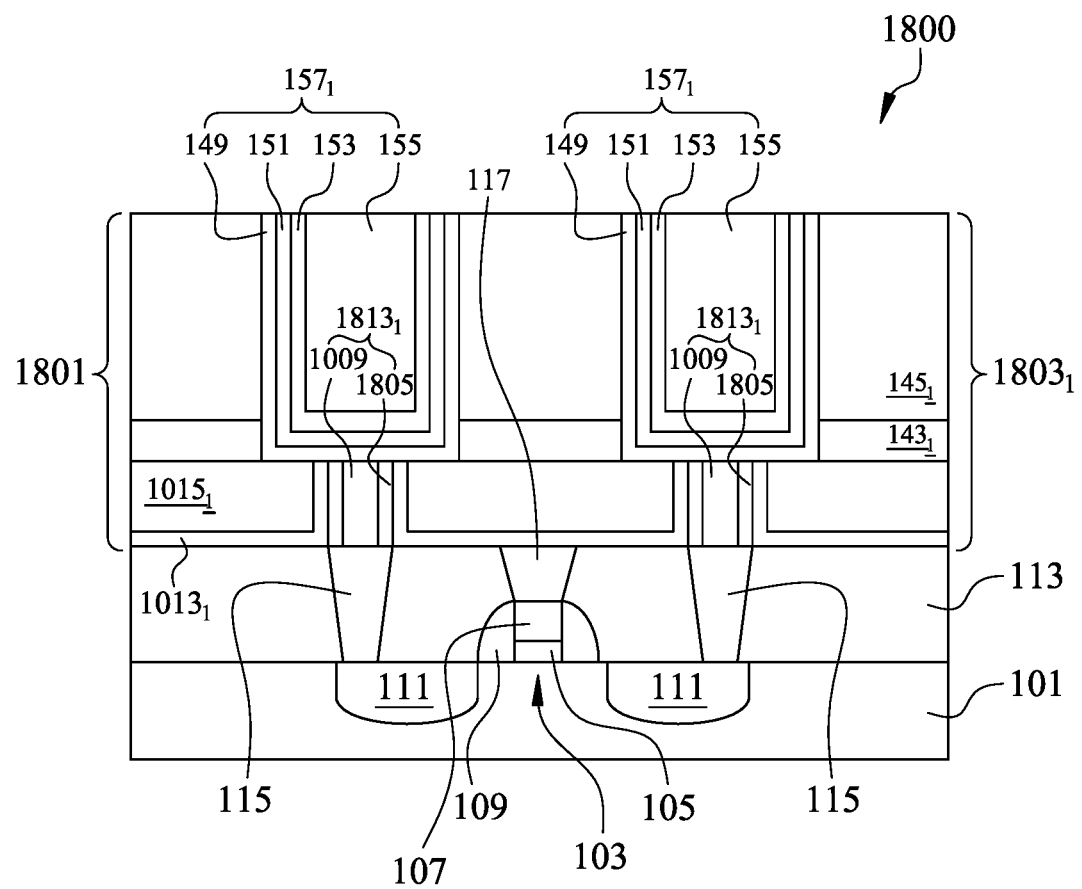

Referring to FIG. 74, after performing the planarization process, an ESL 141$_1$ is formed over the IMD layer 1015$_1$ and the conductive vias 1813$_1$, and an IMD layer 145$_1$ is formed over the ESL 141$_1$ as described above with reference to FIG. 12 and the description is not repeated herein. Subsequently, conductive lines 157$_1$ are formed in the IMD layer 145$_1$ and the ESL 141$_1$ as described above with reference to FIGS. 12-16 and the description is not repeated herein. In some embodiments, the conductive lines 157$_1$ are in physical contact with respective conductive vias 1813$_1$.

Figure 75:
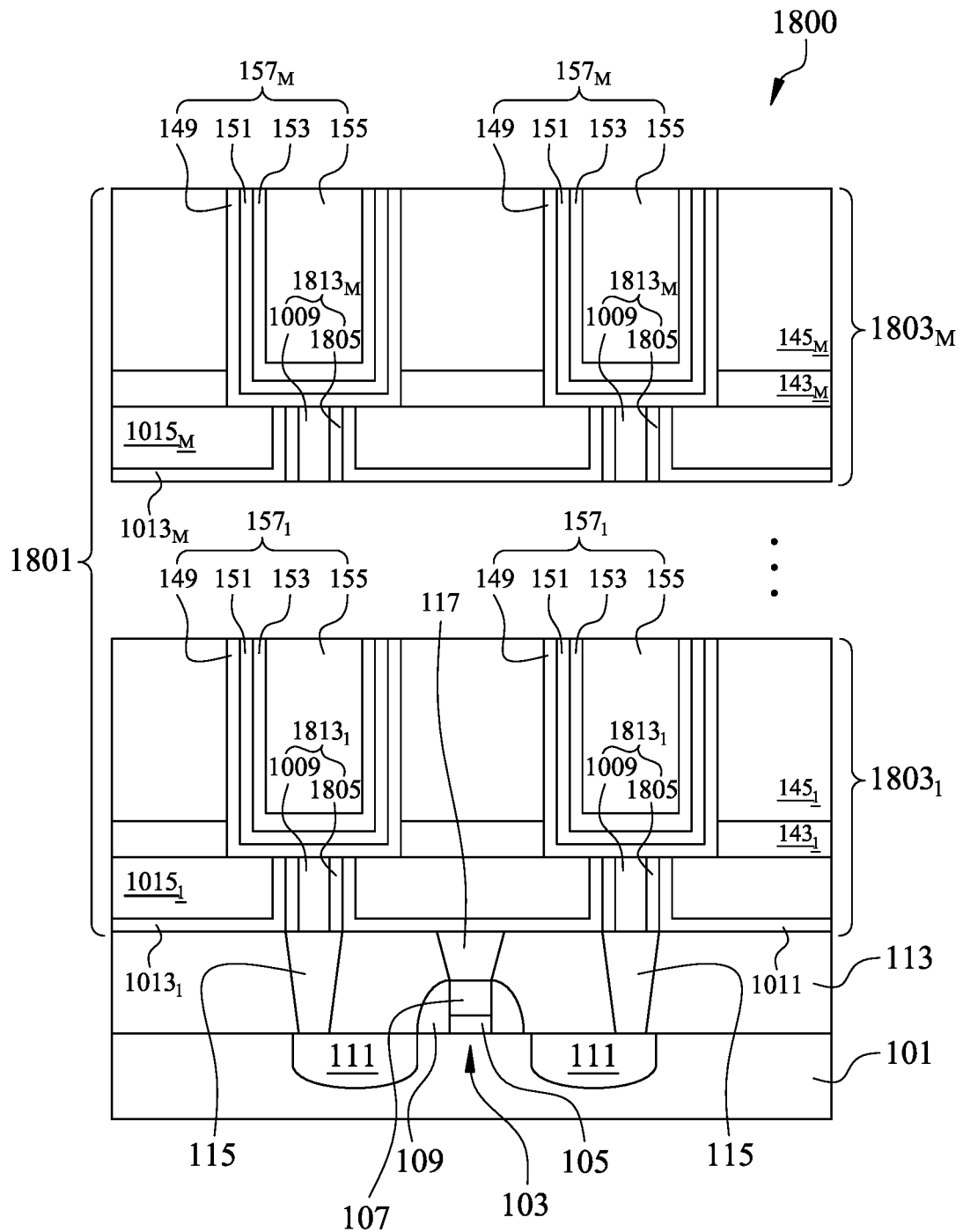

Referring to FIG. 75, one or more metallization layers similar to the metallization layer 1803$_1$ are formed over the metallization layer 1803$_1$ until a metallization layer 1803$_M$ is formed. In some embodiments, the metallization layer 1803$_M$ is the final metallization layer of the interconnect structure 1801. In some embodiments, M may be between 1 and 12. In some embodiments, the intermediate metallization layers between the metallization layer 1803$_1$ and the metallization layer 1803$_M$ are formed in a similar manner as the metallization layer 1803$_1$ and the description is not repeated herein. In other embodiments, the metallization layer 1803$_M$ is not the final metallization layer of the interconnect structure 1801 and additional metallization layers are formed over the metallization layer 1803$_M$.

In some embodiments, process steps for forming the metallization layer 1803$_M$ start with forming an IMD layer 1015$_M$, a capping layer 1013$_M$, and conductive vias 1813$_M$ over a previous metallization layer. In some embodiments, the IMD layer 1015$_M$ is formed using similar materials and methods as the IMD layer 1015$_1$ and the description is not repeated herein. In some embodiments, the capping layer 1013$_M$ is formed using similar materials and methods as the capping layer 1013$_1$ and the description is not repeated herein. In some embodiments, features of the conductive vias 1813$_M$ are similar to features of the conductive vias 1813$_1$, with similar features being labeled by similar numerical references. In some embodiments, the conductive vias 1813$_M$ may be formed using process steps as described above with reference to FIGS. 62-73, and the description is not repeated herein.

In some embodiments, after forming the conductive vias 1813$_M$, an ESL 143$_M$ is formed over the conductive vias $1813_M$ and the IMD layer $1015_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $157_M$ are formed in the IMD layer $145_M$ and the ESL $143_M$. In some embodiments, features of the conductive lines $157_M$ are similar to features of the conductive lines $157_1$, with similar features being labeled by similar numerical references. In some embodiments, the conductive lines $157_M$ may be formed using process steps as described above with reference to FIGS. 12-16, and the description is not repeated herein.

Figure 76:
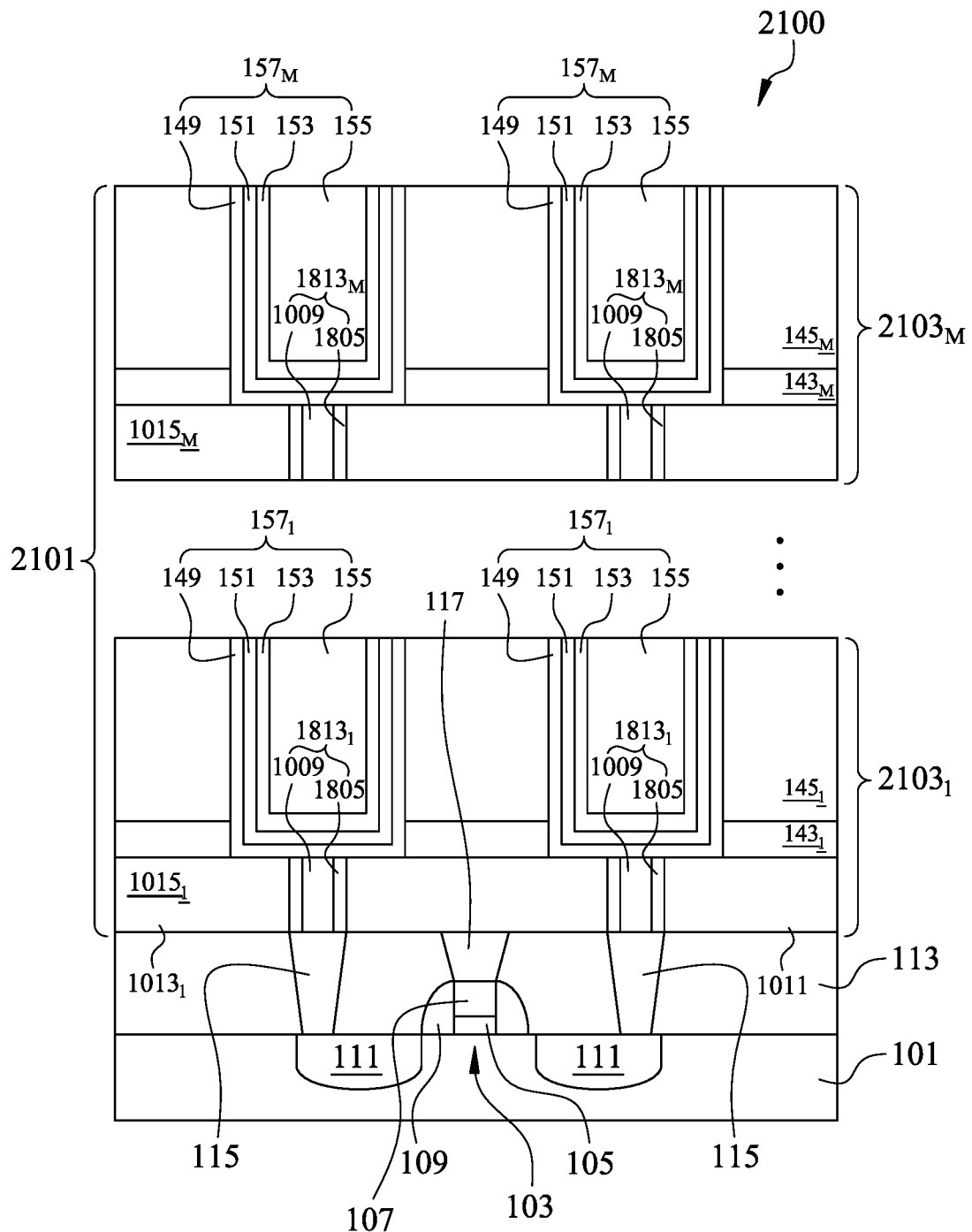
FIG. 76 illustrates a cross-sectional view of a semiconductor device in accordance with some embodiments.

FIG. 76 illustrates a cross-sectional view of a semiconductor device 2100 in accordance with some embodiments. The semiconductor device 2100 is similar to the semiconductor device 1800 (see FIG. 75), with similar features being labeled by similar numerical references. In some embodiments, the interconnect structure 2101 (comprising the metallization layers $2103_1$ to $2103_M$) of the semiconductor device 2100 may be formed using process steps similar to the process steps for forming the interconnect structure 1801 of the semiconductor device 1800 described above with reference to FIGS. 62-75, and the description is not repeated herein. In the illustrated embodiment, the formation of the capping layers $1013_1$ to $1013_M$ (see FIG. 75) is omitted, such that the IMD layers $1015_1$ to $1015_M$ are formed directly over respective barrier/adhesion layers 1805.

Figure 77:
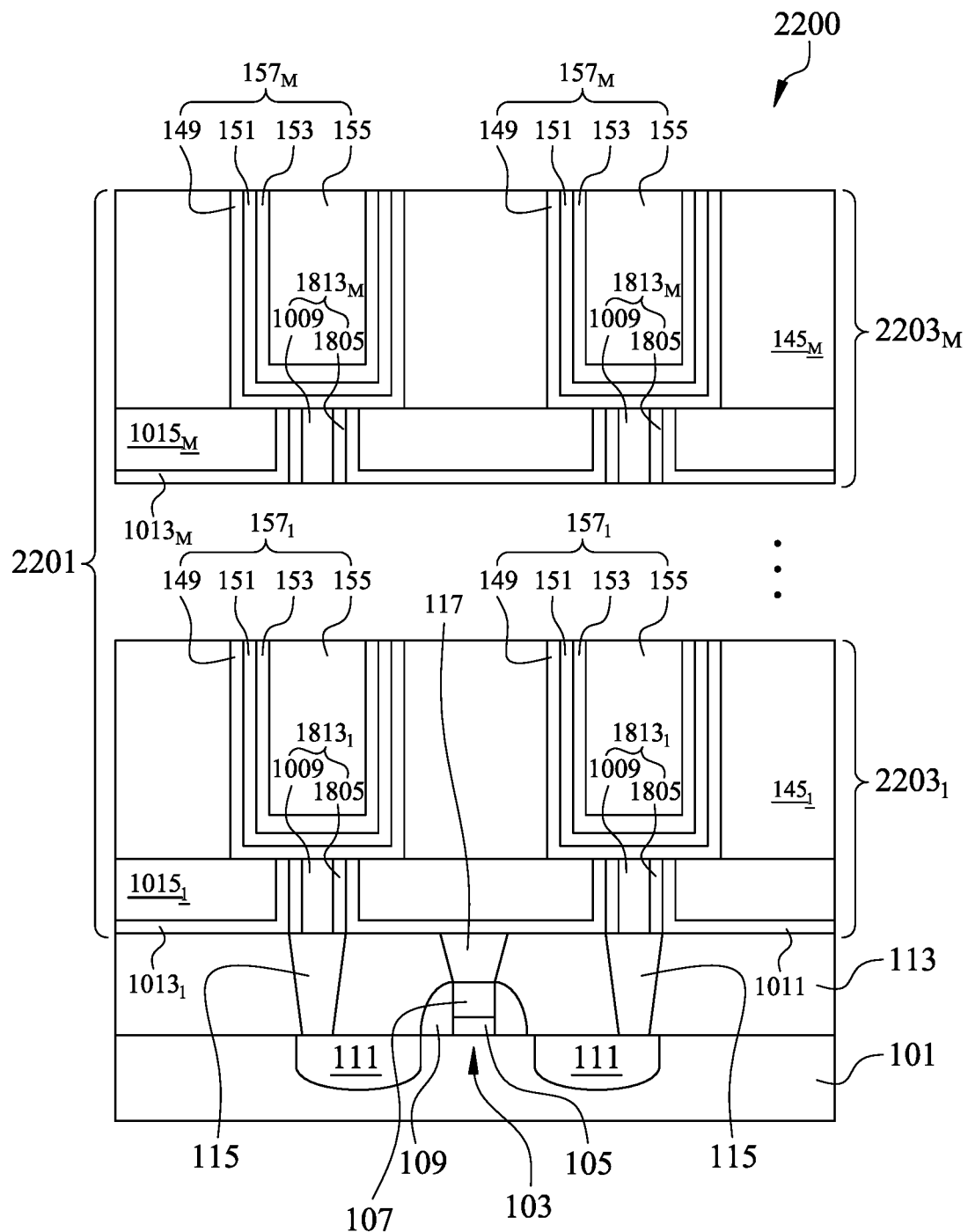
FIG. 77 illustrates a cross-sectional view of a semiconductor device in accordance with some embodiments.

FIG. 77 illustrates a cross-sectional view of a semiconductor device 2200 in accordance with some embodiments. The semiconductor device 2200 is similar to the semiconductor device 1800 (see FIG. 75), with similar features being labeled by similar numerical references. In some embodiments, the interconnect structure 2201 (comprising the metallization layers $2203_1$ to $2203_M$) of the semiconductor device 2200 may be formed using process steps similar to the process steps for forming the interconnect structure 1801 of the semiconductor device 1800 described above with reference to FIGS. 62-75, and the description is not repeated herein. In the illustrated embodiment, the formation of the ESLs $141_1$ to $143_M$ (see FIG. 75) is omitted, such that the IMD layers $145_1$ to $145_M$ are formed directly over the IMD layers $1015_1$ to $1015_M$, respectively.

Figure 78:
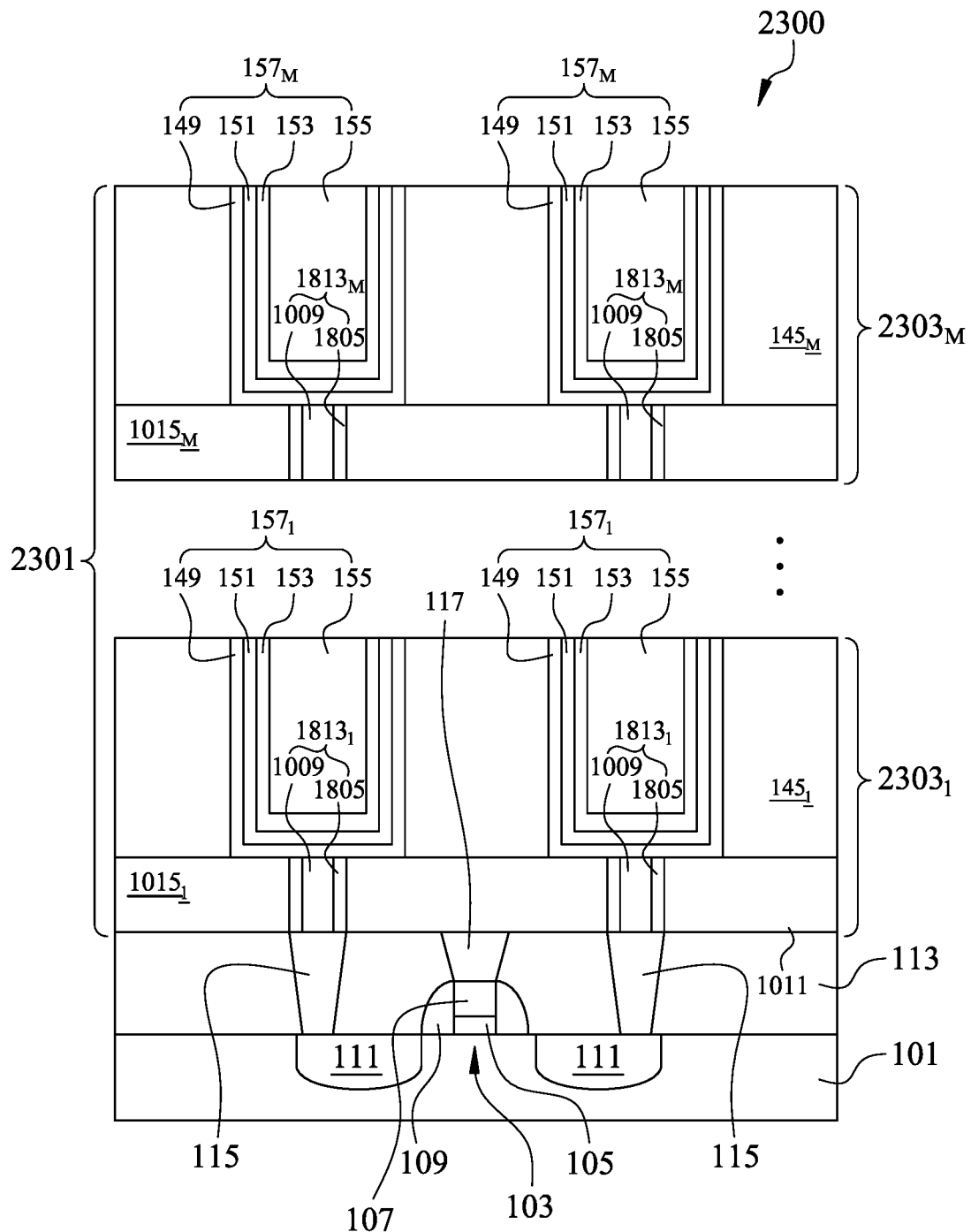
FIG. 78 illustrates a cross-sectional view of a semiconductor device in accordance with some embodiments.

FIG. 78 illustrates a cross-sectional view of a semiconductor device 2300 in accordance with some embodiments. The semiconductor device 2300 is similar to the semiconductor device 2200 (see FIG. 77), with similar features being labeled by similar numerical references. In some embodiments, the interconnect structure 2301 (comprising the metallization layers $2303_1$ to $2303_M$) of the semiconductor device 2300 may be formed using process steps similar to the process steps for forming the interconnect structure 2201 of the semiconductor device 2200 described above with reference to FIG. 77 and the description is not repeated herein. In the illustrated embodiment, the formation of the capping layers $1013_1$ to $1013_M$ (see FIG. 77) is omitted, such that the IMD layers $1015_1$ to $1015_M$ are formed directly over respective barrier/adhesion layers 1805.

Figure 79:
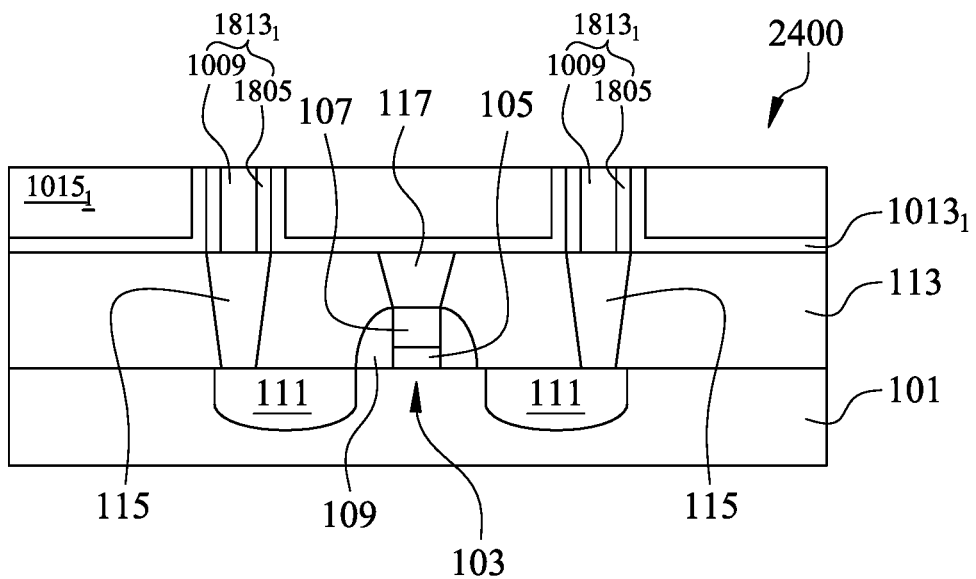
FIGS. 79-81 illustrate cross-sectional views of various intermediate stages of fabrication of a semiconductor device in accordance with some embodiments.
Figure 80:
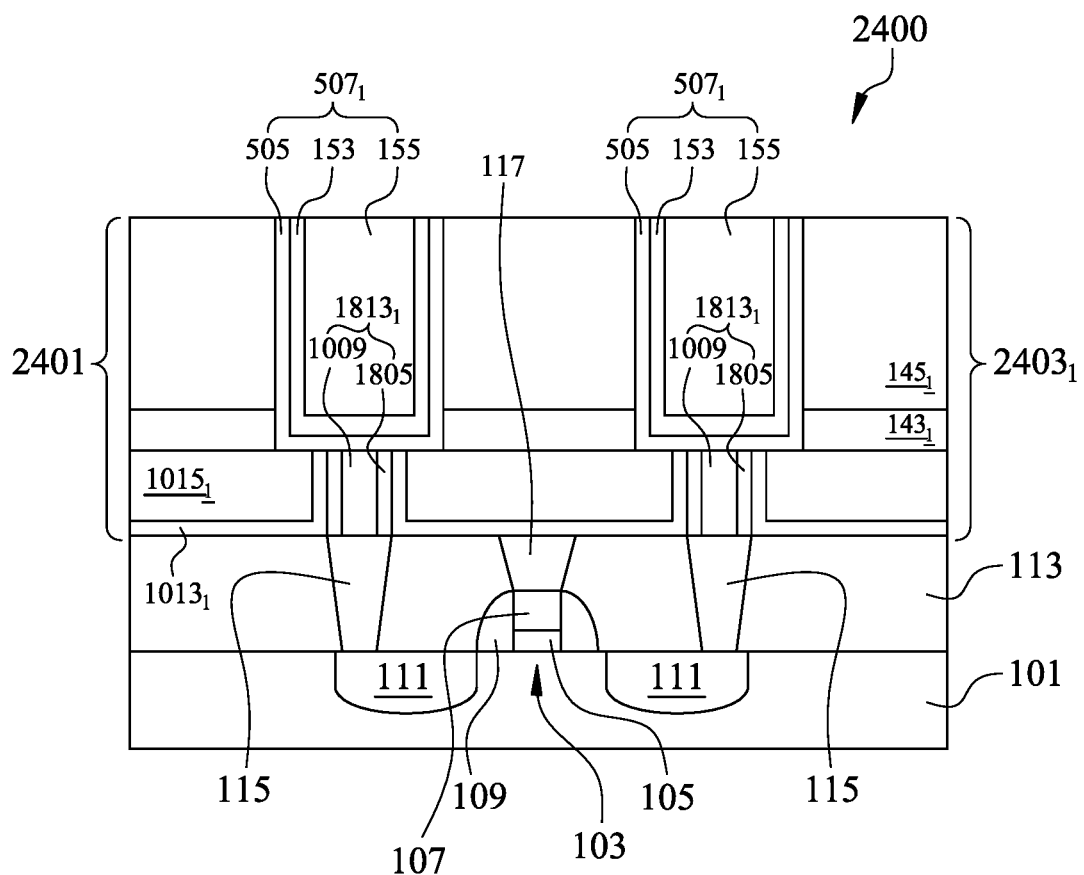
Figure 81:
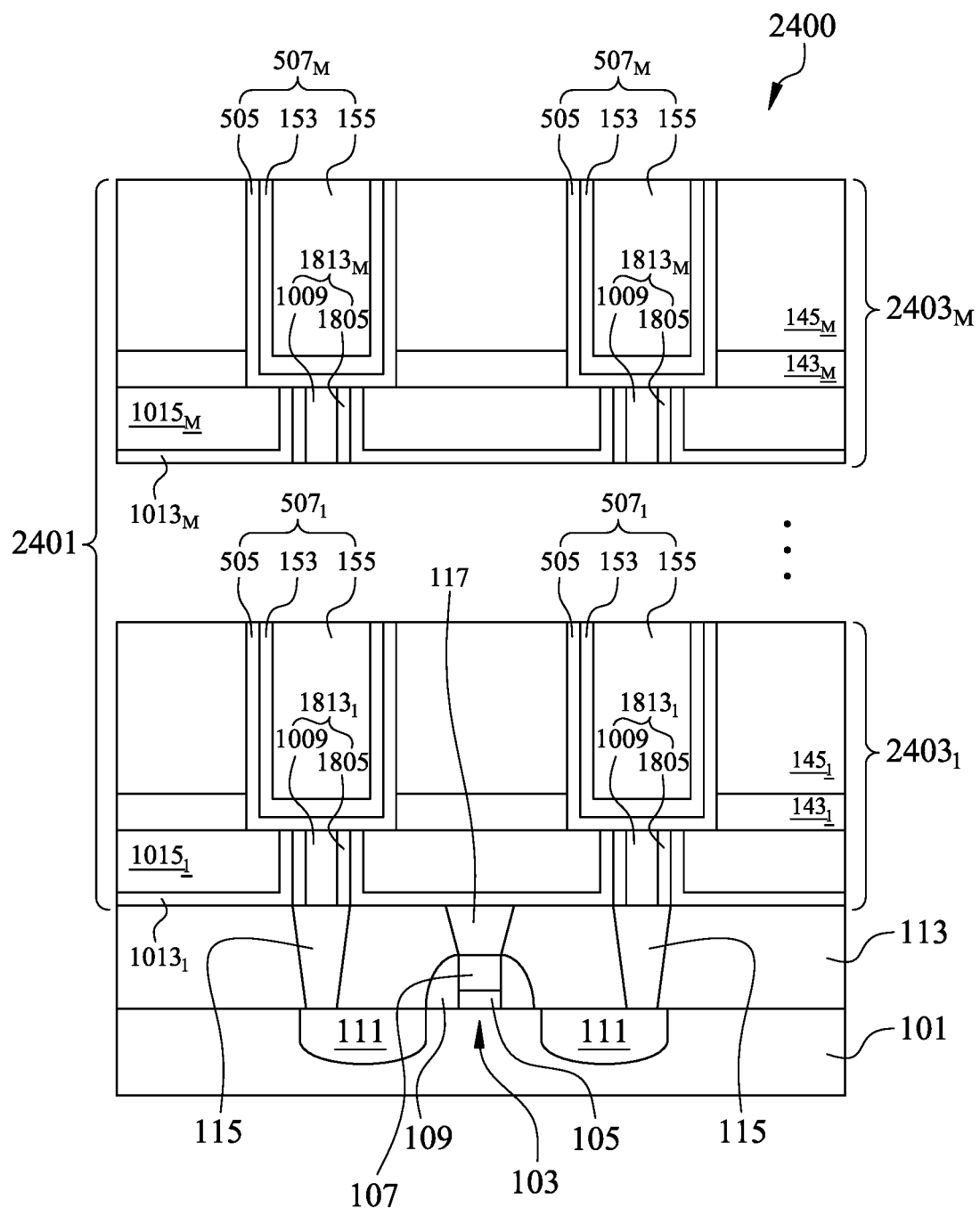

FIGS. 79-81 illustrate cross-sectional views of various intermediate stages of fabrication of a semiconductor device 2400 in accordance with some embodiments. In particular, FIGS. 79-81 illustrate cross-sectional views of various intermediate stages of fabrication of an interconnect structure 2401 (see FIG. 81) over the structure of FIG. 1 in accordance with some embodiments.

Referring to FIG. 79, in some embodiments, the steps for forming the interconnect structure 2401 starts with forming a metallization layer $2403_1$ (see FIG. 80) over the one or more ILD layers 113 and the contact plugs 115 and 117. Process steps for forming the metallization layer $2403_1$ start with forming an IMD layer $1015_1$, a capping layer $1013_1$, and conductive vias $1813_1$ over the one or more ILD layers 113 and the contact plugs 115 and 117. In some embodiments, the IMD layer $1015_1$, the capping layer $1013_1$, and the conductive vias $1813_1$ are formed using process steps described above with reference to FIGS. 62-73, and the description is not repeated herein.

Referring to FIG. 80, after forming the conductive vias $1813_1$, an ESL $141_1$ is formed over the IMD layer $1015_1$ and the conductive vias $1813_1$, and an IMD layer $145_1$ is formed over the ESL $141_1$ as described above with reference to FIG. 12 and the description is not repeated herein. Subsequently, conductive lines $507_1$ are formed in the IMD layer $145_1$ and the ESL $141_1$ as described above with reference to FIGS. 28-32, and the description is not repeated herein. In some embodiments, the conductive lines $507_1$ are in physical contact with respective conductive vias $1813_1$.

Referring to FIG. 81, one or more metallization layers similar to the metallization layer $2403_1$ are formed over the metallization layer $2403_1$ until a metallization layer $2403_M$ is formed. In some embodiments, the metallization layer $2403_M$ is the final metallization layer of the interconnect structure 2401. In some embodiments, M may be between 1 and 12. In some embodiments, the intermediate metallization layers between the metallization layer $2403_1$ and the metallization layer $2403_M$ are formed in a similar manner as the metallization layer $2403_1$ and the description is not repeated herein. In other embodiments, the metallization layer $2403_M$ is not the final metallization layer of the interconnect structure 2401 and additional metallization layers are formed over the metallization layer $2403_M$.

In some embodiments, process steps for forming the metallization layer $2403_M$ start with forming an IMD layer $1015_M$, a capping layer $1013_M$, and conductive vias $1813_M$ over a previous metallization layer. In some embodiments, the IMD layer $1015_M$ is formed using similar materials and methods as the IMD layer $1015_1$ and the description is not repeated herein. In some embodiments, the capping layer $1013_M$ is formed using similar materials and methods as the capping layer $1013_1$ and the description is not repeated herein. In some embodiments, features of the conductive vias $1813_M$ are similar to features of the conductive vias $1813_1$, with similar features being labeled by similar numerical references. In some embodiments, the conductive vias $1813_M$ may be formed using process steps as described above with reference to FIGS. 62-73, and the description is not repeated herein.

In some embodiments, after forming the conductive vias $1813_M$, an ESL $143_M$ is formed over the conductive vias $1813_M$ and the IMD layer $1015_M$. In some embodiments, the ESL $143_M$ is formed using similar materials and methods as the ESL $141_1$ and the description is not repeated herein. Subsequently, an IMD layer $145_M$ is formed over the ESL $143_M$. In some embodiments, the IMD layer $145_M$ is formed using similar materials and methods as the IMD layer $145_1$ and the description is not repeated herein. Subsequently, conductive lines $507_M$ are formed in the IMD layer $145_M$ and the ESL $143_M$. In some embodiments, features of the conductive lines $507_M$ are similar to features of the conductive lines $507_1$, with similar features being labeled by similar numerical references. In some embodiments, the conductive lines $507_M$ may be formed using process steps as described above with reference to FIGS. 28-32, and the description is not repeated herein.

Figure 82:
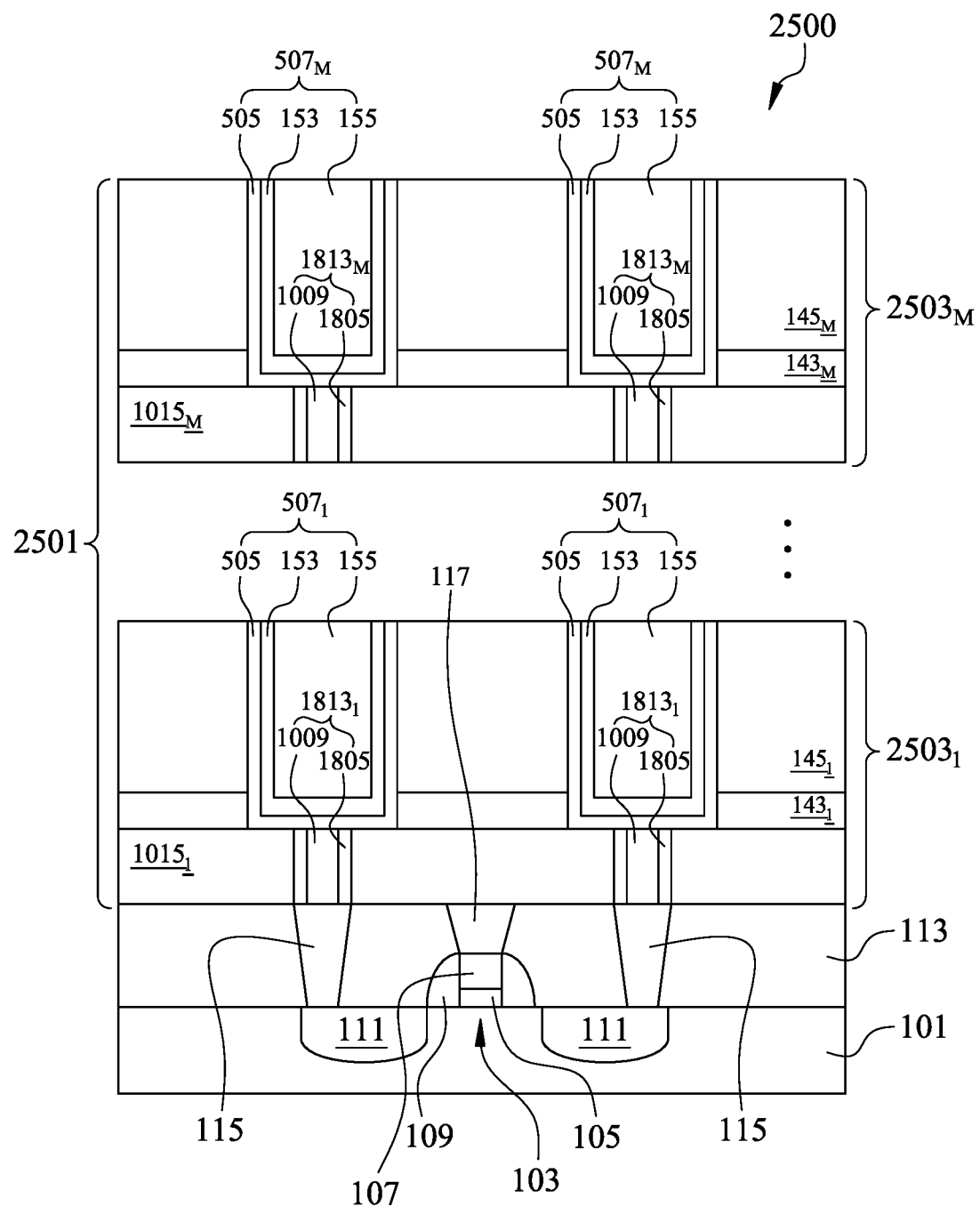
FIG. 82 illustrates a cross-sectional view of a semiconductor device in accordance with some embodiments.

FIG. 82 illustrates a cross-sectional view of a semiconductor device 2500 in accordance with some embodiments. The semiconductor device 2500 is similar to the semiconductor device 2400 (see FIG. 81), with similar features being labeled by similar numerical references. In some embodiments, the interconnect structure 2501 (comprising the metallization layers $2503_1$ to $2503_M$) of the semiconductor device 2500 may be formed using process steps similar to the process steps for forming the interconnect structure 2401 of the semiconductor device 2400 described above with reference to FIGS. 79-81, and the description is not repeated herein. In the illustrated embodiment, the formation of the capping layers $1013_1$ to $1013_M$ (see FIG. 81) is omitted, such that the IMD layers $1015_1$ to $1015_M$ are formed directly over respective barrier/adhesion layers 1805.

Figure 83:
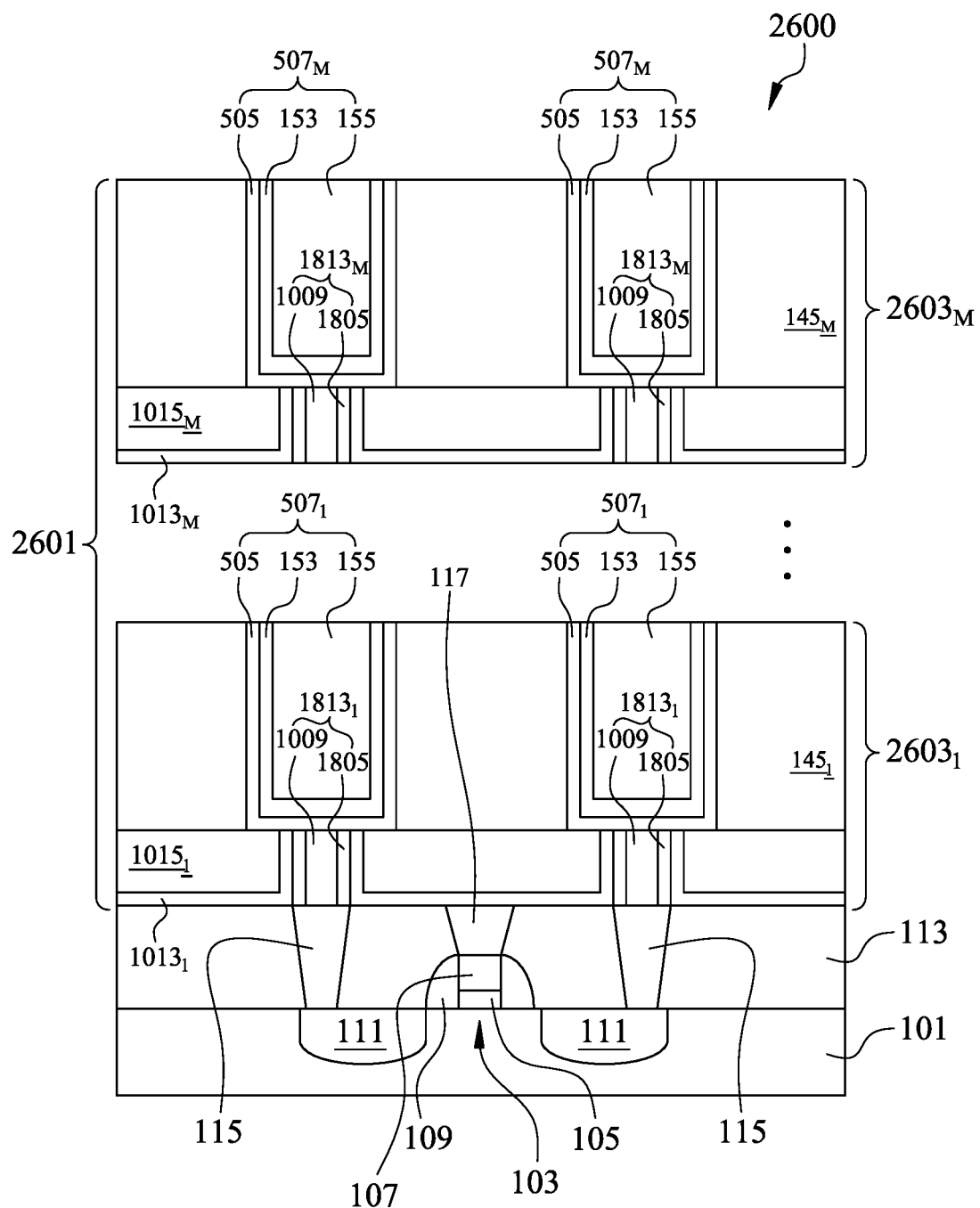
FIG. 83 illustrates a cross-sectional view of a semiconductor device in accordance with some embodiments.

FIG. 83 illustrates a cross-sectional view of a semiconductor device 2600 in accordance with some embodiments. The semiconductor device 2600 is similar to the semiconductor device 2400 (see FIG. 81), with similar features being labeled by similar numerical references. In some embodiments, the interconnect structure 2601 (comprising the metallization layers $2603_1$ to $2603_M$) of the semiconductor device 2600 may be formed using process steps similar to the process steps for forming the interconnect structure 2401 of the semiconductor device 2400 described above with reference to FIGS. 79-81, and the description is not repeated herein. In the illustrated embodiment, the formation of the ESLs $141_1$ to $143_M$ (see FIG. 81) is omitted, such that the IMD layers $145_1$ to $145_M$ are formed directly over the IMD layers $1015_1$ to $1015_M$, respectively.

Figure 84:
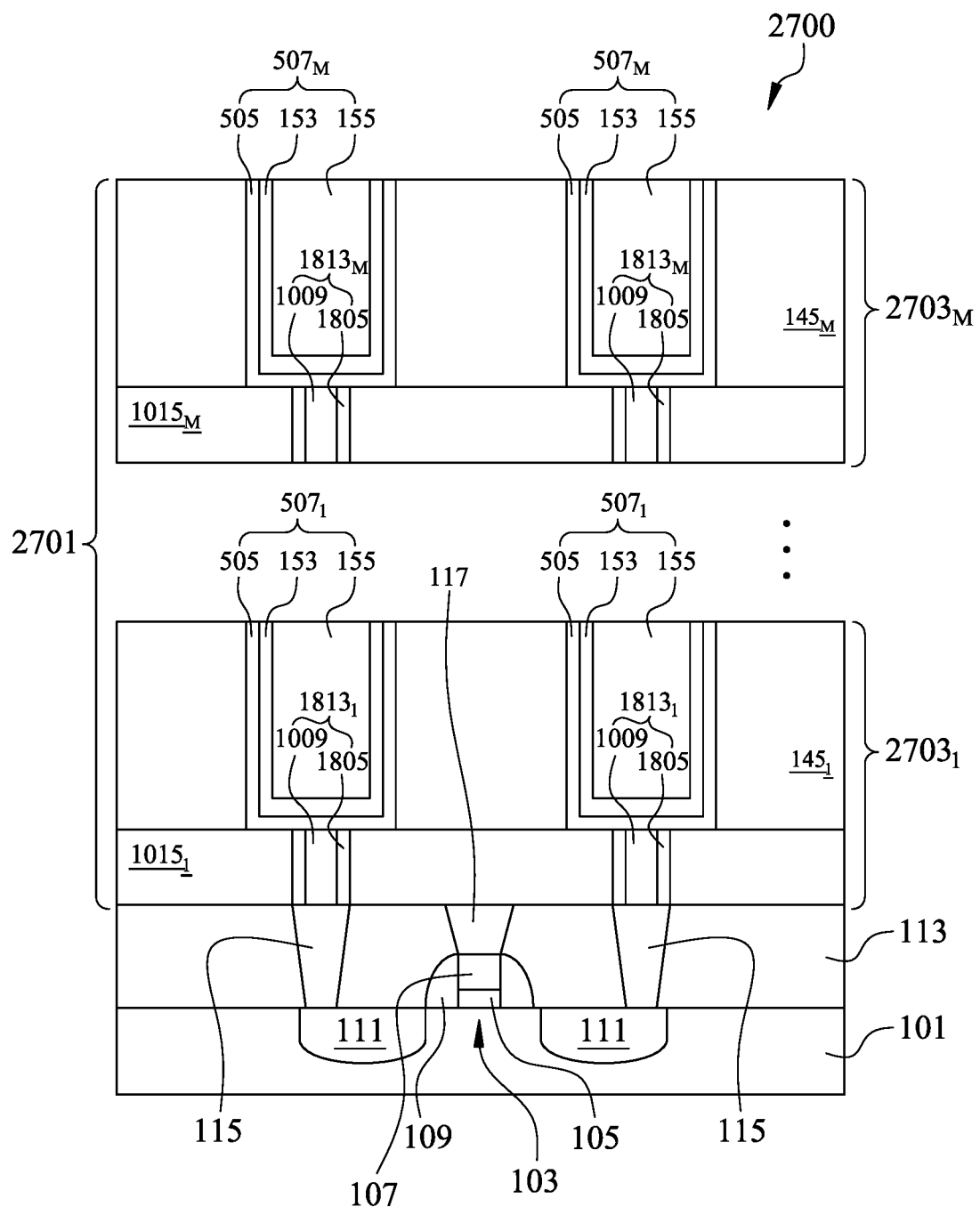
FIG. 84 illustrates a cross-sectional view of a semiconductor device in accordance with some embodiments.

FIG. 84 illustrates a cross-sectional view of a semiconductor device 2700 in accordance with some embodiments. The semiconductor device 2700 is similar to the semiconductor device 2600 (see FIG. 83), with similar features being labeled by similar numerical references. In some embodiments, the interconnect structure 2701 (comprising the metallization layers $2703_1$ to $2703_M$) of the semiconductor device 2700 may be formed using process steps similar to the process steps for forming the interconnect structure 2601 of the semiconductor device 2600 described above with reference to FIG. 83 and the description is not repeated herein. In the illustrated embodiment, the formation of the capping layers $1013_1$ to $1013_M$ (see FIG. 83) is omitted, such that the IMD layers $1015_1$ to $1015_M$ are formed directly over respective barrier/adhesion layers 1805.

Figure 85:
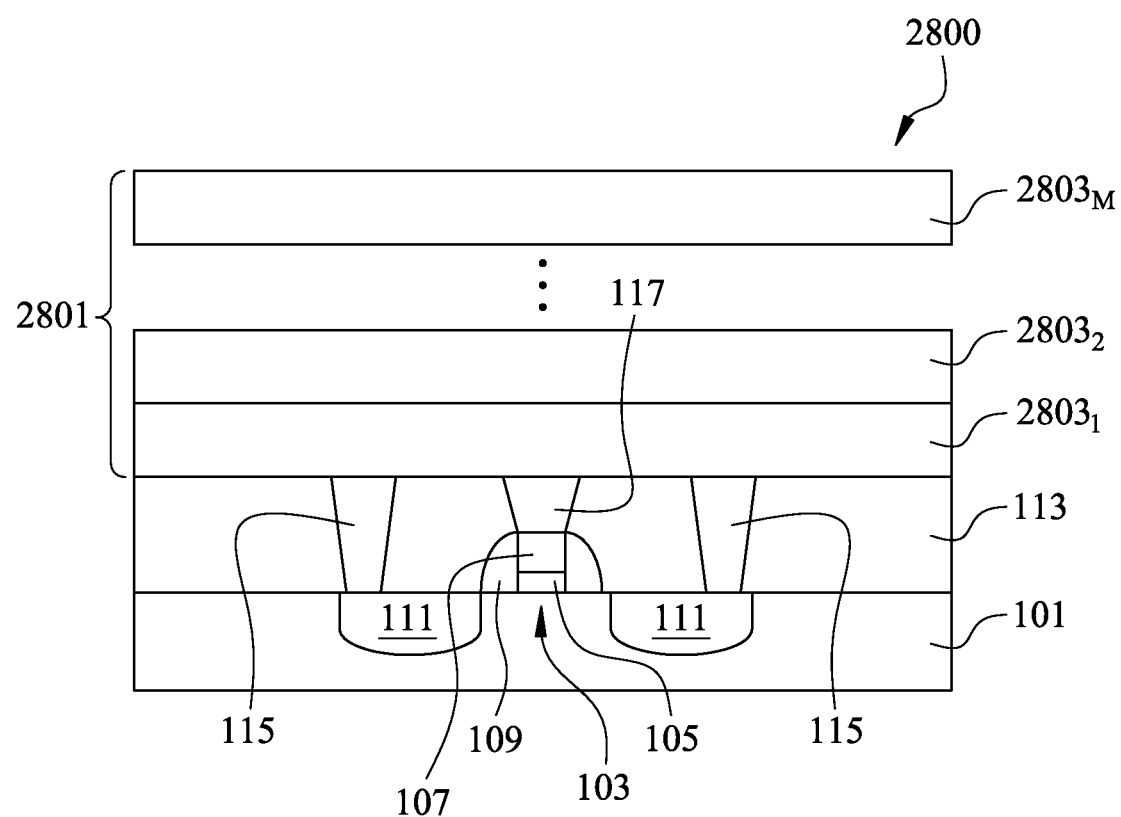
FIG. 85 illustrates a cross-sectional view of a semiconductor device in accordance with some embodiments.

FIG. 85 illustrates a cross-sectional view of a semiconductor device 2800 in accordance with some embodiments. In some embodiments, some features of the semiconductor device 2800 are similar to features of the semiconductor device 100 (see FIG. 17), with similar features being labeled by similar numerical references. In some embodiments, the semiconductor device 2800 further includes an interconnect structure 2801 formed over the one or more ILD layers 113 and the contact plugs 115 and 117. In some embodiments, the interconnect structure 2801 comprises metallization layers $2803_1$ to $2803_M$. In some embodiments, M may be between 1 and 12. Each of the metallization layers $2803_1$ to $2803_M$ may be similar to any of metallization layers $121_1$, $203_1$, $303_1$, $403_1$, $503_1$, $603_1$, $703_1$, $803_1$, $903_1$, $1003_1$, $1103_1$, $1203_1$, $1303_1$, $1403_1$, $1503_1$, $1603_1$, $1703_1$, $1803_1$, $2103_1$, $2203_1$, $2303_1$, $2403_1$, $2503_1$, $2603_1$, and $2703_1$ (see FIGS. 17, 18, 25, 26, 33, 34, 37, 38, 44, 52-55, 58-61, 75-78, and 81-84, respectively). In some embodiments, each or some of the metallization layers $2803_1$ to $2803_M$ may have a similar structure.

Figure 86A:
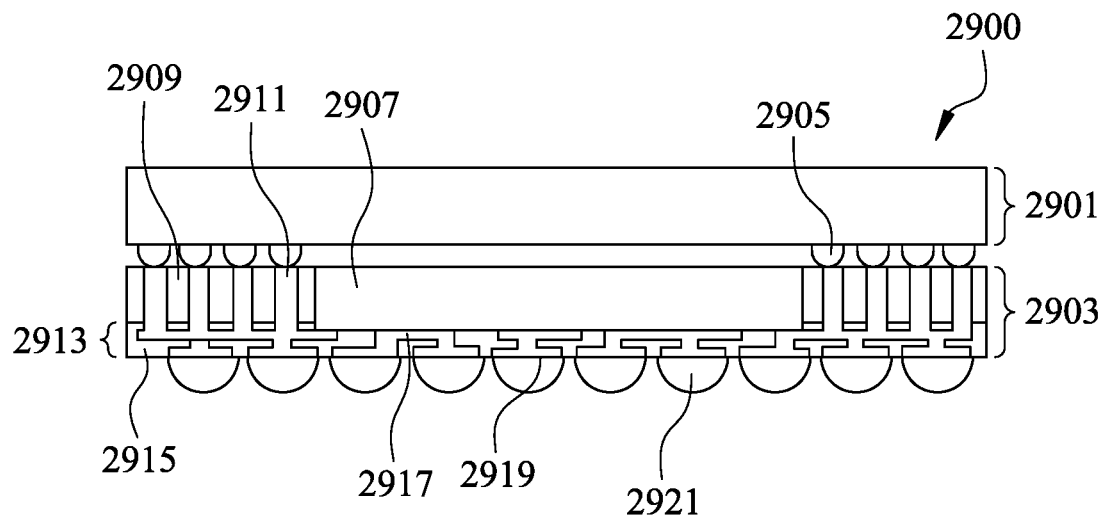
FIGS. 86A and 86B illustrate cross-sectional views of a stacked semiconductor device in accordance with some embodiments.

FIG. 86A illustrates a cross-sectional view of a stacked semiconductor device 2900 in accordance with some embodiments. In some embodiments, the stacked semiconductor device 2900 comprises a first semiconductor device 2901 bonded to a second semiconductor device 2903. In the illustrated embodiment, the first semiconductor device 2901 comprises an integrated circuit die or a package comprising one or more integrated circuit dies, and the second semiconductor device 2903 comprises an integrated fan-out (InFO) package. Accordingly, the stacked semiconductor device 2900 may also be referred to as a package-on-package (PoP) device.

In some embodiments, one or more integrated circuit dies of the first semiconductor device 2901 may be a logic die (e.g., central processing unit (CPU), graphics processing unit (GPU), neural processing unit (NPU), system-on-a-chip (SoC), application processor (AP), microcontroller, etc.), a memory die (e.g., dynamic random access memory (DRAM) die, static random access memory (SRAM) die (comprising, for example, SRAM L1, SRAM L2 circuitry, the like, or a combination thereof), etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In the illustrated embodiment, the one or more integrated circuit dies of the first semiconductor device 2901 are memory dies, such that the first semiconductor device 2901 is a memory device.

In some embodiments, the first semiconductor device 2901 further comprises connectors 2905 providing electrical connections for the one or more integrated circuit dies of the first semiconductor device 2901. The connectors 2905 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like.

In some embodiments, the second semiconductor device 2903 comprises an integrated circuit die 2907 encapsulated in an encapsulant 2909. The integrated circuit die 2907 may be a logic die (e.g., central processing unit (CPU), graphics processing unit (GPU), neural processing unit (NPU), system-on-a-chip (SoC), application processor (AP), microcontroller, etc.), a memory die (e.g., dynamic random access memory (DRAM) die, static random access memory (SRAM) die (comprising, for example, SRAM L1, SRAM L2 circuitry, the like, or a combination thereof), etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In the illustrated embodiment, the integrated circuit die 2907 comprises a logic die, such that the second semiconductor device 2903 is logic device. The encapsulant 2909 may be a molding compound, a polymer, an epoxy, silicon oxide filler material, the like, or a combination thereof, and may be applied by compression molding, transfer molding, or the like. In other embodiments, the encapsulant 2909 may comprise a polymer material, a dielectric material, or the like.

In some embodiments, the second semiconductor device 2903 further includes conductive columns 2911 extending through the encapsulant 2909. The conductive columns 2911 may be formed of a suitable conductive material such as, for example, copper.

In some embodiments, a redistribution structure 2913 is formed on an active side of the integrated circuit die 2907 and on the encapsulant 2909. The redistribution structure 2913 may comprise one or more insulating layers 2915 and metallization patterns 2917 within the one or more insulating layers 2915. The one or more insulating layers 2915 may comprise a polymer such as polybenzoxazole (PBO), polyimide, benzocyclobutene (BCB), or the like. The metallization patterns 2917 may comprise conductive traces and vias and may be made of a suitable conductive material such as for example, copper.

In some embodiments, under bump metallizations (UBMs) 2919 are formed on the redistribution structure 2913 and connectors 2921 are formed on the UBMs 2919. In some embodiments, the UBMs 2919 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be also utilized for the formation of the UBMs 2919. The connectors 2921 may be BGA connectors, solder balls, metal pillars, C4 bumps, micro bumps, ENEPIG formed bumps, or the like.

In some embodiments, the connectors 2905 are reflowed to attach the first semiconductor device 2901 to the conductive columns 2911 of the second semiconductor device 2903. The connectors 2905 electrically and/or physically couple the first semiconductor device 2901 to the second semiconductor device 2903.

In some embodiments, an underfill (not shown) may be formed between the first semiconductor device 2901 and the second semiconductor device 2903, and surrounding the connectors 2905. The underfill may be formed by a capillary flow process after the first semiconductor device 2901 is attached to the second semiconductor device 2903 or may be formed by a suitable deposition method before the first semiconductor device 2901 is attached to the second semiconductor device 2903.

Figure 86B:
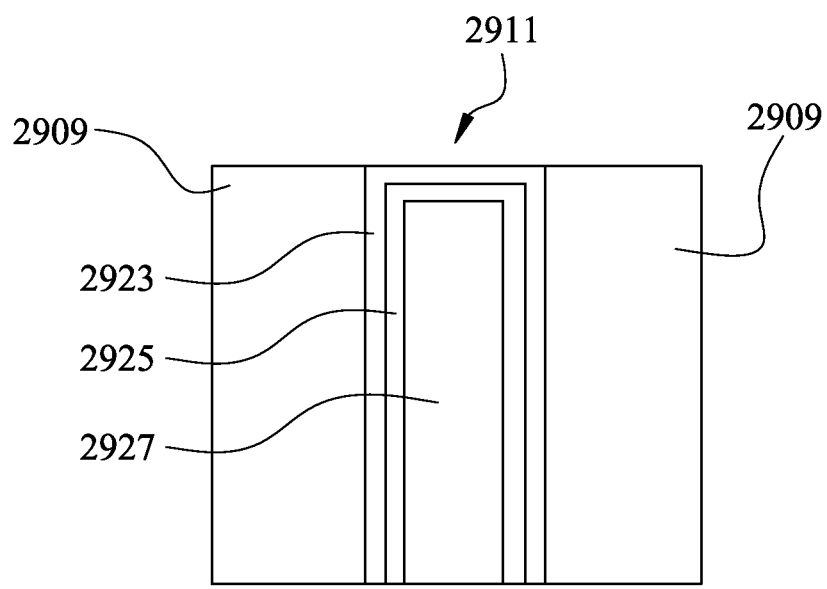

FIG. 86B illustrates a magnified cross-sectional view of the conductive columns 2911 of the first semiconductor device 2901 (see FIG. 86A) in accordance with some embodiments. In some embodiments, process steps for forming the conductive column 2911 include pattering the encapsulant 2909 to form an opening therein, forming a barrier/adhesion layer 2923 along a bottom and the sidewalls of the opening, forming a seed layer 2925 over the barrier/adhesion layer 2923, filling the opening with the conductive fill layer 2927, and performing a planarization process (such as, for example, a CMP process) to remove excess portions of the barrier/adhesion layer 2923, the seed layer 2925 and the conductive fill layer 2927.

In some embodiments, the barrier/adhesion layer 2923 may be formed using similar materials and methods as barrier/adhesion layer 129 described above with reference to FIGS. 3-6 and the description is not repeated herein. In some embodiments, the seed layer 2925 may be formed using similar materials and methods as the seed layer 139 described above with reference to FIG. 10 and the description is not repeated herein. In some embodiments, the conductive fill layer 2927 may be formed using similar materials and methods as the conductive fill layer 155 described above with reference to FIG. 15 and the description is not repeated herein.

Referring back to FIG. 86A, in some embodiments, barrier/adhesion layers such as barrier/adhesion layer 2923 (see FIG. 86B) may be also used while forming the metallization patterns 2917 of the redistribution structure 2913 of the first semiconductor device 2901.

Figure 87A:
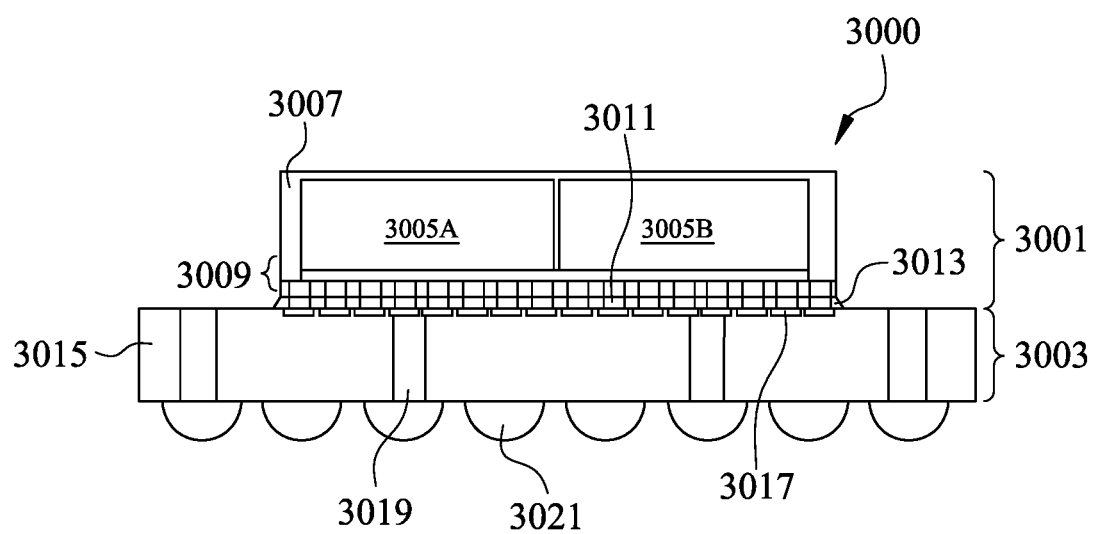
FIGS. 87A and 87B illustrate cross-sectional views of a stacked semiconductor device in accordance with some embodiments.

FIG. 87A illustrates a cross-sectional view of a stacked semiconductor device 3000 in accordance with some embodiments. In some embodiments, the stacked semiconductor device 3000 includes a first semiconductor device 3001 bonded to a package substrate 3003. In the illustrated embodiment, the first semiconductor device 3001 includes an InFO package.

In some embodiments, the first semiconductor device 3001 includes an integrated circuit dies 3005A and 3005B encapsulated in an encapsulant 3007. Each of the integrated circuit dies 3005A and 3005B may be a logic die (e.g., central processing unit (CPU), graphics processing unit (GPU), neural processing unit (NPU), system-on-a-chip (SoC), application processor (AP), microcontroller, etc.), a memory die (e.g., dynamic random access memory (DRAM) die, static random access memory (SRAM) die (comprising, for example, SRAM L1, SRAM L2 circuitry, the like, or a combination thereof), etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the integrated circuit die 3005A and the integrated circuit die 3005B comprise a same type of a die. In other embodiments, the integrated circuit die 3005A and the integrated circuit die 3005B comprise different types of dies.

The encapsulant 3007 may be formed using similar materials and methods as the encapsulant 2909 described above with reference to FIG. 86A and the description is not repeated herein. In some embodiments, the encapsulant 3007 extends along sidewalls of the integrated circuit dies 3005A and 3005B and fills a gap between the integrated circuit die 3005A and the integrated circuit die 3005B.

In some embodiments, a redistribution structure 3009 is formed on active sides of the integrated circuit die 3005A and the integrated circuit die 3005B, and on the encapsulant 3007. The redistribution structure 3009 may comprise one or more insulating layers (not shown) and metallization patterns (not shown) within the one or more insulating layers. In some embodiments, the redistribution structure 3009 may be formed using similar materials and methods as the redistribution structure 2913 described above with reference to FIG. 86A and the description is not repeated herein.

In some embodiments, the first semiconductor device 3001 further comprises connectors 3011 bonded to the redistribution structure 3009. The connectors 3011 may be BGA connectors, solder balls, metal pillars, C4 bumps, micro bumps, ENEPIG formed bumps, or the like.

In some embodiments, the package substrate 3003 includes a substrate core 3015 and bond pads 3017 over the substrate core 3015. The substrate core 3015 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used.

Additionally, the substrate core 3015 may be a SOI substrate. Generally, an SOI substrate includes a layer of a semiconductor material such as epitaxial silicon, germanium, silicon germanium, SOI, SGOI, or combinations thereof. The substrate core 3015 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 3015.

In some embodiments, the substrate core 3015 may include active and passive devices (not shown). A wide variety of devices such as transistors, capacitors, resistors, combinations of these, and the like may be used to generate the structural and functional requirements of the design for the stacked semiconductor device 3000. The devices may be formed using any suitable methods.

The substrate core 3015 may also include metallization layers (not shown) and vias 3019, with the bond pads 3017 being physically and/or electrically coupled to the metallization layers and vias 3019. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In other embodiments, the substrate core 3015 is substantially free of active and passive devices. The vias 3019 may be also referred to as through vias or through substrate vias.

The package substrate 3003 further includes connectors 3021 attached to substrate core 3015. The connectors 3021 provide electrical connector to the package substrate 3003 and the semiconductor devices bonded to the package substrate 3003. The connectors 3021 may be BGA connectors, solder balls, metal pillars, C4 bumps, micro bumps, ENEPIG formed bumps, or the like.

In some embodiments, the connectors 3011 are reflowed to attach the first semiconductor device 3001 to bond pads 3017 of the package substrate 3003. The connectors 3011 electrically and/or physically couple the package substrate 3003, including metallization layers and vias 3019 in the substrate core 3015, to the first semiconductor device 3001.

In some embodiments, an underfill 3013 may be formed between the first semiconductor device 3001 and the package substrate 3003 and surrounding the connectors 3011. The underfill 3013 may be formed by a capillary flow process after the first semiconductor device 3001 is attached to the package substrate 3003 or may be formed by a suitable deposition method before the first semiconductor device 3001 is attached to the package substrate 3003.

Figure 87B:
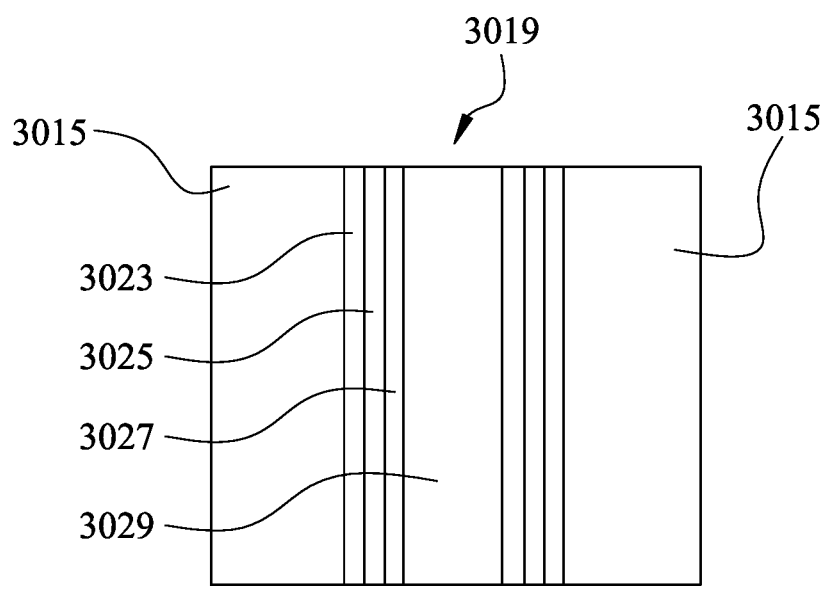

FIG. 87B illustrates a magnified cross-sectional view of the through via 3019 of the package substrate 3003 (see FIG. 87A) in accordance with some embodiments. In some embodiments, process steps for forming the through via 3019 include pattering the substrate core 3015 to form an opening therein, forming an insulating liner 3023 along a bottom and the sidewalls of the opening, forming a barrier/adhesion layer 3025 over the insulating liner 3023, forming a seed layer 3027 over the barrier/adhesion layer 3025, filling the opening with the conductive fill layer 3029, and performing a planarization process (such as, for example, a CMP process) to remove excess portions of the insulating liner 3023, the barrier/adhesion layer 3025, the seed layer 3027 and the conductive fill layer 3029. In some embodiments when the substrate core 3015 is formed of an insulating material, the insulating liner 3023 may be omitted.

In some embodiments, the insulating liner 3023 comprises silicon oxide, silicon nitride, silicon oxynitride, a combination thereof, or the like, may be formed using CVD, ALD, a combination thereof, or the like. In some embodiments, the barrier/adhesion layer 3025 may be formed using similar materials and methods as barrier/adhesive layer 129 described above with reference to FIGS. 3-6 and the description is not repeated herein. In some embodiments, the seed layer 3027 may be formed using similar materials and methods as the seed layer 139 described above with reference to FIG. 10 and the description is not repeated herein. In some embodiments, the conductive fill layer 3029 may be formed using similar materials and methods as the conductive fill layer 155 described above with reference to FIG. 15 and the description is not repeated herein.

Referring back to FIG. 87A, in some embodiments, barrier/adhesion layers such as the barrier/adhesion layer 3025 (see FIG. 87B) may be also used while forming the metallization patterns of the redistribution structure 3009 of the first semiconductor device 3001 or while forming an interconnect structure of the package substrate 3003.

Figure 88A:
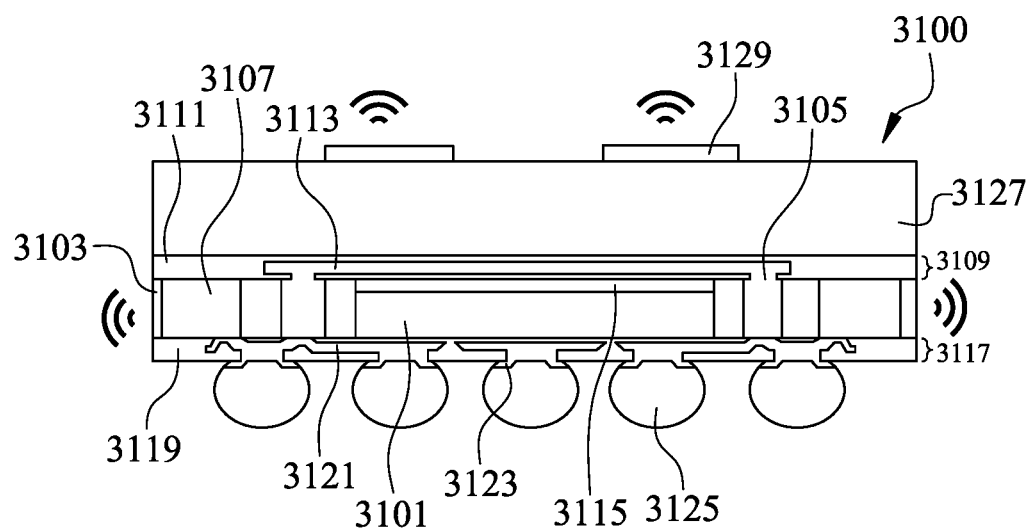
FIGS. 88A and 88B illustrate cross-sectional views of a semiconductor device in accordance with some embodiments.

FIG. 88A illustrates a cross-sectional view of a semiconductor device 3100 in accordance with some embodiments. In some embodiments, the semiconductor device 3100 is an InFO package. In some embodiments, the semiconductor device 3100 may include an integrated circuit die 3101 encapsulated in an encapsulant 3103.

The integrated circuit die 3101 may be a logic die (e.g., central processing unit (CPU), graphics processing unit (GPU), neural processing unit (NPU), system-on-a-chip (SoC), application processor (AP), microcontroller, etc.), a memory die (e.g., dynamic random access memory (DRAM) die, static random access memory (SRAM) die (comprising, for example, SRAM L1, SRAM L2 circuitry, the like, or a combination thereof), etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In the illustrated embodiment, the integrated circuit die 3101 is an RF die.

The encapsulant 3103 may be formed using similar materials and methods as the encapsulant 2909 described above with reference to FIG. 86A and the description is not repeated herein. The encapsulant 3103 extends along sidewalls of the integrated circuit die 3101.

In some embodiments, the semiconductor device 3100 further includes conductive columns 3105 and antennas 3107 extending though the encapsulant 3103. The conductive columns 3105 and antennas 3107 may be formed of a suitable conductive material such as, for example, copper.

In some embodiments, the semiconductor device 3100 further includes a first redistribution structure 3109 on a backside of the integrated circuit die 3101. The first redistribution structure 3109 may be also referred to as a backside redistribution structure. In some embodiments, an adhesive 3115 is interposed between the first redistribution structures 3109 and the backside of the integrated circuit die 3101. The adhesive 3115 may be any suitable adhesive, epoxy, die attach film (DAF), or the like. The first redistribution structure 3109 may comprise one or more insulating layers 3111 and metallization patterns 3113 within the one or more insulating layers 3111. The one or more insulating layers 3111 may comprise a polymer such as polybenzoxazole (PBO), polyimide, benzocyclobutene (BCB), or the like. The metallization patterns 3113 comprise conductive traces and vias and may be made of a suitable conductive material such as for example, copper.

In some embodiments, a second redistribution structure 3117 is formed on a front side of the integrated circuit die 3101. The second redistribution structure 3117 may be also referred to as a front-side redistribution structure. The second redistribution structure 3117 may comprise one or more insulating layers 3119 and metallization patterns 3121 within the one or more insulating layers 3119. The one or more insulating layers 3119 may be formed using similar materials and methods as the one or more insulating layers 3111 and the description is not repeated herein. The metallization patterns 3121 comprise conductive traces and vias and may be made of a suitable conductive material such as for example, copper.

In some embodiments, UBMs 3123 are formed on the second redistribution structure 3117 and connectors 3125 are formed on the UBMs 3123. In some embodiments, the UBMs 3123 may be formed using similar materials and methods as the UBMs 2919 described above with reference to FIG. 86A and the description is not repeated herein. The connectors 3125 may be BGA connectors, solder balls, metal pillars, C4 bumps, micro bumps, ENEPIG formed bumps, or the like.

In some embodiments, a dielectric layer 3127 is formed over the first redistribution structure 3109 and antennas 3129 are formed over the dielectric layer 3127. In some embodiments, the antennas 3129 are electrically coupled to the integrated circuit die 3101 through the first redistribution structure 3109. The dielectric layer 3127 may be formed of an oxide, a nitride, SiC, SiN, SiOC, a combination thereof, or the like. The antennas 3129 may be formed of a suitable conductive material such as, for example, copper.

Figure 88B:
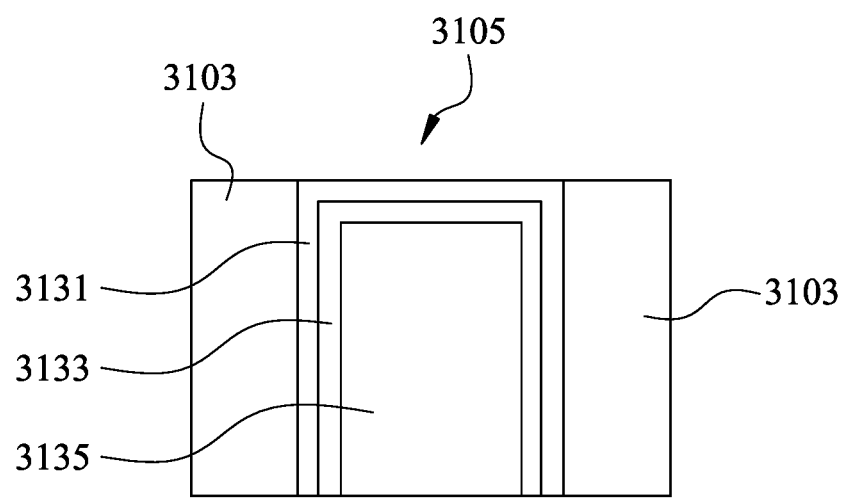

FIG. 88B illustrates a magnified cross-sectional view of the conductive column 3105 of the semiconductor device 3100 (see FIG. 88A) in accordance with some embodiments. In some embodiments, process steps for forming the conductive column 3105 include pattering the encapsulant 3103 to form an opening therein, forming a barrier/adhesion layer 3131 along a bottom and the sidewalls of the opening, forming a seed layer 3133 over the barrier/adhesion layer 3131, filling the opening with the conductive fill layer 3135, and performing a planarization process (such as, for example, a CMP process) to remove excess portions of the barrier/adhesion layer 3131, the seed layer 3133 and the conductive fill layer 3135.

In some embodiments, the barrier/adhesion layer 3131 may be formed using similar materials and methods as barrier/adhesion layer 129 described above with reference to FIGS. 3-6 and the description is not repeated herein. In some embodiments, the seed layer 3133 may be formed using similar materials and methods as the seed layer 139 described above with reference to FIG. 10 and the description is not repeated herein. In some embodiments, the conductive fill layer 3135 may be formed using similar materials and methods as the conductive fill layer 155 described above with reference to FIG. 15 and the description is not repeated herein.

Referring back to FIG. 88A, in some embodiments, barrier/adhesion layers such as barrier/adhesion layer 3131 (see FIG. 88B) may be also used while forming the metallization patterns 3113 of the first redistribution structure 3109 and the metallization patterns 3121 of the second redistribution structure 3117.

In accordance with an embodiment, a device includes a substrate, a dielectric layer over the substrate, and a conductive interconnect in the dielectric layer. The conductive interconnect includes a barrier/adhesion layer and a conductive layer over the barrier/adhesion layer. The barrier/adhesion layer includes a material having a chemical formula $MX_n$, with M being a transition metal element, X being a chalcogen element, and n being between 0.5 and 2. Embodiments may include one or more of the following features. The device where the conductive layer includes a seed layer over and in physical contact with the barrier/adhesion layer. The device where a top surface of the dielectric layer is level with a top surface of the seed layer. The device where the conductive layer further includes a conductive fill layer over the seed layer. The device where a top surface of the dielectric layer is level with a top surface of the conductive fill layer. The device where the barrier/adhesion layer has a layered structure. The device where the barrier/adhesion layer has a thickness between about 0.5 nm and about 3 nm.

In accordance with another embodiment, a device includes a substrate, a first dielectric layer over the substrate, and a conductive via in the first dielectric layer. The conductive via includes a first barrier/adhesion layer comprising a first material and a first conductive layer over the first barrier/adhesion layer. The first material has a chemical formula $MX_n$, with M being a transition metal element, X being a chalcogen element, and n being between 0.5 and 2. The device further includes a second dielectric layer over the first dielectric layer and the conductive via and a conductive line in the second dielectric layer. The conductive line includes a second barrier/adhesion layer comprising the first material and a second conductive layer over the second barrier/adhesion layer.

Embodiments may include one or more of the following features. The device where the first barrier/adhesion layer has a layered structure. The device where the first conductive layer includes a first seed layer over the first barrier/adhesion layer, the first seed layer being an uppermost layer of the conductive via. The device where the first conductive layer includes a first seed layer over the first barrier/adhesion layer, and a first conductive fill layer over the first seed layer, a top surface of the first conductive fill layer being level with a top surface of the first dielectric layer. The device where the second conductive layer includes a second seed layer over the second barrier/adhesion layer, the second seed layer being an uppermost layer of the conductive line. The device where the second conductive layer includes a second seed layer over the second barrier/adhesion layer, and a second conductive fill layer over the second seed layer, a top surface of the second conductive fill layer being level with a top surface of the second dielectric layer. The device where the second barrier/adhesion layer is in physical contact with the first conductive layer.

In accordance with yet another embodiment, a method includes forming a dielectric layer over a substrate, patterning the dielectric layer to form an opening in the dielectric layer, forming a barrier/adhesion layer along a bottom and sidewalls of the opening, and depositing a conductive layer over the barrier/adhesion layer in the opening. A material of the barrier/adhesion layer has a chemical formula $MX_n$, with M being a transition metal element, X being a chalcogen element, and n being between 0.5 and 2. Forming the barrier/adhesion layer includes depositing a layer of the transition metal element along the bottom and the sidewalls of the opening, and performing a chalcogen treatment on the layer of the transition metal element.

Embodiments may include one or more of the following features. The method where depositing the layer of the transition metal element comprises performing a physical vapor deposition (PVD) process. The method where performing the chalcogen treatment comprises performing a plasma enhanced chemical deposition (PECVD) process using a precursor comprising the chalcogen element. The method where depositing the conductive layer includes depositing a seed layer over the barrier/adhesion layer in the opening, the seed layer filling the opening. The method where depositing the conductive layer includes depositing a seed layer over the barrier/adhesion layer in the opening, and depositing a conductive fill material over the seed layer in the opening, the conductive fill material filling the opening. The method where the barrier/adhesion layer includes a plurality of sub-layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a dielectric layer over a substrate;
patterning the dielectric layer to form an opening in the dielectric layer;
forming a barrier/adhesion layer along a bottom and sidewalls of the opening, a material of the barrier/adhesion layer having a chemical formula $MX_n$, with M being a transition metal element, X being a chalcogen element, and n being between 0.5 and 2, wherein forming the barrier/adhesion layer comprises:
depositing a layer of the transition metal element along the bottom and the sidewalls of the opening; and
after depositing the layer of the transition metal element, performing a chalcogen treatment on the layer of the transition metal element; and
depositing a conductive layer over the barrier/adhesion layer in the opening.

2. The method of claim 1, wherein depositing the layer of the transition metal element comprises performing a physical vapor deposition (PVD) process.

3. The method of claim 1, wherein performing the chalcogen treatment comprises performing a plasma enhanced chemical deposition (PECVD) process using a precursor comprising the chalcogen element.

4. The method of claim 1, wherein depositing the conductive layer comprises depositing a seed layer over the barrier/adhesion layer in the opening, the seed layer filling the opening.

5. The method of claim 1, wherein depositing the conductive layer comprises:
depositing a seed layer over the barrier/adhesion layer in the opening; and
depositing a conductive fill material over the seed layer in the opening, the conductive fill material filling the opening.

6. The method of claim 1, wherein the barrier/adhesion layer comprises a plurality of sub-layers.

7. A method comprising:
forming a first dielectric layer over a substrate, the first dielectric layer having a recess;
forming a conductive via in the recess in the first dielectric layer, forming the conductive via comprising:
forming a first barrier/adhesion layer comprising a first material, the first material having a chemical formula $MX_n$, with M being a transition metal element, X being a chalcogen element, and n being between 0.5 and 2; and
forming a first conductive layer over the first barrier/adhesion layer;
forming a second dielectric layer over the first dielectric layer and the conductive via; and
forming a conductive line in the second dielectric layer, forming the conductive line comprising:
forming a second barrier/adhesion layer comprising the first material; and
forming a second conductive layer over the second barrier/adhesion layer.

8. The method of claim 7, wherein forming the first barrier/adhesion layer comprises:
depositing a layer of the transition metal element along a bottom and sidewalls of the recess; and
after depositing the layer of the transition metal element, performing a chalcogen treatment on the layer of the transition metal element.

9. The method of claim 7, wherein forming the first barrier/adhesion layer comprises:
depositing the first barrier/adhesion layer using a deposition process, the deposition process performed using a metal-containing precursor and a chalcogen-containing precursor.

10. The method of claim 7, wherein the first barrier/adhesion layer has a layered structure.

11. The method of claim 7, wherein forming the conductive via further comprises:
forming a first seed layer over the first barrier/adhesion layer, the first seed layer being an uppermost layer of the conductive via.

12. The method of claim 7, wherein forming the first conductive layer comprises:
forming a first seed layer over the first barrier/adhesion layer; and
forming a first conductive fill layer over the first seed layer, a top surface of the first conductive fill layer being level with a top surface of the first dielectric layer.

13. The method of claim 7, wherein forming the second conductive layer comprises:
forming a second seed layer over the second barrier/adhesion layer, the second seed layer being an uppermost layer of the conductive line.

14. The method of claim 7, wherein forming the second conductive layer comprises:
forming a second seed layer over the second barrier/adhesion layer; and
forming a second conductive fill layer over the second seed layer, a top surface of the second conductive fill layer being level with a top surface of the second dielectric layer.

15. The method of claim 7, wherein the second barrier/adhesion layer is in physical contact with the first conductive layer.

16. A method comprising:
forming a first dielectric layer over a substrate;
patterning the first dielectric layer to form a via opening in the first dielectric layer;
depositing a barrier/adhesion layer along a bottom and sidewalls of the via opening using a first deposition process, the first deposition process using a metal-containing precursor and a chalcogen-containing precursor, a material of the barrier/adhesion layer having a chemical formula $MX_n$, with M being a transition metal element, X being a chalcogen element, and n being between 0.5 and 2;
depositing a conductive layer over the barrier/adhesion layer in the via opening;
depositing a second dielectric layer over the first dielectric layer and the conductive layer; and
forming a conductive line in the second dielectric layer, wherein the conductive line contacts the conductive layer.

17. The method of claim 16, wherein the barrier/adhesion layer has a plurality of sub-layers, wherein each of the sub-layers has a thickness in a range of 0.5 nm and 1 nm.

18. The method of claim 16, wherein the metal-containing precursor comprises pentakis (dimethylamino) tantalum (V), tantalum ethoxide, or tantalum chloride, wherein the chalcogen-containing precursor comprises dimethyl disulfide or $H_2S$.

19. The method of claim 16, wherein the barrier/adhesion layer has a plurality of wavy sub-layers.

20. The method of claim 1, wherein the conductive layer is part of a conductive via, further comprising:
depositing another dielectric layer over the dielectric layer and the conductive via; and
forming a conductive line in the another dielectric layer, wherein the conductive line contacts the conductive via.

* * * * *